(12) United States Patent
Hasegawa et al.

(10) Patent No.: US 7,075,759 B2
(45) Date of Patent: *Jul. 11, 2006

(54) MAGNETIC SENSING ELEMENT WITH FREE LAYER BIASING USING VARYING THICKNESS NONMAGNETIC COUPLING LAYER

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/251,112

(22) Filed: Sep. 20, 2002

(65) Prior Publication Data

US 2003/0058587 A1    Mar. 27, 2003

(30) Foreign Application Priority Data

Sep. 25, 2001 (JP) .............................. 2001-291572
Feb. 8, 2002  (JP) .............................. 2002-032707

(51) Int. Cl.
*G11B 5/39* (2006.01)

(52) U.S. Cl. .............................. 360/324.12; 360/324.2

(58) Field of Classification Search ........... 360/324.12, 360/314, 324.2
See application file for complete search history.

(56) References Cited

U.S. PATENT DOCUMENTS

| 5,949,623 | A | 9/1999 | Lin | |
|---|---|---|---|---|
| 6,030,753 | A | 2/2000 | Lin | |
| 6,201,673 | B1* | 3/2001 | Rottmayer et al. | 360/324.12 |
| 6,714,388 | B1* | 3/2004 | Hasegawa et al. | 360/324.12 |
| 6,744,607 | B1* | 6/2004 | Freitag et al. | 360/322 |
| 6,757,962 | B1* | 7/2004 | Hasegawa et al. | 360/324.12 |
| 6,778,364 | B1* | 8/2004 | Dobisz et al. | 360/324.12 |
| 6,807,033 | B1* | 10/2004 | Zhu | 360/324.12 |
| 6,857,180 | B1* | 2/2005 | Horng et al. | 360/324.12 |
| 6,893,734 | B1* | 5/2005 | Hasegawa et al. | 360/324.12 |
| 6,913,836 | B1* | 7/2005 | Hasegawa | 360/324.12 |
| 2003/0133233 | A1* | 7/2003 | Gill | 360/324.12 |
| 2003/0156361 | A1* | 8/2003 | Li et al. | 360/324.12 |
| 2003/0167625 | A1* | 9/2003 | Li et al. | 360/324.12 |
| 2003/0179515 | A1* | 9/2003 | Pinarbasi | 360/324.12 |
| 2003/0218836 | A1* | 11/2003 | Shimazawa et al. | 360/324.12 |

FOREIGN PATENT DOCUMENTS

JP    2000-348309 A    12/2000

(Continued)

OTHER PUBLICATIONS

Saito et al., "PTMn spin valve with synthetic ferrimagnet free and pinned layers," Journal of Applied Physics, vol. 87, No. 9, pp. 6974-6976 (May 2000).

(Continued)

*Primary Examiner*—Craig A. Renner
(74) *Attorney, Agent, or Firm*—Brinks Hofer Gilson & Lione

(57) ABSTRACT

A nonmagnetic layer comprising Ru formed on a free magnetic layer, wherein a ferromagnetic layer and a second antiferromagnetic layer are formed on each outer side of the nonmagnetic layer. A ferromagnetic coupling is effectively generated between the ferromagnetic layer and each outer side of the free magnetic layer. Magnetization of the free magnetic layer is adequately controlled by the ferromagnetic coupling without damaging each outer side of the free magnetic layer to allow manufacture of a magnetic sensing element capable of properly defining a narrow track width.

24 Claims, 29 Drawing Sheets

FOREIGN PATENT DOCUMENTS

JP           2001-52315 A     2/2001

OTHER PUBLICATIONS

Mosca et al., "Oscillatory interlayer coupling and giant magnetoresistance in Co/Cu multilayers," Journal of Magnetism and Magnetic Materials, vol. 94, pp. L1-L5 (1991).

S. Parkin, "Systematic Variation of the Strength and Oscillation Period of Indirect Magnetic Exchange Coupling through the 3d, 4d, and 5d Transition Metals," Physical Review Letters vol. 67, No. 25, pp. 3598-3601 (Dec. 1991).

Parkin et al., "Oscillations in Exchange Coupling and Magnetoresistance in Metallic Superlattice Structures: Co/Ru, Co/Cr, and Fe/Cr," Physical Review Letters, vol. 64, No. 19, pp. 2304-2307 (May 1990).

* cited by examiner

FIG. 7
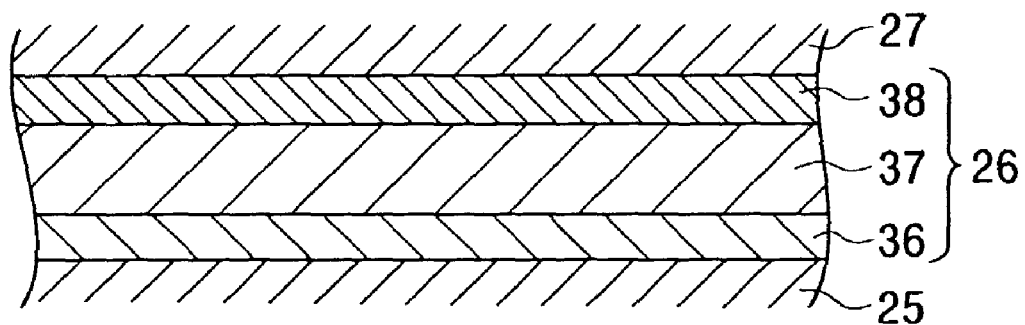
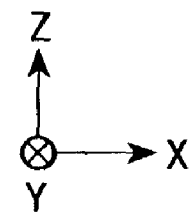
FIG. 8
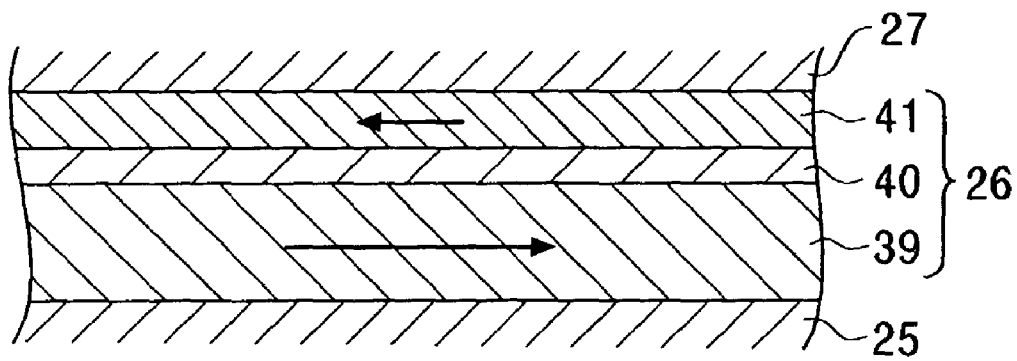
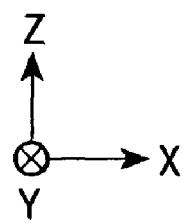

Ru THICKNESS (Å)

MAGNETIC SENSING ELEMENT WITH FREE LAYER BIASING USING VARYING THICKNESS NONMAGNETIC COUPLING LAYER

BACKGROUND OF THE INVENTION

1. Field of the Invention

The present invention relates to a magnetic sensing element to be used for a hard disk device and magnetic sensor. In particular, the present invention relates to a magnetic sensing element that allows effective control of the magnetization of a free magnetic layer in defining narrow track width, and a process for manufacturing the magnetic sensing element.

2. Description of the Related Art

FIG. 34 shows a cross section of the structure of a conventional magnetic sensing element viewed from aside opposite a recording medium.

In FIG. 34, the reference numeral 1 denotes a substrate on which a multilayer 8 comprising an antiferromagnetic layer 2, a pinned magnetic layer 3, a nonmagnetic material layer 4 and a free magnetic layer 5 is formed. Hard bias layers 6 are formed in both side areas of the multilayer 8, and an electrode layer 7 is formed on each hard bias layer 6.

Magnetization of the pinned magnetic layer 3 is fixed in the Y-direction as shown in the drawing by an exchange coupling magnetic field generated between the antiferromagnetic layer 2 and pinned magnetic layer 3. Magnetization of the free magnetic layer 5 is aligned, on the other hand, in the X-direction by a vertical bias magnetic field from the hard bias layer 6.

As shown in FIG. 34, while the track width Tw is defined by the width of the free magnetic layer 5 in the track width direction (X-direction), the track width tends to decrease more as the demand for recording density increases with time.

However, advanced narrowing of the track width made it impossible to adequately control magnetization of the free magnetic layer 5 in the structure of the magnetic sensing element shown in FIG. 34 by the reasons as described below.

(1) While the width of the free magnetic layer 5 is reduced by narrowing the track width in the structure shown in FIG. 34, the narrower track width makes the area affected by a strong vertical bias magnetic field from the hard bias layer 6 to account for a large proportion in the free magnetic layer 5. Since the area under the influence of the strong bias magnetic field serves as a dead zone where magnetization is hardly varied against an external magnetic field, regenerative sensitivity is lowered due to an increased proportion of the dead zone as the track width is narrowed.

(2) The region between the hard bias layer 6 and free magnetic layer 5 tends to be a magnetically discontinuous region. This tendency is enhanced when a bias underlayer made of Cr is interposed between the hard bias layer 6 and free magnetic layer 5.

The effect of a demagnetization magnetic field at each outer side in the track width direction of the free magnetic layer 5 is increased by this magnetically discontinuous state, causing a phenomenon, known as buckling phenomenon, that disturbs magnetization of the free magnetic layer 5. This buckling phenomenon appears in a wide area of the free magnetic layer 5 as the track width is narrowed, thereby reducing the stability of regenerative waveform is reduced.

(3) A part of the vertical bias magnetic field from the hard bias layer 6 leaks to a shield layers (not shown) formed on and under the magnetic sensing element shown in FIG. 34 in accordance with the gap narrowing. This leak disturbs the magnetization of the shield layer while weakening the bias magnetic field supplied to the free magnetic layer 5, thereby making it impossible to effectively control magnetization of the free magnetic layer 5.

To overcome the problems as described above, the magnetization of the free magnetic layer 5 has been controlled in recent years by employing an exchange bias method using an antiferromagnetic layer on the free magnetic layer.

The magnetic sensing element using the exchange bias method is manufactured, for example, by the manufacturing processes shown in FIGS. 35 and 36. FIGS. 35 and 36 are partial cross sections of the structures of the magnetic sensing elements viewed from a side opposite a recording medium.

In the manufacturing process shown in FIG. 35, an antiferromagnetic layer 2 comprising a Pt—Mn alloy is formed on a substrate 1, followed by laminating a pinned magnetic layer 3 made of a magnetic material, a nonmagnetic material layer 4 and a free magnetic layer 5 made of a magnetic material thereon. A Ta layer 9 is formed on the free magnetic layer 5 in order to protect the surface of the free magnetic layer 5 from being oxidized when it is exposed to the atmosphere.

Then, a lift-off resist layer 10 is formed on the Ta layer 9 shown in FIG. 35, and all the Ta layer 9 exposed at each side in the track width direction without being covered with the resist layer 10 is removed by ion-milling. A part of the free magnetic layer 5 under the Ta layer 9 (the portions shown by a dotted line) is also shaved off.

In the next step shown in FIG. 36, a ferromagnetic layer 11, a second antiferromagnetic layer 12 formed from an Ir—Mn alloy, and an electrode layer 13 are continuously deposited on the free magnetic layer 5 exposed on sideeach side of the resist layer 10. A magnetic sensing element using the exchange bias method is completed by removing the resist layer 10 shown in FIG. 36.

The track width Tw can be defined as a distance between the two ferromagnetic layers 11 (in the X direction). The magnetization of each ferromagnetic layers 11 is tightly fixed in the X direction by the exchange coupling magnetic field generated between the second antiferromagnetic layer 12 and ferromagnetic layer 11 in the magnetic sensing element shown in FIG. 35. Since the magnetization at the side each side A of the free magnetic layer 5 located under the ferromagnetic layer 11 is tightly fixed in the X-direction due to the ferromagnetic coupling between the ferromagnetic layer 11 and free magnetic layer 5, and the central area B of the free magnetic layer 5 in the track width Tw area is considered to be weakly induced into a single magnetic domain state that undergoes fluctuations in the presence of an external magnetic field.

Accordingly, it was expected that the problems described in (1) to (3) might be properly solved by the magnetic sensing element using an exchange bias method.

However, the following additional problems were encountered in the magnetic sensing element manufactured by the manufacturing process shown in FIGS. 35 and 36.

(1) First, not only the Ta layer 9 but also a part of the free magnetic layer 5 is shaved off by ion-milling in the step shown in FIG. 35. In addition, an inert gas such as Ar used for ion-milling tends to diffuse from the surface of the exposed free magnetic layer 5 into the layer. Such damage by ion-milling causes a break in the crystal structure at the surface 5a of the free magnetic layer 5, or generates lattice deficiencies (a mixing effect). Accordingly, magnetic characteristics at the surface 5a of the free magnetic layer 5 tends to deteriorate.

Ideally, only the Ta layer 9 is shaved, or the free magnetic layer 5 is protected from being shaved by leaving the Ta layer behind as a very thin film. However, in practice it is difficult to control ion-milling to an extent as described above.

The difficulty arises from the thickness of the Ta layer 9 formed on the free magnetic layer 5. The Ta layer 9 is deposited with a thickness of about 30 Å to about 50 Å because the free magnetic layer 5 cannot be protected from being oxidized unless it is formed with the above thickness.

The Ta layer 9 is oxidized by exposure to the atmosphere, or by annealing in a magnetic field to generate an exchange coupling magnetic field between the pinned magnetic layer 3 or ferromagnetic layer 11 and antiferromagnetic layer 2 or 12. The thickness of the Ta layer in the oxidized portions is greater than the total thickness of the Ta layer immediately after deposition. For example, suppose that the thickness of the Ta layer 9 is about 30 Å immediately after deposition, then the thickness of the Ta layer 9 increases to about 45 Å due to oxidation.

High energy ion-milling is required to effectively remove the Ta layer 9 made thicker by oxidation. Since high energy ion-milling naturally has a high milling rate, it is almost impossible to stop milling at the moment when the Ta layer 9 having a large thickness has been removed by ion-milling. This means that the margin of milling limit should be wider as the milling energy is higher. Therefore, a part of the free magnetic layer 5 formed under the Ta layer is usually shaved off, and the free magnetic layer 5 tends to suffer excessive damages by high energy ion-milling resulting in substantially degraded magnetic characteristics.

(2) The magnetic characteristics of the surface of the free magnetic layer 5 exposed by ion-milling are degradeddue to the damage caused by ion-milling as described above. Consequently, the ferromagnetic layer 11 should be thickn- because a magnetic coupling (ferromagnetic exchange coupling interaction) between the free magnetic layer 5 and ferromagnetic layer laminated on the free magnetic layer 5 becomes insufficient.

However, the exchange coupling magnetic field generated between the antiferromagnetic layer 12 and ferromagnetic layer 11 is weakened when the thickness of the ferromagnetic layer 11 is increased. Eventually, magnetization on each outer side of the free magnetic layer 5 cannot be tightly fixed, which gives rise to side-reading. Thus, it is impossible to manufacture a magnetic sensing element that can adequately define the narrow track width.

On the other hand, when the ferromagnetic layer is too thick, an excessive static magnetic field is applied from the inner side of the ferromagnetic layer 11 to the central area B of the free magnetic layer 5, which decreases the sensitivity of the central area B of the free magnetic layer 5 where magnetic inversion is possible.

(3) It is difficult to selectively remove the Ta layer 9 as described above. However, suppose that the Ta layer 9 is left behind on both sides of the free magnetic layer 5, then Ta diffuses into the free magnetic layer and ferromagnetic layer 11 and degrade the magnetic characteristics of the free magnetic layer 5 and ferromagnetic layer 11. As a result, the ferromagnetic coupling between the free magnetic layer 5 and ferromagnetic layer 11 is weakened, and magnetization of the free magnetic layer cannot be properly controlled.

Effective control of magnetization of the free magnetic layer 5 remains impossible in a structure of the magnetic sensing element in which the Ta layer 9 is formed on the free magnetic layer 5, and the ferromagnetic layer 11 and second antiferromagnetic layer 12 are overlaid on the free magnetic layer 5 exposed by shaving both sides of the Ta layer 9. Consequently, a magnetic sensing element capable of properly defining the narrow track width could not be manufactured.

SUMMARY OF THE INVENTION

Accordingly, it is an object of the present invention to provide a magnetic sensing element able to effectively control the magnetization of the free magnetic layer while adequately defining the narrow track width, and a method for manufacturing the magnetic sensing element.

The present invention provide a magnetic sensing element comprising a multilayer having a first antiferromagnetic layer, a pinned magnetic layer, a nonmagnetic material layer, a free magnetic layer and a nonmagnetic layer laminated from the bottom in this order. A ferromagnetic layer and a second antiferromagnetic layer are provided from the bottom in this order on at least each outer side of the nonmagnetic layer in a track width direction. A ferromagnetic coupling is generated between the antiferromagnetic layer on each outer side of the free magnetic layer and each outer side of the free magnetic layer with interposition of the nonmagnetic layer.

In contrast to the conventional example (see FIG. 35), the nonmagnetic layer is formed on each outer side of the free magnetic layer in the present invention. Accordingly, each outer side of the free magnetic layer is properly protected from ion-milling by forming the nonmagnetic layer. In other words, each outer side of the free magnetic layer is not damaged by ion-milling as in the priorart Thus, good magnetic characteristics are maintained in each outer side of the free magnetic layer.

Accordingly, magnetization in each outer side of the free magnetic layer may be effectively fixed by the ferromagnetic coupling generated between the ferromagnetic layer and free magnetic layer with interposition of the nonmagnetic layer. The material and thickness of the nonmagnetic layer should be properly prescribed in the present invention for effectively generating an ferromagnetic coupling between the free magnetic layer and ferromagnetic layer.

The term "ferromagnetic coupling" as used herein means that each outer side of the free magnetic layer is magnetized in the same direction as the magnetic direction of the ferromagnetic layer by an RKKY ferromagnetic coupling between each outer side of the free magnetic layer and ferromagnetic layer with interposition of the nonmagnetic layer, or by a direct exchange coupling action between each outer side of the free magnetic layer and ferromagnetic layer through defects such as pin-holes formed on the nonmagnetic layer.

It is possible in the present invention to weakly set the central area of the free magnetic layer into a single magnetic domain state to an extent capable of magnetic inversion in the presence of an external magnetic field as described above, while allowing the magnetization in each outer side of the free magnetic layer to be tightly fixed by a ferromagnetic coupling between the ferromagnetic layer and free magnetic layer. Consequently, a magnetic sensing element capable of effectively controlling the magnetization of the free magnetic layer may be manufactured by defining the narrow track width.

In contrast to the prior art, the nonmagnetic layer may be left behind on each outer side of the free magnetic layer because, as will be described later, each outer side of the nonmagnetic layer is protected from complete removal by low energy ion-milling by properly adjusting the thickness of the nonmagnetic layer in the deposition step. However, each outer side of the nonmagnetic layer may not necessarily be shaved off by ion-milling in the present invention if the thickness, after deposition of the nonmagnetic layer, is able to effectively generate a ferromagnetic coupling between the ferromagnetic layer and free magnetic layer.

Preferably, sideeach side of the nonmagnetic layer is thinner than in the central area thereof. The central area of the nonmagnetic layer is preferably formed with a thickness of about 3 Å or more and about 20 Å or less, more preferably with a thickness of about 10 Å or less.

The thickness of the central area of the nonmagnetic layer corresponds to the thickness immediately after deposition. Low energy ion-milling may be used to further reduce the thickness of each outer side of the nonmagnetic layer by shaving in the present invention, when a thin nonmagnetic layer is formed in the deposition step. Accordingly, ion-milling may be readily controlled so as to leave a part of each outer side of the nonmagnetic layer behind. Consequently, the magnetic characteristics of each outer side of the free magnetic layer may be adequately prevented from deterioratingby preventing the shaving of the entirenonmagnetic layer as well as a part of the free magnetic layer. As a result, magnetization in each outer side of the free magnetic layer can be effectively fixed by a ferromagnetic layer coupling between the free magnetic layer and ferromagnetic layer.

The nonmagnetic layer may be formed with a uniform thickness from the central area through each outer side thereof.

The present invention also provides a so-called CIP (current in the plane) type magnetic sensing element in which an electrode layer is provided on each outer side of the multilayer in the track width direction, and an electric current flows in the direction parallel to the surface of each layer in the multilayer.

Alternatively, the present invention provides a so-called CPP (current perpendicular to the plane) type magnetic sensing element in which electrode layers are provided on and under the multilayer, respectively, and an electric current flows in the direction perpendicular to the surface of each layer in the multilayer. An insulation layer is provided on the second antiferromagnetic layer in the CPP type magnetic sensing element. The upper electrode layer is preferably provided from on the insulation layer through on the center of the multilayer in the track width direction.

Forming the insulation layer allows a proportion of shunt of the sense current flowing from the upper electrode layer to the second antiferromagnetic layer to be reduced. This improves the output of the magnetic sensing element and facilitates the narrowing of the width of the effective track width.

A ferromagnetic layer may be also provided on the central area of the nonmagnetic layer. Alternatively, the ferromagnetic layer and a second antiferromagnetic layer may be also provided on the central area of the nonmagnetic layer. Preferably, the second antiferromagnetic layer is thinner in the central area than on each outer side.

The nonmagnetic layer may be formed with a uniform thickness from the central area through each outer side on the magnetic sensing element in which the ferromagnetic layer. Alternatively, the ferromagnetic layer and second antiferromagnetic layer are laminated on the central area of the nonmagnetic layer. The magnetic sensing element may be a CIP type magnetic sensing element in which the electrode layer is provided on each outer side in the track width direction of the multilayer, and an electric current flows in the direction parallel to the surface of each layer of the multilayer. Alternatively, the magnetic sensing element is a CPP type magnetic sensing element in which the upper and lower electrode layers are provided on and under the multilayer, respectively, and the electric current flows in the direction perpendicular to the surface of each layer of the multilayer.

When the magnetic sensing element (in which the ferromagnetic layer, or the ferromagnetic layer and second antiferromagnetic layer are laminated on the central area of the nonmagnetic layer) is used as a CCP type magnetic sensing element, insulation layers are provided on the surface of the second antiferromagnetic layer and on the sideinner sides facing each other in the central area in the track width direction. The upper electrode layer is preferably formed from the insulation layer surface through surface of the central area of the multilayer in the track width direction.

The proportion of the sense current shunt from the upper electrode to the second antiferromagnetic layer may be reduced by forming the insulation layer. This improves the output of the magnetic sensing element and facilitates the narrowing of the effective track width.

Preferably, the insulation layer is formed on the surface of the second antiferromagnetic layer independently from the insulation layer formed on the inner sides facing each other in the central area in the track width direction.

The upper electrode layer formed on the multilayer may also serve as an upper shield layer made of a magnetic material. Alternatively, the lower electrode provided under the multilayer may also serve as a lower shield layer formed from a magnetic layer.

The width of the sense current passageway may be narrowed to reduce the effective track width. This can be done by providing a projection projecting in the multilayer direction on the central area of the lower electrode in the track width direction so that the upper face of the projection contact the lower face of the multilayer, and by providing an insulation layer between each outer side of the lower electrode in the track width direction and the multilayer.

When the upper face of the projection is formed to be flush with the upper face of the insulation layer formed on each outer side of the lower electrode layer, the multilayer on the lower electrode and insulation layer may be formed on a planarized surface with a stable configuration. This stabilizes the characteristics of the magnetic sensing element.

It is preferable in the present invention to form the nonmagnetic material layer with a nonmagnetic conductive material. The magnetic sensing element comprising the nonmagnetic material layer formed from a nonmagnetic conductive material is called as a spin-valve type GMR magnetoresistive (CPP-GMR) element.

The nonmagnetic material layer may be made of an insulation material in the CCP type magnetoresistive in the present invention. This magnetic sensing element is called a tunnel effect type spin-valve magnetoresistive element (CPP-TMR). The nonmagnetic layer is preferably formed from at least one of Ru, Rh, Pd, Ir, Os, Re, Cr, Cu, Pt and Au. The nonmagnetic layer made of these materials forms a dense layer that is hardly oxidized by exposure to the atmosphere. Even a thin layer of these materials may sufficiently serve as an oxidation preventive layer of the free magnetic layer. Accordingly, the nonmagnetic layer made of the materials as described above does not show thickening of the layer by oxidation as seen in the conventional nonmagnetic layer formed from Ta. Also, the thickness of each outer side of the nonmagnetic layer may be sufficiently adjusted by low energy ion-milling. The nonmagnetic layer formed from these materials does not degrade the properties of the free magnetic layer and ferromagnetic layer, even when the materials in the nonmagnetic layer have diffused into the free magnetic layer and ferromagnetic layer. Consequently, a ferromagnetic coupling may be effectively generated between the free magnetic layer and ferromagnetic layer even when a part of the nonmagnetic layer is left behind on each outer side of the free magnetic layer.

The nonmagnetic layer is preferably formed with a thickness of more than about 0 Å and about 6 Å or less on each outer side of the nonmagnetic layer in the present invention when the nonmagnetic layer is formed from Ru, and Ni—Fe based alloy layers are formed at the interfaces where the free magnetic layer and ferromagnetic layer contact the nonmagnetic layer.

More preferably, the nonmagnetic layer is formed with a thickness of more than about 0 Å and about 8 Å or less on each outer side of the nonmagnetic layer in the present invention when the nonmagnetic layer is formed from Cr, and Ni—Fe based alloy layers are formed at the interfaces where the free magnetic layer and ferromagnetic layer contact the nonmagnetic layer.

The nonmagnetic layer is preferably formed with a thickness of more than about 0 Å and about 2.5 Å or less on each outer side of the nonmagnetic layer in the present invention, when the nonmagnetic layer is formed from Ir, and a Ni—Fe based alloy layers are formed at the interfaces where the free magnetic layer and ferromagnetic layer contact the nonmagnetic layer.

More preferably, the nonmagnetic layer is formed with a thickness of more than about 0 Å and about 3 Å or less at each outer side of the nonmagnetic layer in the present invention, when the nonmagnetic layer is formed from Rh, and Ni—Fe based alloy layers are formed at the interfaces where the free magnetic layer and ferromagnetic layer contact the nonmagnetic layer.

The nonmagnetic layer is preferably formed with a thickness of more than about 0 Å and about 5 Å or less, or about 10 Å or more and about 13 Å or less, on each outer side of the nonmagnetic layer in the present invention, when the nonmagnetic layer is formed from Ru, and layers mainly comprising Co are formed at the interfaces where the free magnetic layer and ferromagnetic layer contact the nonmagnetic layer. A Co layer as well as a $Co_{90at\%}Fe_{10at\%}$ may be used as the layer mainly comprising Co.

The nonmagnetic layer is preferably formed with a thickness of more than about 0 Å and about 4 Å or less, or about 10 Å or more and about 14 Å or less, at each outer side of the nonmagnetic layer in the present invention, when the nonmagnetic layer is formed from Rh, and layers mainly comprising Co are formed at the interfaces where the free magnetic layer and ferromagnetic layer contact the nonmagnetic layer.

The nonmagnetic layer is preferably formed with a thickness of more than about 0 Å and about 4 Å or less, or about 11 Å or more and about 15 Å or less, on each outer side of the nonmagnetic layer in the present invention, when the nonmagnetic layer is formed from Cu, and layers mainly comprising Co are formed at the interfaces where the free magnetic layer and ferromagnetic layer contact the nonmagnetic layer.

When the thickness of each outer side of the nonmagnetic layer is in the range as described above, a ferromagnetic coupling can be effectively generated between each outer side of the free magnetic layer and ferromagnetic layer, and the magnetization in each outer side of the free magnetic layer can be tightly fixed, thereby enabling the magnetization of the free magnetic layer to be more effectively and easily adjusted than in the prior art.

The ferromagnetic layer preferably has a thickness of about 2 Å or more and about 5 Å or less at each outer side of the ferromagnetic layer in the present invention. A ferromagnetic coupling may be effectively generated between each outer side of the free magnetic layer and ferromagnetic layer in the present invention, even when a thin ferromagnetic layer is formed as described above. Although a sufficient ferromagnetic coupling should be maintained between the ferromagnetic layer and free magnetic layer by increasing the thickness of the ferromagnetic layer, since ion milling degrades the magnetic characteristics of each outer side of the free magnetic layer, the exchange magnetic field generated between the ferromagnetic layer and second antiferromagnetic layer is weakened. Thus, the excess static magnetic field that is likely to be applied to the inner side of the ferromagnetic layer through the central area of the free magnetic layer can reduce sensitivity. However, these problems can be adequately suppressed in the present invention.

Preferably, the free magnetic layer comprises a three layer structure of magnetic layers in the present invention, or a CoFe/NiFe/CoFe three layer structure.

The present invention provides a process for manufacturing a magnetic sensing element comprising the following steps of:

(a) forming a fist antiferromagnetic layer, a pinned magnetic layer, a nonmagnetic intermediate layer, a free magnetic layer and a nonmagnetic layer on a substrate arranged from the bottom in this order;

(b) fixing the magnetization of the pinned magnetic layer by generating an exchange coupling magnetic field between the first antiferromagnetic layer and pinned magnetic layer by annealing in a first magnetic field;

(c) forming a resist layer on the central area of the nonmagnetic layer;

(d) forming a ferromagnetic layer and second antiferromagnetic layer on each outer side of the nonmagnetic layer exposed from each side of the resist layer in the track width direction; and (e) generating an exchange coupling magnetic field between the second antiferromagnetic layer and ferromagnetic layer by annealing in a second magnetic field to fix the magnetization at each outer side of the free magnetic layer in a direction perpendicular to the magnetization of the pinned magnetic layer by a ferromagnetic coupling between the free magnetic layer and ferromagnetic layer.

Layers for the first ferromagnetic layer through the nonmagnetic layer are continuously formed on the substrate in step (a). The ferromagnetic layer and second antiferromagnetic layer are formed on each outer side of the nonmagnetic layer not covered with the resist layer in step (d). Each side of the nonmagnetic layer is made thin. The magnetization at each outer side of the free magnetic layer is tightly fixed by the ferromagnetic coupling between the free magnetic layer and ferromagnetic layer by applying a heat treatment in a magnetic field in step (e).

Since not all the nonmagnetic layer formed on each outer side of the free magnetic layer is removed by ion-milling in the present invention, the free magnetic layer is not damaged by ion-milling, and good magnetic characteristics are obtainedon each outer side of the free magnetic layer.

Consequently, compared to prior art, the ferromagnetic coupling between each outer side of the free magnetic layer and ferromagnetic layer can be enhanced to more effectively controlthe magnetization of the free magnetic layer.

According to the present invention, a magnetic sensing element having a good regenerative sensitivity, as well as excellent regenerative characteristics, can be manufactured with a narrow track width.

Preferably, each outer side of the nonmagnetic layer not covered by the resist layer is shaved off after forming the resist layer, with a portion of each outer side of the non-magnetic layer left behind in step (c). The ferromagnetic coupling between each outer side of the free magnetic layer and ferromagnetic layer can be, enhanced by making each outer side of the nonmagnetic layer thin by shaving a part thereof, thereby enabling magnetization of the free magnetic layer to be more effectively controlled.

The nonmagnetic layer is preferably formed with a thickness of about 3 Å or more and about 20 Å or less, more preferably with a thickness of about 10 Å or less, in step (a) by shaving a portion of each outer side of the nonmagnetic layer as described above. The thickness as described above sufffices for protecting the free magnetic layer from being oxidized while alllowing the use of low energy ion-milling, thereby making it possible to more effectively and easily leave a part of each outer side of the nonmagnetic layer behind.

The present invention also provides a process for manufacturing a magnetic sensing element comprising the steps of:

(f) forming a multilayer comprising a first antiferromagnetic layer, pinned magnetic layer, nonmagnetic material layer, free magnetic layer and nonmagnetic layer laminated on a substrate, the layers being formed in this order;

(g) fixing a magnetization of the pinned magnetic layer by generating an exchange coupling magnetic field between the first antiferromagnetic layer and pinned magnetic layer by annealing in a first magnetic field;

(h) forming a ferromagnetic layer and second antiferromagnetic layer on the nonmagnetic layer;

(i) forming a mask layer on each outer side of the second antiferromagnetic layer, and shaving the central area of the second antiferromagnetic layer not covered with the mask layer; and (j) generating an exchange coupling magnetic field between each outer side of the second antiferromagnetic layer and ferromagnetic layer by annealing in a second magnetic field, and fixing a magnetization in each outer side of the free magnetic layer in a direction perpendicular to the magnetization of the pinned magnetic layer by a ferromagnetic coupling between the free magnetic layer and ferromagnetic layer.

Layers from the first antiferromagnetic layer through the nonmagnetic layer are continuously deposited on the substrate in step (f). A thin nonmagnetic layer is formed in the present invention so that a ferromagnetic coupling is generated between each outer side of the free magnetic layer and ferromagnetic layer in step (j).

Unlike the prior art, since the nonmagnetic layer is always present on each outer side of the free magnetic layer from the deposition step through the final step in the present invention, ion milling does not damage each outer side of the free magnetic layer. Accordingly, the ferromagnetic coupling between each outer side of the free magnetic layer and ferromagnetic layer is enhanced to more effectively control the magnetization of the free magnetic layer.

Consequently, a magnetic sensing element having good regenerative sensitivity as well as excellent regenerative characteristics even by narrowing the track width can be manufactured.

Preferably, the present invention provides a process for manufacturing the magnetic sensing element comprising, between steps (g) and (h), the step of: (k) shaving a part of the surface of the nonmagnetic layer in order to form the nonmagnetic layer with a prescribed thickness, to enable a ferromagnetic coupling to be effectively generated between the ferromagnetic layer and each outer side of the free magnetic layer, and to enable magnetization of the free magnetic layer to be more effectively controlled. When step (k) is added in the manufacturing steps, in step (f) the nonmagnetic layer is preferably formed with a thickness of about 3 Å or more and about 20 Å or less, more preferably with a thickness of about 10 Å or less. Since the free magnetic layer with the thickness in the above range is effectively prevented from being oxidized with the thickness in the range above, the thickness of the nonmagnetic layer can be controlled using low energy ion-milling, thereby allowing a part of the nonmagnetic layer to be more adequately and more easily left behind on the free magnetic layer.

The surface of the magnetic layer may be exposed from under the mask layer in the present invention by removing all the central area of the second antiferromagnetic layer not covered with the mask layer in step (i). Alternatively, a part of the exposed ferromagnetic layer may be shaved off in step (i).

Furthermore, the surface of the nonmagnetic layer may be exposed by removing the entire central area of the second antiferromagnetic layer not covered with the mask layer in step (i), and then removing all the exposed ferromagnetic layer.

The annealing step in the second magnetic field in step (j) may be applied between steps (h) and (i) in the present invention.

The mask layer formed in step (i) may be made of a nonmagnetic conductive material in the present invention, and the mask layer itself may be used as an electrode layer after step (j).

A CIP type magnetic sensing element in which an electric current flows in a direction perpendicular to the surface of each layer of the multilayer may be formed by providing a pair of electrode layers on the second antiferromagnetic layer spaced apart in the track width direction.

Preferably, the present invention also provide a process for manufacturing a magnetic sensing element comprising the steps of:

(l) forming a lower electrode layer on the substrate before step (a);

(m) laminating an insulation layer covering the second antiferromagnetic layer with an opening in the central area thereof in the track width direction after step (d); and (n) forming an upper electrode layer in electrical continuity with the multilayer.

Alternatively, the process comprises the steps of:

(o) forming the lower electrode on the substrate before step (f);

(p) depositing an insulation layer on the second antiferromagnetic layer in place of step (i);

(q) laminating a resist provided with an opening on the insulation layer in the central area in the track width direction thereof, and shaving the portions of the insulation layer and second antiferromagnetic layer exposed in the opening; and (r) forming an upper electrode layer in electrical continuity with the multilayer.

Alternatively, the process comprises the steps of:

(s) forming a lower electrode layer on the substrate before step (f);

(t) forming an insulation layer having an opening on the second antiferromagnetic layer in the central area in the track width direction thereof in place of step (i);

(u) shaving the central area of the second antiferromagnetic layer in the track width direction using the insulation layer as a mask; and (v) forming an upper electrode layer in electrical continuity with the multilayer.

More preferably, the process comprises, between steps (q) and (r) or between steps (u) and (v), the steps of:

(w) forming another insulation layer from the surface of an exposed portion of the multilayer through the insulation layer surface; and (x) removing the another insulation layer laminated on the exposed portion on the multilayer.

The process preferably comprises, between steps (l) and (a), steps (o) and (f), or steps (s) and (f), the steps of:

(y) forming a projection projected in the direction of the multilayer in the central area in the track width direction of the lower electrode layer; and (z) providing an insulation layer on each outer side of the projection of the lower electrode layer in the track with direction.

It is preferable to form the multilayer so that the upper face of the projection makes contact with the lower face of the multilayer in step (a) or (f).

It is more preferable that the upper face of the projection is formed to be flush with the surface of the insulation layer provided in each outer side of the lower electrode layer in step (z) above.

It is preferable to form the lower electrode layer and/or the upper electrode layer with a magnetic material, since the lower electrode layer also serves as a lower shield layer, and the upper electrode layer also serves as an upper shield layer.

The upper electrode layer may be formed as a laminate in which a layer formed with the nonmagnetic conductive layer that is in electrical continuity with the multilayer is formed on a layer formed from a magnetic material.

It is also preferable in the present invention to form the nonmagnetic material layer with a nonmagnetic conductive material. The magnetic sensing element comprising the nonmagnetic material layer made offrom the nonmagnetic conductive material is called as a spin-valve type GMR magnetoresistive (CPP-GMR) element.

The nonmagnetic material layer may be formed from an insulation material in the CPP type magnetic sensing element according to the present invention. This type of the magnetic sensing element is called as a spin-valve type tunnel magnetoresistive (CPP-TMR) element. The nonmagnetic layer is preferably formed from at least one of Ru, Rh, Re, Pd, Os, Ir, Cr, Cu, Pt and Au. Unlke a Ta layer, these precious metals are hardly oxidized. Thus, the nonmagnetic layer does not become thicker due to oxidation. Control of the thickness of the nonmagnetic layer made of Ru and the like is possible in the present invention by using a precious metal such as Ru in place of Ta. Consequently, each outer side of the free magnetic layer formed under the nonmagnetic layer may be properly protected from damage while enabling each outer side of the free magnetic layer to be tightly fixed by generating a ferromagnetic coupling between each outer side of the free magnetic layer and ferromagnetic layer through the nonmagnetic layer.

The nonmagnetic layer formed from these materials does not degrade the properties of the ferromagnetic layer and free magnetic layer even when the materials diffuse into the ferromagnetic layer and free magnetic layer. Accordingly, the ferromagnetic coupling can be effectively generated between the ferromagnetic layer and free magnetic layer even if a part of the nonmagnetic layer is left behind on each outer side of the free magnetic layer as in the present invention.

Preferably, the thickness of each outer side of the nonmagnetic layer is adjusted so that the thickness of at least each outer side of the nonmagnetic layer is more than about 0 Å and about 6 Å or less in step (d) or (h) when the nonmagnetic layer is made of Ru and Ni—Fe based alloy layers are formed at the interfaces where the free magnetic layer and ferromagnetic layer contact the nonmagnetic layer.

Preferably, the thickness of each outer side of the nonmagnetic layer is adjusted so that the thickness of at least each outer side of the nonmagnetic layer is more than about 0 Å and about 8 Å or less in step (d) or (h) when the nonmagnetic layer is formed from Cr and Ni—Fe based alloy layers are formed at the interfaces where the free magnetic layer and ferromagnetic layer contact the nonmagnetic layer.

The thickness of the each outer side of the nonmagnetic layer is preferably adjusted so that the thickness of at least each outer side of the nonmagnetic layer is more than about 0 Å and about 2.5 Å or less in the step (d) or (h) when the nonmagnetic layer is formed from Ir and Ni—Fe based alloy layers are formed at the interfaces where the free magnetic layer and ferromagnetic layer contact the nonmagnetic layer.

It is also preferable in the present invention to adjust the thickness of each outer side of the nonmagnetic layer so that the thickness of at least each outer side of the nonmagnetic layer is adjusted to be more than 0 Å and 3 Å or less in the step (d) or (h), when the nonmagnetic layer is made of Rh and Ni—Fe based alloy layers are formed at the interfaces where the free magnetic layer and ferromagnetic layer contact the nonmagnetic layer.

It is also preferable in the present invention to adjust the thickness of each outer side of the nonmagnetic layer so that the thickness of at least each outer side of the nonmagnetic layer is adjusted to be more than about 0 Å and about 5 Å or less, or about 10 Å more and about 13 Å or less in step (d) or (h), when the nonmagnetic layer is formed from Ru and layers mainly comprising Co are formed at the interfaces where the free magnetic layer and ferromagnetic layer contact the nonmagnetic layer.

It is also preferable in the present invention to adjust the thickness of each outer side of the nonmagnetic layer so that the thickness of at least each outer side of the nonmagnetic layer is adjusted to be more than from 0 Å and from 4 Å or less, or from 10 Å or more and about 14 Å or less, in step (d) or (h) when the nonmagnetic layer is formed from Rh and layers mainly comprising Co are formed at the interfaces where the free magnetic layer and ferromagnetic layer contact the nonmagnetic layer.

It is also preferable in the present invention to adjust the thickness of the end in each side of the nonmagnetic layer so that the thickness of at least each outer side of the nonmagnetic layer is adjusted to be more than about 0 Å and about 4 Å or less, or about 11 Å pr more and about 15 Å or less, in steps (d) and (h) when the nonmagnetic layer is formed from Cu and layers mainly comprising Co are formed at the interfaces where the free magnetic layer and ferromagnetic layer contact the nonmagnetic layer.

It is also preferable in the present invention to form the ferromagnetic layer with a thickness of about 2 Å or more and about 50 Å or less in step (d) or (h).

It is also preferable in the present invention to form the free magnetic layer with a three layer structure in the step (a) or (f). Particularly, the free magnetic layer is formed with a CoFe/NiFe/CoFe three layer structure.

BRIEF DESCRIPTION OF THE DRAWINGS

FIG. 7 is a partially magnified cross section of a free magnetic layer corresponding toan embodiment of the present invention as viewed from a side opposite a recording medium.

FIG. 8 is a partially magnified cross section of a free magnetic layer in another embodiment of the present invention as viewed from aside opposite a recording medium.

DESCRIPTION OF THE PREFERRED EMBODIMENTS

As used herein, the term "about", when used in conjunction or in relation with a quantity or parameter, refers to a range of plus or minus 20%, more preferably plus or minus 10%, and most preferably plus or minus 5% of the absolute value of the quantity or parameter, except in cases where a negative value of a quantity or parameter would not apply or be feasible.

Figure 1:
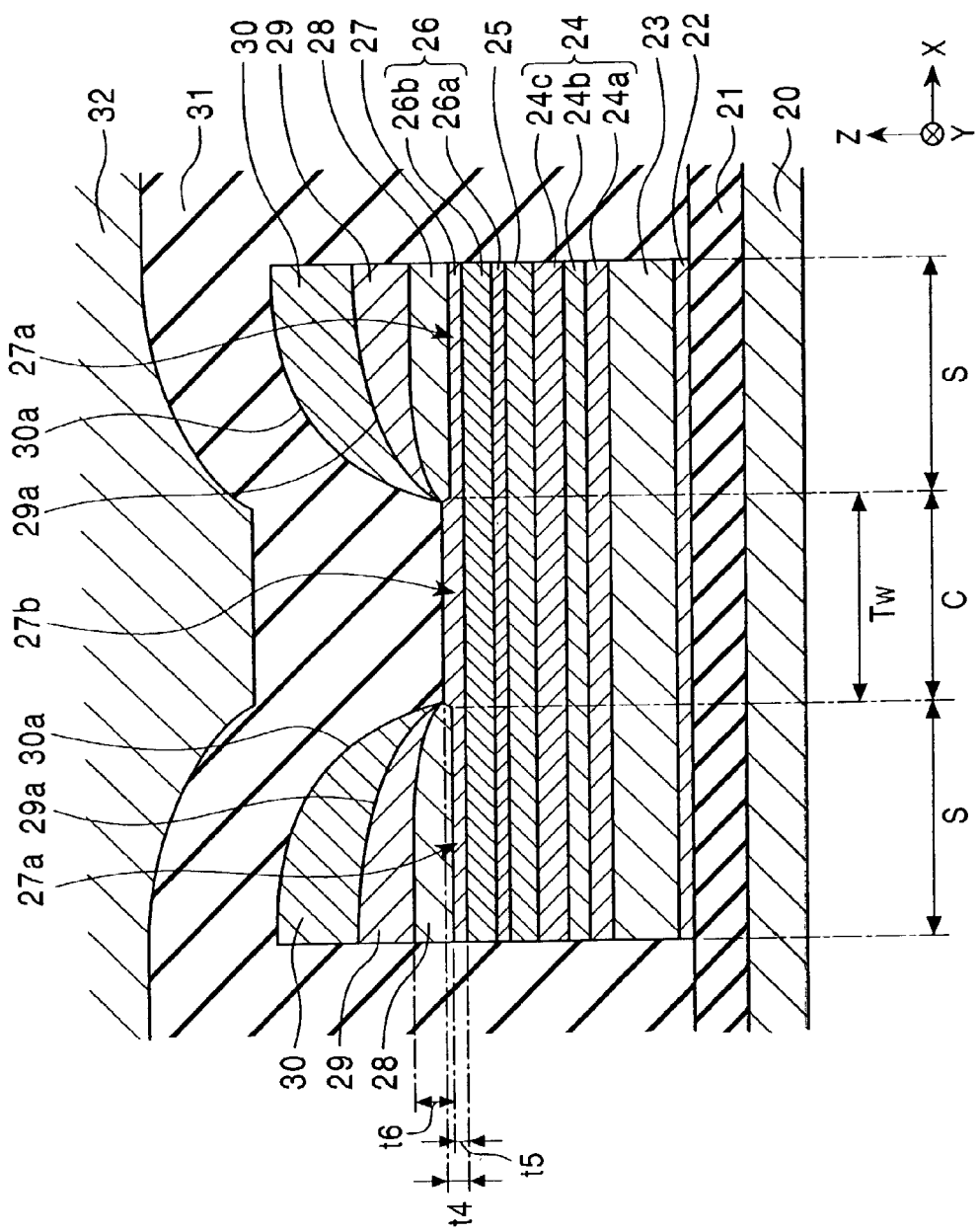
FIG. 1 is a partial cross section of a structure of the magnetic sensing element corresponding to first embodiment of the present invention as viewed from a side opposite a recording medium.

FIG. 1 is a partial cross section of the magnetic sensing element (spin-valve type thin film element) of the present invention viewed from aside opposite a recording medium.

The magnetic sensing element shown in FIG. 1 detects a leak magnetic field from a recording medium such as a hard disk by taking advantage of a magnetoresistive effect to read recorded signals.

The reference numeral 20 denotes a lower shield layer that is formed from a magnetic material such as a Ni—Fe based alloy. A lower gap layer 21 made of $Al_2O_3$ and the like is formed on the lower shield layer 20, and the magnetic sensing element according to the present invention is formed on the lower gap layer 21.

The reference numeral 22 denotes an underlayer made of Ta and the like. A first antiferromagnetic layer 23 is formed on the underlayer 22. The first antiferromagnetic layer 23 is formed from a Pt—Mn alloy, a X—Mn alloy (where X is at least one of Pd, Ir, Rh, Ru, Os, Ni and Fe), or a Pt—Mn—X' alloy (where X' is at least one of PD, Ir, Rh, Ru, Au, Ag, Os, Cr, Ni, Ar, Ne, Xe and Kr).

An exchange coupling layer for generating a large exchange coupling magnetic field between the first antiferromagnetic layer 23 and pinned magnetic layer 24 may be obtained by using these alloys for the first antiferromagnetic layer 23 and then heat treating the layer. In particular, the exchange coupling layer for the fist antiferromagnetic layer 23 and pinned magnetic layer 24 having an exchange coupling magnetic field of more than about 48 kA/m, for example exceeding about 64 kA/m, and a blocking temperature of as high as about 380° C. may be obtained by using the Pt—Mn alloy. The blocking temperature denotes a temperature where the exchange coupling magnetic field disappears.

While these alloy takes a disordered face-centered cubic (fcc) structure immediately after deposition, it undergoes a structural modification into a CuAuI (CuAuI) type ordered face-centered tetragonal (fct) structure by heat-treatment.

The first antiferromagnetic layer 23 has a thickness of from about 30 to about 80 Å in the vicinity of the central area in the track width direction.

A seed layer comprising a Ni—Fe alloy, Ni—Fe—Cr alloy or Cr may be formed between the underlayer 22 and first antiferromagnetic layer 23. The seed layer comprises, for example, a layer of $(Ni_{0.8}Fe_{0.2})_{60at\%}Cr_{40at\%}$ with a thickness of about 60 Å. A seed layer may be formed on the lower gap layer 21 without forming any underlayer 22. The first antiferromagnetic layer 23 may be formed on the seed layer.

As shown in FIG. 1, the pinned magnetic layer 24 is formed on the first antiferromagnetic layer 23. The pinned magnetic layer 24 takes an artificial ferrimagnetic structure with a three layer structure comprising magnetic layers 24a and 24c with interposition of a nonmagnetic intermediate layer 24b therebetween.

The magnetic layers 24a and 24c are formed from, for example, a Ni—Fe alloy, Co, a Co—Ni—Fe alloy, a Co—Fe alloy or a Co—Ni alloy. The magnetic layers 24a and 24c are preferably formed from the same material with each other.

The nonmagnetic intermediate layer 24b is made of a nonmagnetic material of at least one of Rh, Ir, Cr, Re and Cu, preferably Ru.

A nonmagnetic material layer 25 is formed on the pinned magnetic layer 24. The nonmagnetic conductive layer 25, through which a sense current mainly flows, prevents magnetic coupling between the pinned magnetic layer 24 and free magnetic layer 26. The nonmagnetic material layer 25 is preferably formed from a conductive nonmagnetic material such as Cr, Au and Ag, more preferably Cu.

A free magnetic layer 26 is formed on the nonmagnetic material layer 25. The free magnetic layer 26 has a bilayer structure in the embodiment shown in FIG. 1. The reference numeral 26a denotes a diffusion preventive layer comprising Co or a Co—Fe alloy. The diffusion preventive layer 26a prevents mutual diffusion between the free magnetic layer 26 and nonmagnetic material layer 25. A magnetic material layer 26b formed from a Ni—Fe alloy is formed on the diffusion preventive layer 26a.

A nonmagnetic layer 27 is formed on the free magnetic layer 26. A ferromagnetic layer 28 is further formed on each outer-side 27a of the nonmagnetic layer 27. A second antiferromagnetic layer 29 is additionally formed on the ferromagnetic layer 28. The second antiferromagnetic layer 29 is formed from the same material as used in the first antiferromagnetic layer 23, i.e., a Pt—Mn alloy, a X—Mn alloy (where X is at least one of Pd, Ir, Rh, Ru, Os, Ni and Fe), or a Pt—Mn—X' alloy (where X' is at least one of PD, Ir, Rh, Ru, Au, Ag, Os, Cr, Ni, Ar, Ne, Xe and Kr).

An electrode layer 30 is formed on the second antiferromagnetic layer 29. The electrode layer 30 is formed from, for example, Au, W, Cr, Ru and Ta.

Figure 2:
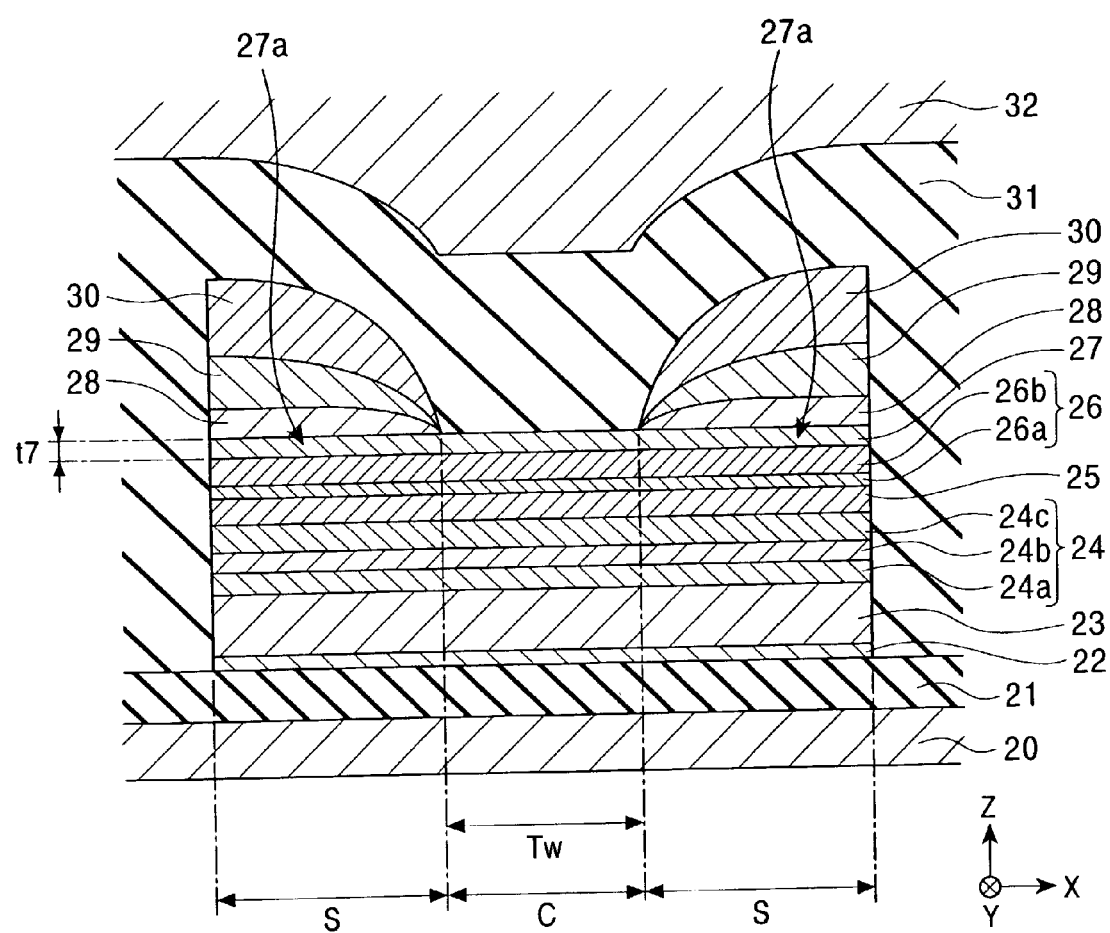
FIG. 2 is a partial cross section of a structure of the magnetic sensing element corresponding to a second embodiment of the present invention as viewed from aside opposite a recording medium.
Figure 3:
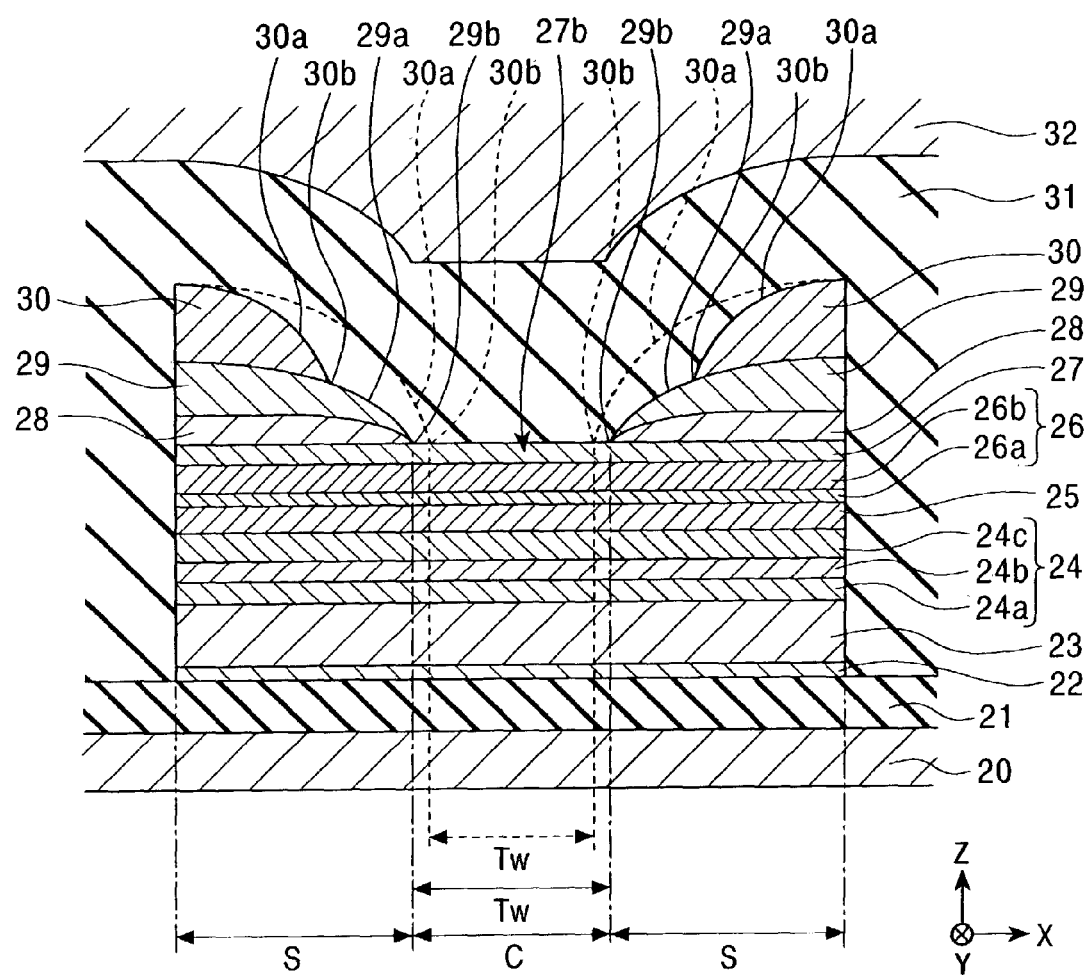
FIG. 3 is a partial cross section of a structure of the magnetic-sensing element corresponding to a third embodiment of the present invention as viewed from aside opposite a recording medium.

The inner side 29a of the second antiferromagnetic layer 29 and the inner side 30a of the electrode layer 30 comprise inclined or curved surfaces with a gradually increasing separation between opposed inner ends in the direction from the lower face to the upper face (in the Z-direction) thereof. The same features are seen in FIGS. 2 and 3.

As shown in FIG. 1, an upper gap layer 31 formed from an insulation material such as $Al_2O_3$ is formed from the surface of the electrode layer 30 through the surface of the nonmagnetic layer 27. An upper shield layer 32 made of a magnetic material such as a Ni—Fe based alloy is formed on the upper gap layer 31.

As shown in FIG. 1, the nonmagnetic layer 27 is formed on the free magnetic layer 26. The ferromagnetic layer 28 and antiferromagnetic layer 29 are formed on each outer side 27a of the nonmagnetic layer 27.

The outer side 27a of the nonmagnetic layer 27 is formed with a thickness t5 that is smaller than the thickness t4 in the central area 27b of the side 27a. The thickness of each outer side 27a of the nonmagnetic layer 27 is, for example, about 5 Å or less, preferably about 3 Å or less.

A ferromagnetic coupling is readily generated between the outer sides S of the ferromagnetic layer 28 and free magnetic layer 26 by forming each outer side 27a of the nonmagnetic layer 27 with a prescribed small thickness. Magnetization of the ferromagnetic layer 28 is tightly fixed and put into a single magnetic domain state by the exchange coupling magnetic field generated between the ferromagnetic layer 28 and second antiferromagnetic layer 29 formed thereon in the track width direction. Consequently, each outer side S in which the ferromagnetic coupling is generated between the free magnetic layer and ferromagnetic layer 28 is oriented in the same direction as the magnetization direction of the ferromagnetic layer 28 with tightly fixed magnetization put into a single magnetic domain state in the track width direction (X-direction).

The term "ferromagnetic coupling" as used herein means that magnetization in each outer side S of the free magnetic layer 26 is aligned in the same direction as the magnetization direction of the ferromagnetic layer 28 by a RKKY ferromagnetic coupling between each outer side of the free magnetic layer 26 and each outer side 27a of each outer side of the ferromagnetic layer 28 with interposition of the nonmagnetic layer 27, or by a direct exchange interaction through defects such as pin-holes formed on the nonmagnetic layer 27.

According to the first embodiment in FIG. 1, magnetization in each outer side S of the free magnetic layer 26 is properly fixed in the track width direction (X-direction) by the ferromagnetic coupling generated between the ferromagnetic layer 28 and free magnetic layer.

Magnetization of the central area C of the free magnetic layer 26 is weakly set into a single magnetic domain state to an extent capable of magnetic inversion. Since the width of the central area C in the track width direction (X-direction) is approximately the same as the track width Tw defined by the length in the track width direction (X-direction) of the lower face of the ferromagnetic layer 28, the area within the track width Tw may be defined as a sensitive area capable of magnetic inversion even when narrowing the track widthto facilitate definition of high recording density, making it possible to manufacture a magnetic sensing element capable of defining high density recording. The track width Tw is preferable about 0.2 μm or less.

As will be described in the manufacturing process below, the nonmagnetic layer 27 serves as a protective layer for protecting the free magnetic layer 26 from being oxidized by exposure to the atmosphere.

However, the nonmagnetic layer 27 is preferably made of a material that is hardly oxidized by exposing to the atmosphere. Preferably, the properties as a ferromagnetic material layer are not degraded even when the elements constituting the nonmagnetic layer 27 diffused into the free magnetic layer 26 and ferromagnetic layer 28 in the deposition step, or in the annealing step, in a magnetic field for adjusting the magnetization directions of the pinned magnetic layer 24 and free magnetic layer 26.

The nonmagnetic layer 27 is preferably formed from at least one of Ru, Rh, Re, Pd, Os, Ir, Cr, Cu, Pt and Au. Ru is particularly preferred. The nonmagnetic layer 27 made of these precious metals is hardly oxidized by exposure to the atmosphere. Unlike the Ta layer, the layer thickness is not increased by oxidation due to exposure to the atmosphere.

The properties as a ferromagnetic material layer is not degraded even when the elements constituting the nonmagnetic layer 27 made of these precious metals diffuse into the free magnetic layer 26 and ferromagnetic layer 28.

Diffusion of the elements constituting the nonmagnetic layer 27 into the free magnetic layer 26 and ferromagnetic layer 28 may be detected with, for example, a SIMS analyzer (a secondary ion mass spectrometer).

A thin nonmagnetic layer 27 is preferably deposited with a thickness in the range of about 3 Å or more and about 20 Å or less, more preferably about 3 Å or more and about 10 Å or less. Since the nonmagnetic layer 27 comprising Ru and the like is a dense layer hardly oxidized by exposure to the atmosphere, a thin layer thereof is sufficient for properly protecting the free magnetic layer 26 from being oxidized by exposure to the atmosphere.

The thickness of the deposited layer is maintained in the central area 27b of the nonmagnetic layer 27 because the central area 27b is not affected by ion-milling in the manufacturing process as will be described hereinafter. The thickness t4 of the central area 27b of the nonmagnetic layer 27 is preferably about 3 Å or more and about 20 Å or less, more preferably about 3 Å or more and about 10 Å or less.

Each outer side 27a of the nonmagnetic layer 27 is shaved by ion-milling. The thickness t5 at each side 27a is smaller than the thickness t4 in the central area 27b of the nonmagnetic layer 27. The thickness t5 at each outer side 27a is made smaller than the thickness in the central area 27b to generate an appropriate magnitude of ferromagnetic coupling between the outer side S of the free magnetic layer 26 and the ferromagnetic layer 28 formed thereon with interposition of the nonmagnetic layer 27, thereby tightly fixing the magnetization at each outer side S of the free magnetic layer 26 in the track width direction (X-direction).

A ferromagnetic coupling is only weakly generated between each outer side S of the free magnetic layer 26 and ferromagnetic layer 28 when a thick nonmagnetic layer 27 is formed.

The thickness t5 at each outer side 27a of the nonmagnetic layer 27 may change within a proper range depending on the material of the nonmagnetic layer 27, as well as the materials of the free magnetic layer 26 and ferromagnetic layer 28 facing each other, with interposition of the nonmagnetic layer 27. The JOURNAL OF APPLIED PHYSICS, Vol. 87, No. 9,2000, pp6974–6976 describes a relation between the thickness of the nonmagnetic layer 27 made of various materials and the saturation magnetic field (Hs) and spin-flop magnetic field (Hsf) as shown in FIGS. 18 to 21. The experimental conditions are described on page 6976 and the following pages in this reference. The layer used for the experiment comprises Si substrate/Al$_2$O$_3$/Ta(30)/Cu(50)/ free magnetic layer: [Co(3)/NiFe(40)]/nonmagnetic layer X/ferromagnetic layer: NiFe(25)/Ta(30), wherein the figures in each parenthesis denote a layer thickness in Å unit. FIGS. 18 to 21 show the experimental results of each laminated layers after deposition and before heat-treatment (as-deposition state).

The "saturation magnetic field (Hs)" as used herein refers to as a magnitude of magnetization for aligning two magnetic directions in the same direction when the free magnetic layer 26 and ferromagnetic layer 28 are magnetized in an antiparallel relation with each other with interposition of the nonmagnetic layer 27. The "spin-flop magnetic field (Hsf)" as used herein refers to a magnitude of a collapsing magnetic field of the antiparallel relation when the free magnetic layer 26 and ferromagnetic layer 28 are magnetized antiparallel to each other with interposition of the nonmagnetic layer 27. In other words, the larger the "saturation magnetic field (Hs)" and "spin-flop magnetic field (Hsf)" are, the better the magnetization of the ferromagnetic layer 28 and magnetization of the free magnetic layer 26 can maintain a stronger antiparallel relation with each other. On the other hand, the smaller the "saturation magnetic field (Hs)" and "spin-flop magnetic field (Hsf)" are, the more readily can the magnetization of the ferromagnetic layer 28 and free magnetic layer 26 orient in the same direction with each other.

A ferromagnetic coupling is generated between each outer side S of the free magnetic layer 26 and ferromagnetic layer 28 in the present invention as hitherto described. The magnetic direction of each outer side S of the free magnetic layer 26 is fixed in the same magnetic direction as that of the ferromagnetic layer 28.

As shown by the experimental results in FIGS. 18 to 21, it is preferable in the present invention, as shown by the experimental results in FIGS. 18 to 21, to select the thickness of the nonmagnetic layer 27 for reducing the "saturation magnetic field (Hs)" and "spin-flop magnetic field (Hsf)", to permit a ferromagnetic coupling to be more effectively generated between each outer side S of the free magnetic layer 26 and ferromagnetic layer 28, and to align the magnetization direction in each outer side S of the free magnetic layer 26 in the same direction as the magnetization direction of the ferromagnetic layer 28.

Figure 18:
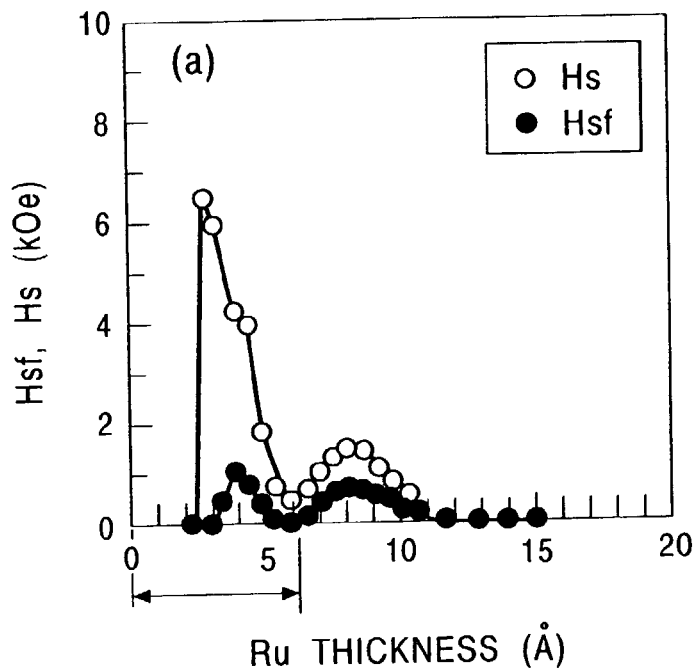
FIG. 18 is a graph showing the relation between the thickness of the Ru layer and the saturation magnetic field (Hs) and spin-flop magnetic field (Hsf) in the laminated layer having a NiFe/Ru/NiFe layer.

FIG. 18 shows an experimental result when Ru is selected for the nonmagnetic layer 27. The saturation magnetic field (Hs) and spin-flop magnetic field (Hsf) show large peaks when the thickness of the Ru layer is about 3 Å. The graph also shows that the magnitudes of the saturation magnetic field (Hs) and spin-flop magnetic field (Hsf) start to increase when the thickness of the Ru layer is larger than about 6 Å.

However, the experimental result shown in FIG. 18 is obtained without applying any heat-treatment. On the hand, when the laminated layer used in the experiment was heat-treated, it was shown that both the saturation magnetic field (Hs) and spin-flop magnetic field (Hsf) become almost zero [(kOe or A/m); 1 Oe corresponds to about 79 A/m] when the Ru layer has a thickness of more than about 0 Å and about 6 Å or less.

It is essential in the present invention to apply a heat-treatment in a magnetic field to control the magnetization of the pinned magnetic layer 24 and free magnetic layer 26. Accordingly, the relation between the thickness of the Ru layer and the saturation magnetic field (Hs) and spin-flop magnetic field (Hsf) should be referred to after applying the heat-treatment. A range of the thickness of the Ru layer of larger than about 0 Å and about 6 Å or less is a proper range to effectively generate a ferromagnetic coupling between the ferromagnetic layer 28 and free magnetic layer 26 since the saturation magnetic field (Hs) and spin-flop magnetic field (Hsf) are reduced to about 0 (kOe).

Since a NiFe based alloy is used for the layers to serve as the ferromagnetic layer 28 and free magnetic layer 26 in the layer construction used in the experiment above, the preferred thickness of each outer side 27a of the nonmagnetic layer 27 is defined to be larger than about 0 Å and about 6 Å or less when Ru is selected for the nonmagnetic layer 27 and NiFe layers are formed at the interfaces where the ferromagnetic layer 28 and free magnetic layer 26 contact the nonmagnetic layer 27.

Figure 19:
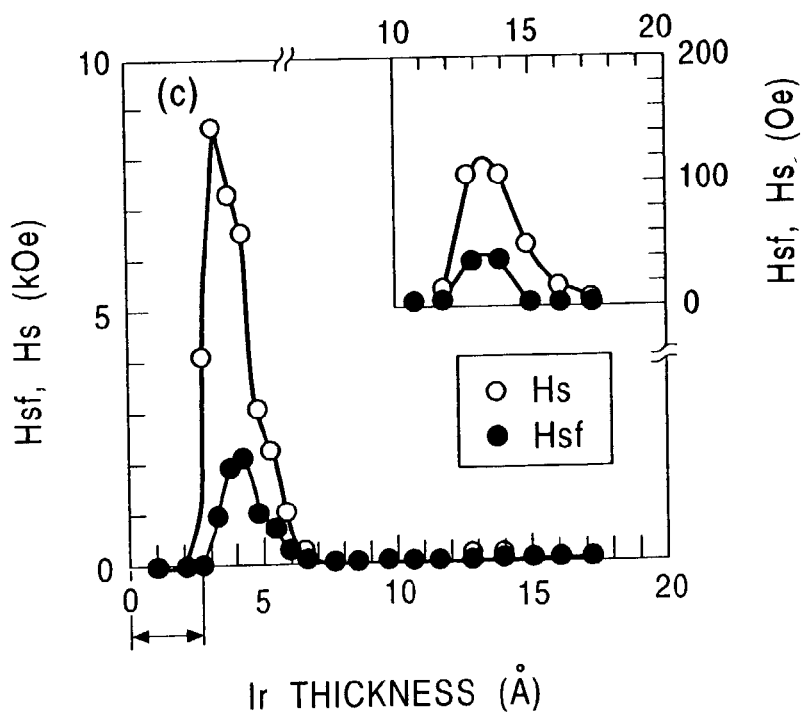
FIG. 19 is a graph showing the relation between the thickness of the Ir layer and the saturation magnetic field (Hs) and spin-flop magnetic field (Hsf) in the laminated layer having a NiFe/Ir/NiFe layer.

FIG. 19 shows an experimental result when Ir is selected for the nonmagnetic layer 27. As shown in FIG. 19, the saturation magnetic field (Hs) and spin-flop magnetic field (Hsf) are reduced to about zero (kOe) when the Ir layer has a thickness of larger than about 0 Å and about 2.5 Å or less. When Ir is selected for the nonmagnetic layer 27, on the other hand, the relation between the thickness of the Ir layer and the saturation magnetic field (Hs) and spin-flop magnetic field (Hsf) remains unchanged even after heat-treatment.

The preferred thickness at each outer side 27a of the nonmagnetic layer 27 was determined to be larger than about 0 Å and about 2.5 Å or less when Ir is selected for the nonmagnetic layer 27 and NiFe based alloys are formed at the interfaces where the ferromagnetic layer 28 and free magnetic layer 26 contact the nonmagnetic layer 27.

Figure 20:
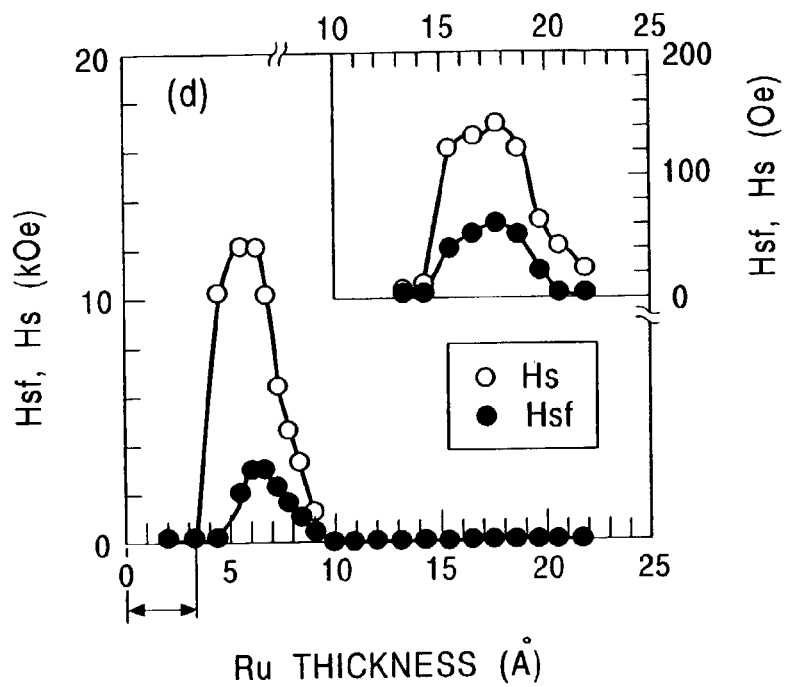
FIG. 20 is a graph showing the relation between the thickness of the Rh layer and the saturation magnetic field (Hs) and spin-flop magnetic field (Hsf) in the laminated layer having a NiFe/Rh/NiFe layer.

FIG. 20 shows an experimental result when Rh is selected for the nonmagnetic layer 27. As shown in FIG. 20, the saturation magnetic field (Hs) and spin-flop magnetic field (Hsf) are reduced to about zero (kOe) when the thickness of the Rh layer is larger than about 0 Å and about 3 Å or less. The relation between the thickness of the Rh layer and the saturation magnetic field (Hs) and spin-flop magnetic field (Hsf) remained almost unchanged by heat-treatment, when Rh is selected for the nonmagnetic layer 27.

The preferred thickness range on each outer side 27a of the nonmagnetic layer 27 is more than about 0 Å and about 3 Å or less in the present invention when Rh is selected for the nonmagnetic layer 27 and NiFe based alloy layers are formed at the interfaces where the ferromagnetic layer 28 and free magnetic layer 26 contact the nonmagnetic layer 27.

Figure 21:
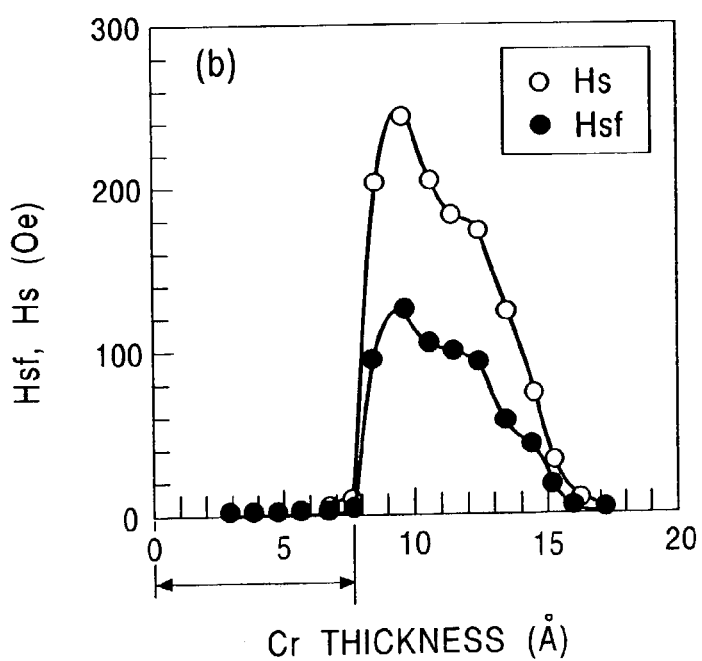
FIG. 21 is a graph showing the relation between the thickness of the Cr layer and the saturation magnetic field (Hs) and spin-flop magnetic field (Hsf) in the laminated layer having a NiFe/Cr/NiFe layer.

FIG. 21 shows an experimental result when Cr is selected for the nonmagnetic layer 27. As shown in FIG. 21, the saturation magnetic field (Hs) and spin-flop magnetic field (Hsf) are reduced to about zero (kOe) when the thickness of the Cr layer is larger than about 0 Å and about 8 Å or less. The relation between the thickness of the Rh layer and the saturation magnetic field (Hs) and spin-flop magnetic field (Hsf) remained almost unchanged by the heat-treatment when Cr is selected for the nonmagnetic layer 27.

The preferred thickness range on each outer side 27a of the nonmagnetic layer 27 is from more than about 0 Å and about 8 Å or less in the present invention when Cr is selected for the nonmagnetic layer 27 and the NiFe based alloy was formed at the interfaces where the ferromagnetic layer 28 and free magnetic layer 26 contact the nonmagnetic layer 27.

Figure 22:
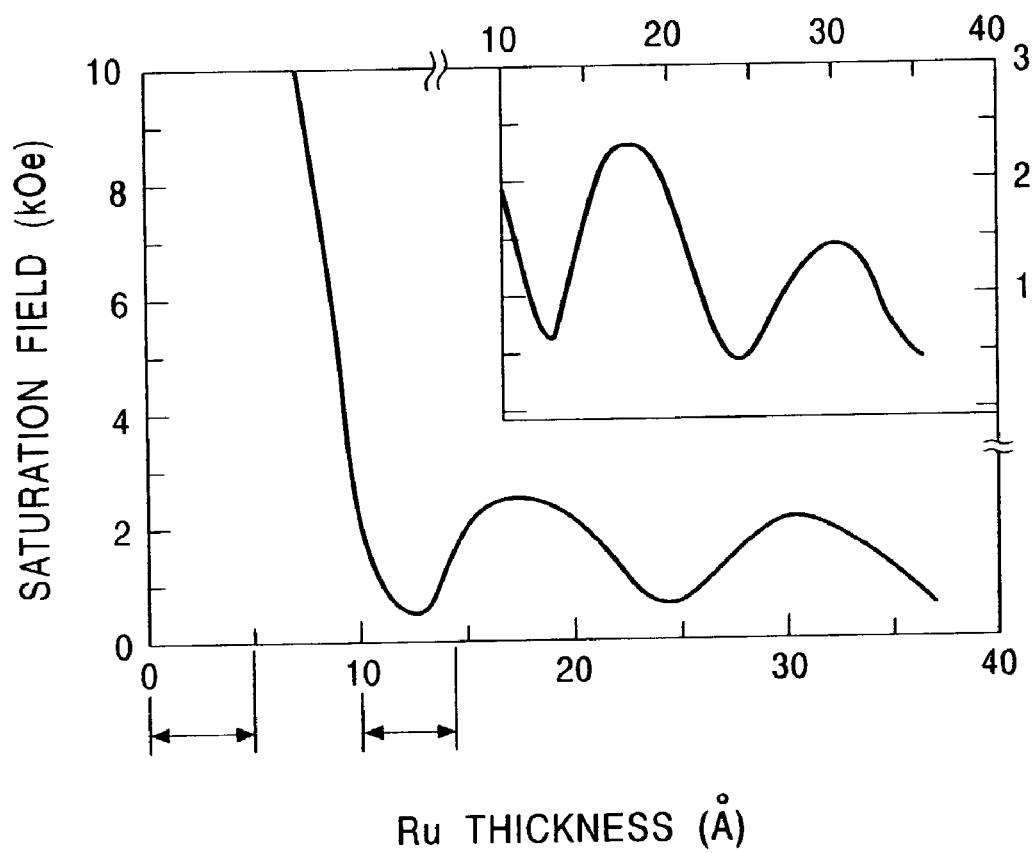
FIG. 22 is a graph showing the relation between the thickness of the Ru layer and the saturation magnetic field (Hs) and spin-flop magnetic field (Hsf) in the laminated layer having a NiFe/Ru/NiFe layer.

FIG. 22 shows the same graph as shown in FIG. 3b in Parkin, et al., "Oscillation in Exchange Coupling and Magnetoresistance in Metallic Superlattice structures: Co/Ru, Co/Cr and Fe/Cr," Phys. Rev. Letters, Vol/64, (1990), p2304–2307. Although a plurality of experimental values are plotted in this reference, these plots were omitted in the drawing. In the experiment reported in this reference, a Ru layer with a thickness of 100 Å was formed on a Si substrate, and a laminated layer comprising 20 Å of a Co layer and a Ru layer (X Å) was repeatedly deposited 20 times with an additional Ru layer with a thickness of 50 Å at the uppermost layer. The substrate temperature was 40° C. or 125° C. The relation between the thickness (X) of the Ru layer and the saturation magnetic field (Hs) was determined.

As shown in FIG. 22, although the magnitude of the saturation magnetic field (Hs) becomes very high at a Ru layer thickness of about 10 Å or less, the saturation magnetic field (Hs) is reduced to almost zero (kOe) at a Ru layer thickness of about 5 Å or less when heat-treatment is performed in a magnetic field.

The above experimental results indicate that the saturation magnetic field (Hs) is substantially reduced by heat treatment in a magnetic field when the Ru layer has a thickness of more than 0 Å and 5 Å or less, or 10 Å or more and 13 Å or less, thereby permitting a ferromagnetic coupling to be more effectively generated between the ferromagnetic layer 28 and each outer side of the free magnetic layer 26.

While a layer construction comprising Co layers with interposition of the Ru layer therebetween was used in the experiment as described above, the preferred thickness of each outer side 27a of the nonmagnetic layer 27 was determined to be more than about 0 Å and about 5 Å or less, or about 10 Å or more and about 13 Å or less, when Ru is selected for the nonmagnetic layer 27, and layers mainly comprising Co are formed at the interfaces where the ferromagnetic layer 28 and free magnetic layer 26 contact the nonmagnetic layer 27.

Figure 23:
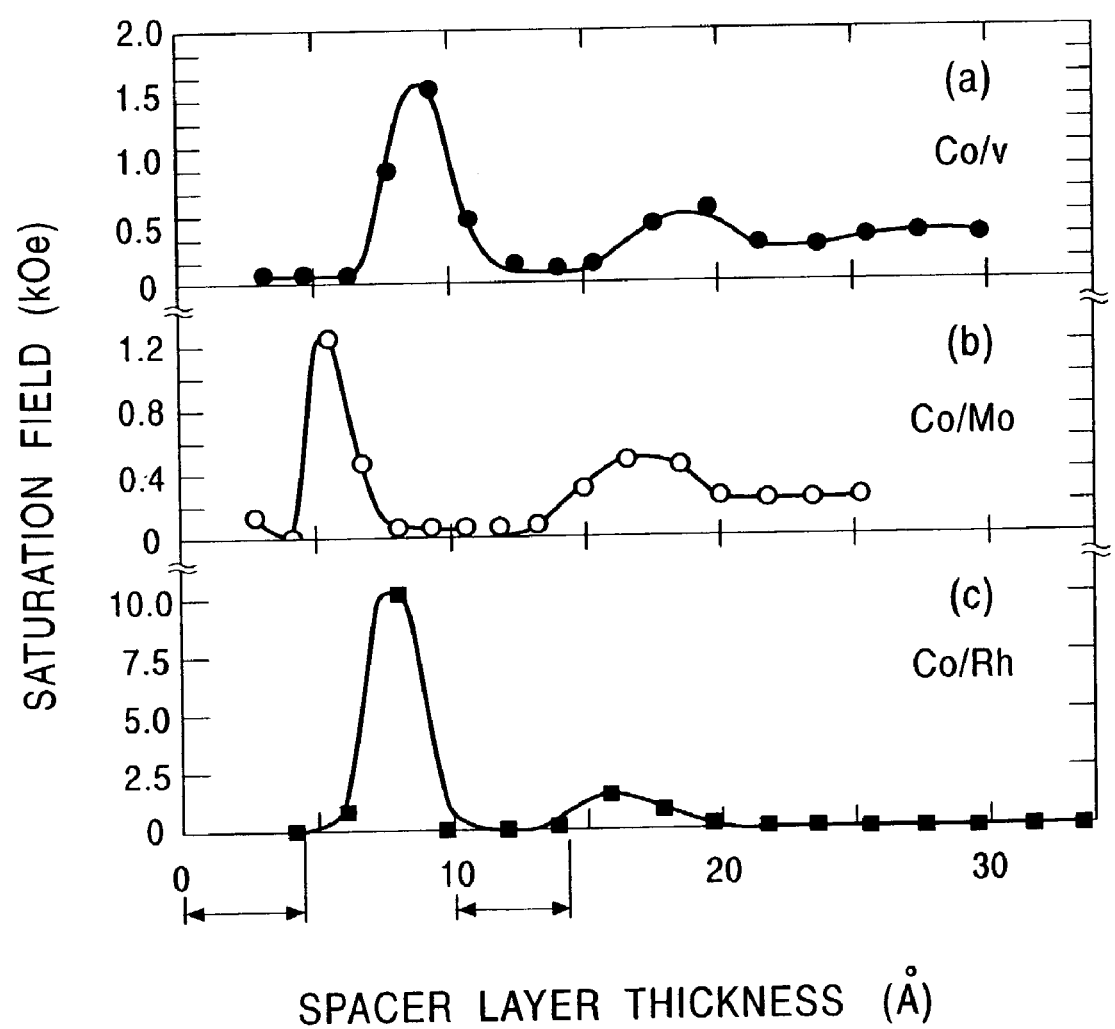
FIG. 23 is a graph showing the relation between the thickness of the V, Mo or Rh layer, and the saturation magnetic field (Hs) and spin-flop magnetic field (Hsf) in the laminated layer haying a Co/V/Co, Co/Mo/Co or Co/Rh/Co layer;.

FIG. 23 shows the same graph as described in FIG. 2 of a reported by S.S.P. Parkin, in "Systematic variation of the Strength and Oscillation Period of Indirect Magnetic Exchange Coupling through the 3d, 4d and 5d Transition Metals", Physical Review Letters, Vol. 67, No. 25 (1991), p3598–3601.

In this report, multiple layers comprising Co/V, Co/Mo and Co/Rh were repeatedly deposited, and the relation between the thickness of each V, MO or Rh layer and the saturation magnetic field (Hs) was investigated. No heat-treatment was applied in the experiment.

Although it is shown in FIGS. 23a and 23b that the saturation magnetic field is reduced to almost zero at a layer thickness of about 5 Å or less when V or Mo is selected for the nonmagnetic layer 27, antioxidative properties of V and Mo are so poor that the surface of the free magnetic layer 26 can hardly be prevented from being oxidized. Consequently, it is not preferable to select V and Mo for the nonmagnetic layer 27.

On the other hand, Rh, which like Ru, has excellent antioxidative property, is selected for the nonmagnetic layer 27 as shown in FIG. 23c. FIG. 23 shows that the saturation magnetic field (Hs) becomes very small when the thickness of the Rh layer is more than about 0 Å and about 4 Å or less, or about 10 Å or more and about 14 Å or less. Using a Rh layer thickness in this range permits effective generation of a ferromagnetic coupling between the ferromagnetic layer 28 and each outer side S of the free magnetic layer 26.

While a layer construction comprising Co layers with interposition of the Rh layer therebetween was used in the experiment, the preferable thickness of each side 27a of the nonmagnetic layer 27 was determined to be more than about 0 Å and about 4 Å or less, or about 10 Å or more and about 14 Å or less, when Rh is selected for the nonmagnetic layer 27, and Co layers or layers mainly comprising Co such as CoFe alloy layers are formed at the interfaces where the ferromagnetic layer 28 and free magnetic layer 26 contact the nonmagnetic layer 27.

Figure 24:
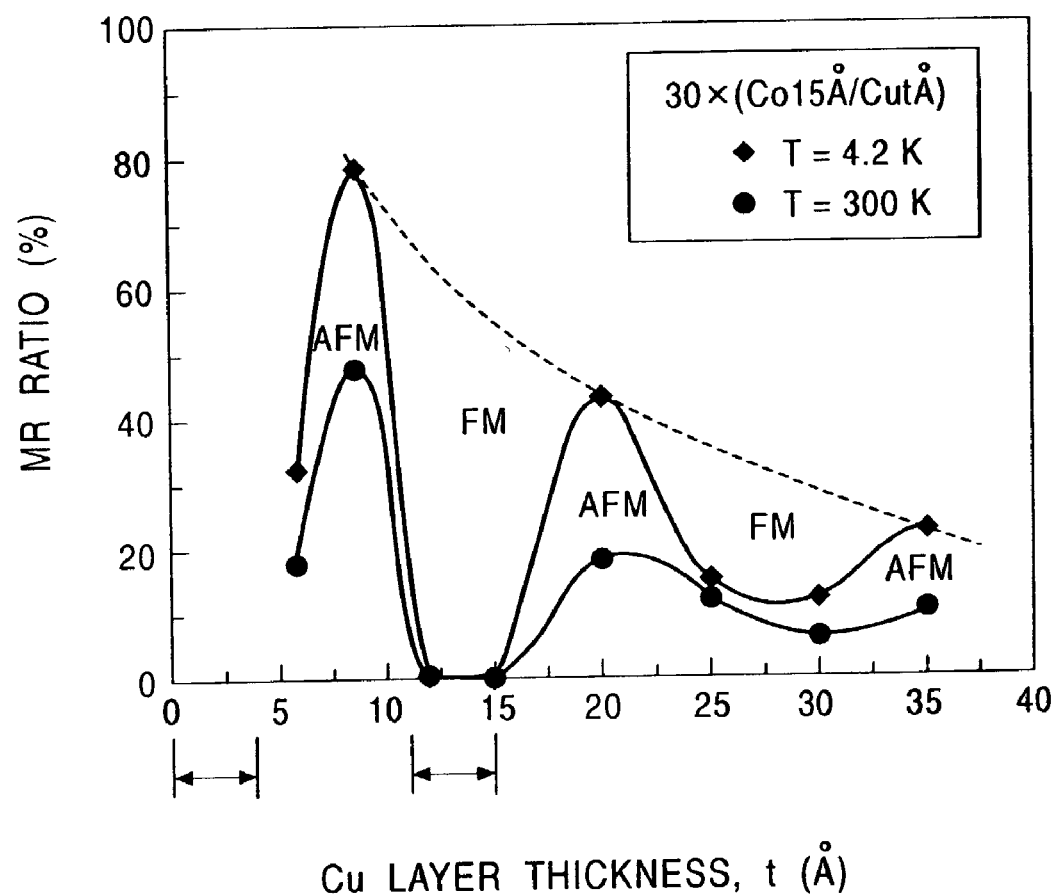
FIG. 24 is a graph showing the relation between the thickness of the Cu layer and rate of change of resistance in a laminated layer having a Co/Cu/Co or Co/Mo/Co layer.

FIG. 24 shows the same graph as described in FIG. 2 in the report by D. H. Mosca, F. Petroff, A Fert, P. A. Schroeder, W. P. Pratt Jr. And R. Laloce in "Oscillatory Interlayer Coupling and Giant Magnetoresistance in Co/Cu Multi-layer," Journal of Magnetism and magnetic Materials, Vol. 94, 1991, PL1 to L5. This reference presents results relating to multiple laminated layers comprising Co (15 Å)/Cu that The relation between the thickness of the Cu layer and the rate of change of resistance (MR ratio) is investigated. No heat-treatment is applied in the experiment.

FIG. 24 shows that the rate of change of resistance becomes very small when the thickness of the Cu layer is more than about 0 Å and about 4 Å or less, or about 11 Å or more and about 15 Å or less. The laminated layer used in the experiment in this report has a layer structure called as multilayer, i.e., a layer structure in which the rate of change of resistance is manifested by Co layers that face each other, with interposition of the Cu layer, and magnetized antiparallel to each other. The rate of change of resistance becomes very low when both Co layers facing each other with intervention of the Cu layer therebetween are magnetized in the same direction. Since the free magnetic layer 26 and ferromagnetic layer 28 facing each other with interposition of the nonmagnetic layer 27 has a structure in which these layers are magnetized in the same direction, the thickness of the Cu layer having a low rate of change of resistance was selected in the graph shown in FIG. 24.

As hitherto described, the rate of change of resistance becomes very small when the thickness of the Cu layer is more than about 0 Å and about 4 Å or less, or about 11 Å or more and about 15 Å or less. This shows that a ferromagnetic coupling may be effectively generated between the ferromagnetic layer 28 and each outer side S of the free magnetic layer 26 by using the Cu layer having a thickness in this range.

Since the Cu layer is inserted between the two Co layers, the preferable thickness of each outer side 27a of the nonmagnetic layer 27 was determined to be more than about 0 Å and about 4 Å or less, or about 11 Å or more and about 15 Å or less when Cu is selected for the nonmagnetic layer 27, and Co layers or layers mainly comprising Co such as a CoFe layer are formed at the interfaces where the ferromagnetic layer 28 and free magnetic layer 26 contact the nonmagnetic layer 27.

A ferromagnetic coupling may be effectively generated between each outer side S of the free magnetic layer 26 and ferromagnetic layer 28 with interposition of the nonmagnetic layer 27 therebetween, by properly selecting the material and thickness of the nonmagnetic layer 27 and the materials of the ferromagnetic layer 28 and free magnetic layer 26 as hitherto described. Magnetization of the free magnetic layer 26 may be also more adequately controlled.

Magnetization of the ferromagnetic layer 28 and magnetization of each outer side S of the free magnetic layer 26 may be made antiparallel with each other by selecting the range of the thickness of the nonmagnetic layer 27 where the saturation magnetic field (Hs) increases as described above. However, the range of the thickness of the nonmagnetic layer 27 where such antiparallel state appears was not selected in the present invention, because the thickness in such range makes the coercive force Hc of the free magnetic layer 26 very large, making the control of magnetization of the free magnetic layer 26 difficult. Accordingly, a range of the thickness of the nonmagnetic layer 27 that allows magnetization of the ferromagnetic layer 28 and magnetization of each outer side S of the free magnetic layer 26 to be aligned in the same direction was selected in the present invention, by generating a ferromagnetic coupling between the ferromagnetic layer 28 and each outer side S of the free magnetic layer 26, thereby permitting magnetization of the free magnetic layer 26 to be more properly controlled.

Since a portion of each outer side 27a of the nonmagnetic layer 27 is left behind in the present invention as shown in FIG. 1, each outer side S of the free magnetic layer 26 is not damaged by ion-milling. Thus, the magnetic characteristics of the free magnetic layer 26 are not degraded.

Each outer side 27a of the nonmagnetic layer 27 is left behind as a very thin layer as a result of low energy ion-milling. A thin nonmagnetic layer is naturally formed with a thickness preferably in the range of about 3 Å to about 20 Å, more preferably in the range of about 3 Å to about 10 Å, in the deposition step. Accordingly, the thickness of the nonmagnetic layer 27 can be sufficiently adjusted even by using low energy ion-milling. Since low energy ion-milling has a slower milling rate compared with high energy ion-milling, it is relatively easy to stop milling at a stage when the nonmagnetic layer 27 is shaved to a depth halfway from its original thickness.

Accordingly, a part of the nonmagnetic layer 27 is left behind on each outer side S of the free magnetic layer 26. Consequently, the free magnetic layer 26 is never shaved by ion-milling as in the prior art, thus preventing the deterioration of the magnetic characteristics due to the damage to the free magnetic layer 26 caused by ion-milling.

Ferromagnetic coupling can be effectively generated between each outer side S of the free magnetic layer 26 and ferromagnetic layer 28 in the present invention by forming the ferromagnetic layer 28 on each outer side S of the free magnetic layer 26 with interposition of the nonmagnetic layer 27. Accordingly, the magnetization of the free magnetic layer 26 can be properly controlled when the track width is narrowed to allow the manufacture of a magnetic sensing element capable of properly complying with the narrow track width.

It is also preferable in the present invention to form the ferromagnetic layer 28 with a thickness t6 in the range of about 2 Å or more and about 50 Å or less.

It is possible in the present invention to effectively generate a ferromagnetic coupling between the ferromagnetic layer 28 and each outer side S of the free magnetic layer 26 even when the ferromagnetic layer 28 is formed to be as thin as described above because each outer side S of the free magnetic layer 26 is not damaged by ion milling and thus so good magnetic characteristics are maintained. Forming the ferromagnetic layer 28 to be as thin as described above allows generation of a large exchange coupling magnetic field between the ferromagnetic layer 28 and second antiferromagnetic layer 29 while effectively preventing excessive static magnetic field from the inner side of the ferromagnetic layer 28 from affecting the central area C of the free magnetic layer 26, thereby preventing a decrease in the sensitivity of the free magnetic layer 26.

FIG. 2 shows a partial cross section of the structure of the magnetic sensing element in the second embodiment of the present invention.

In contrast to the magnetic sensing element shown in FIG. 1, the nonmagnetic layer 27 has the same thickness t7 on the central area C of the free magnetic layer as on each outer side S thereof in the magnetic sensing element shown in FIG. 2.

A ferromagnetic coupling can be effectively generated between each outer side S of the free magnetic layer 26 and ferromagnetic layer 28 when the thickness t7 of the nonmagnetic layer 27 falls within the range of thickness of the nonmagnetic layer 27 as described in FIGS. 18 to 24, thereby enabling magnetization of the free magnetic layer 26 to be tightly fixed in the same direction as magnetization of the ferromagnetic layer 28.

The magnetic sensing element shown in FIG. 2 may be formed in two ways. In one method, the nonmagnetic layer 27 is not subjected to ion-milling, and the thickness t7 of the nonmagnetic layer 27 immediately after deposition of the nonmagnetic layer 27 is adjusted to be about 3 Å or more and in the range as described in FIGS. 18 to 24.

The minimum range of the thickness t7 of the nonmagnetic layer 27 was determined to be about 3 Å because a thickness less than this cannot protect the free magnetic layer 26 from oxidation.

In the second method, the surface of the nonmagnetic layer 27 is uniformly milled after depositing from the underlayer 22 through the nonmagnetic layer as shown in FIG. 2, and the nonmagnetic layer 27 is deposited with a thickness of about 3 Å or more and about 20 Å or less, more preferably with a thickness of about 3 Å or more and about 10 Å or less. Then, the thickness t7 of the nonmagnetic layer 27 is adjusted in the range described in FIGS. 18 to 24. The manufacturing process will be described in detail below with reference to drawings.

Since the material and thickness of each layer is the same in FIG. 2 as those in FIG. 1 except the configuration of the nonmagnetic layer 27, FIG. 1 is to be referred to for the detailed description of layers other than the nonmagnetic layer.

FIG. 3 shows a partial cross section of the structure of the magnetic sensing element in the third embodiment of the present invention viewed from aside opposite a recording medium.

The construction of the layers of the magnetic sensing element in FIG. 3 is the same as those in FIG. 1, with the exception of the configuration of the electrode layer 30. The electrode layer 30 is formed from a position halfway on each inner area 29a of the second antiferromagnetic layer 29. The distance between the sideinner sides 30b of the electrode layer 30 in the track width direction (X-direction) is larger than the distance between the sideinner sides 29b of the second antiferromagnetic layer 29 in the track width direction (X-direction).

Alternatively, as shown in FIG. 3 by dotted lines, each inner side 30a of the electrode layer 30 may be formed by being elongated onto the central area 27b of the nonmagnetic layer 27 formed on the central area C of the free magnetic layer 26 to make the distance between the sideinner sides 30b of the electrode layers 30 smaller than the distance between the sideinner sides 29b of the second antiferromagnetic layers 29. The track width Tw is defined by the distance between the sideinner sides 30b of the electrode layers 30.

Since the material and thickness of each layer in the magnetic sensing element in FIG. 3 are the same as those in FIG. 3 with the exception of the configuration of the electrode layer 30, FIG. 1 should be referred to for a detailed description of other layers.

Figure 4:
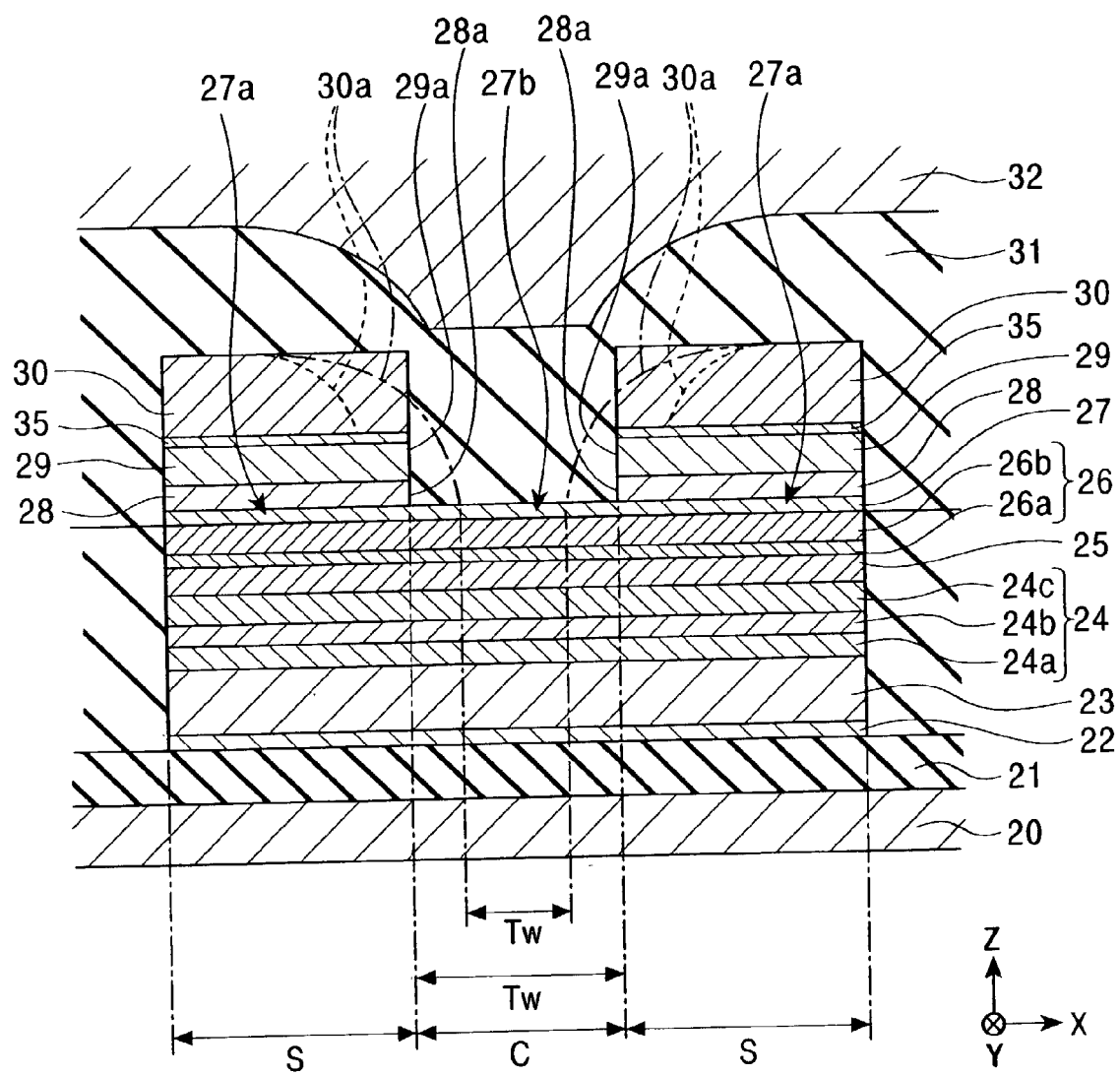
FIG. 4 is a partial cross section of a structure of the magnetic sensing element corresponding to a fourth embodiment of the present invention as viewed from aside opposite a recording medium.

FIG. 4 shows a partial cross section of the magnetic sensing element in the fourth embodiment of the present invention viewed from a side opposite a recording medium.

The magnetic sensing element in FIG. 4 comprises a lower gap layer 21, an underlayer 22, a first ferromagnetic layer 23, a pinned magnetic layer 24, a nonmagnetic material layer 25, a free magnetic layer 26 and nonmagnetic layer 27 laminated on a lower shield layer 20 from the bottom in this order. The material in each layer is the same is the same as those described in FIG. 1.

Ferromagnetic layers 28 are formed on each outer side 27a of the nonmagnetic layer 27. A second antiferromagnetic layer 29 is formed on each ferromagnetic layer 28 in the embodiment shown in FIG. 4. An electrode layer 30 is further formed on each second antiferromagnetic layer 29 with interposition of a protective layer (intermediate layer) 35 made of a material such as Ta. Each protective layer 35 is not always required.

The track width Tw is defined by the distance between the lower faces of the ferromagnetic layers 28 in the embodiment shown in FIG. 4. The preferable track width Tw is about 0.2 μm or less. As shown by dotted broken lines, each inner side 30a of the electrode layer 30 may be formed by being extended to the central area 27b of the nonmagnetic layer 27 formed on the central area C of the free magnetic layer 26. The distance between the lower faces of the electrode layers 30 in the track width direction (X-direction) is defined as the track width Tw. As shown by the dotted lines, the inner side 30a of the electrode layer 30 is formed from a position halfway of the intermediate layer 35. The distance between sideinner sides 30a of the electrode layers 30 may be larger than the distance between the sideinner sides of the second antiferromagnetic layers 29 and ferromagnetic layers 28.

A nonmagnetic layer 27 with a constant thickness is formed on the entire surface of the free magnetic layer 26 in the embodiment shown in FIG. 4. The thickness of the central area 27b of the nonmagnetic layer 27 may be smaller than the thickness of each outer side 27a.

The nonmagnetic layer 27 is preferably made offrom a material that is hardly oxidized by exposing to the atmosphere. The elements constituting the nonmagnetic layer 27 preferably do not degrade the ferromagnetic layer as a ferromagnetic material even when the elements are diffused in the free magnetic layer 26 and ferromagnetic layer 28. In particular, the nonmagnetic layer 27 preferably comprises at least one of Ru, Rh, Re, Pd, Os, Ir, Cr, Cu, Pt and Au.

The nonmagnetic layer 27 is preferably formed with a thickness larger than about 0 Å and about 6 Å or less in the present invention when the nonmagnetic layer 27 is made offrom Ru and comprises NiFe based alloy layers at the interfaces where the free magnetic layer 26 and ferromagnetic layer 28 contact the nonmagnetic layer 27.

The nonmagnetic layer 27 is preferably formed with a thickness larger than about 0 Å and about 8 Å or less in the present invention when the nonmagnetic layer 27 is made of Cr and comprises NiFe based alloy layers at the interfaces where the free magnetic layer 26 and ferromagnetic layer 28 contact the nonmagnetic layer 27.

The nonmagnetic layer 27 is preferably formed with a thickness larger than about 0 Å and about 2.5 Å or less in the present invention when the nonmagnetic layer 27 is made offrom Ir and comprises NiFe based alloy layers at the interfaces where the free magnetic layer 26 and ferromagnetic layer 28 contact the nonmagnetic layer 27.

The nonmagnetic layer 27 is preferably formed with a thickness larger than about 0 Å and about 3 Å or less in the present invention when the nonmagnetic layer 27 is made offrom Rh and comprises NiFe based alloy layers at the interfaces where the free magnetic layer 26 and ferromagnetic layer 28 contact the nonmagnetic layer 27.

The nonmagnetic layer 27 is preferably formed with a thickness larger than about 0 Å and about 5 Å or less, or about 10 Å or more and about 13 Å or less in the present invention when the nonmagnetic layer 27 is made offrom Ru and comprises layers mainly comprising Co at the interfaces where the free magnetic layer 26 and ferromagnetic layer 28 contact the nonmagnetic layer 27.

The nonmagnetic layer 27 is preferably formed with a thickness larger than about 0 Å and about 4 Å or less, or about 10 Å or more and about 14 Å or less, in the present invention, when the nonmagnetic layer 27 is made offrom Rh and comprises layers mainly comprising Co at the interfaces where the free magnetic layer 26 and ferromagnetic layer 28 contact the nonmagnetic layer 27.

The nonmagnetic layer 27 is preferably formed with a thickness of larger than about 0 Å and about 4 Å or less, or about 11 Å or more and about 15 Å or less, in the present invention when the nonmagnetic layer 27 is made offrom Cu and comprises layers mainly comprising Co at the interfaces where the free magnetic layer 26 and ferromagnetic layer 28 contact the nonmagnetic layer 27.

Particularly, the nonmagnetic layer 27 is formed such that the thickness of each outer side 27a of the nonmagnetic layer 27 is within the ranges of thickness of the nonmagnetic layer 27 as described above.

A ferromagnetic coupling may be effectively generated between each outer side S of the free magnetic layer 26 and ferromagnetic layer 28 when the nonmagnetic layer 27 is formed with a thickness within the range described above, and magnetization at each outer side S of the free magnetic layer 26 is tightly fixed in the same direction as magnetization of the ferromagnetic layer 28.

Magnetization of the ferromagnetic layer 28 is fixed in the track width direction (X-direction) by an exchange coupling magnetic field generated between the ferromagnetic layer 28 and second antiferromagnetic layer 29, and magnetization of each outer side S of the free magnetic layer 26 is also fixed in the track width direction (X-direction) by an ferromagnetic coupling between the free magnetic layer and ferromagnetic layer 28. The central area C of the free magnetic layer 26 is set weakly into a single magnetic domain state to an extent capable of magnetic inversion against an external magnetic field.

In contrast to the embodiments shown in FIGS. 1 to 3, the inner side 29a of the second antiferromagnetic layer 29 and the inner side 28a of the ferromagnetic layer 28 are formed by being extended in a direction almost perpendicular to the surface of the lower shield layer 20 (in the Z-direction). Such difference is caused by a difference in the manufacturing process as will be described below.

However, the inner side 29a of the antiferromagnetic layer 29 and the inner side 28a of the ferromagnetic layer 28 may be formed as an inclined face or a curved face by which the distance between sideinner sides of each layer is gradually extended from the bottom to the top.

The structures of the magnetic sensing elements in other embodiments manufactured by the same process as in the embodiment shown in FIG. 4 will be described hereinafter.

Figure 5:
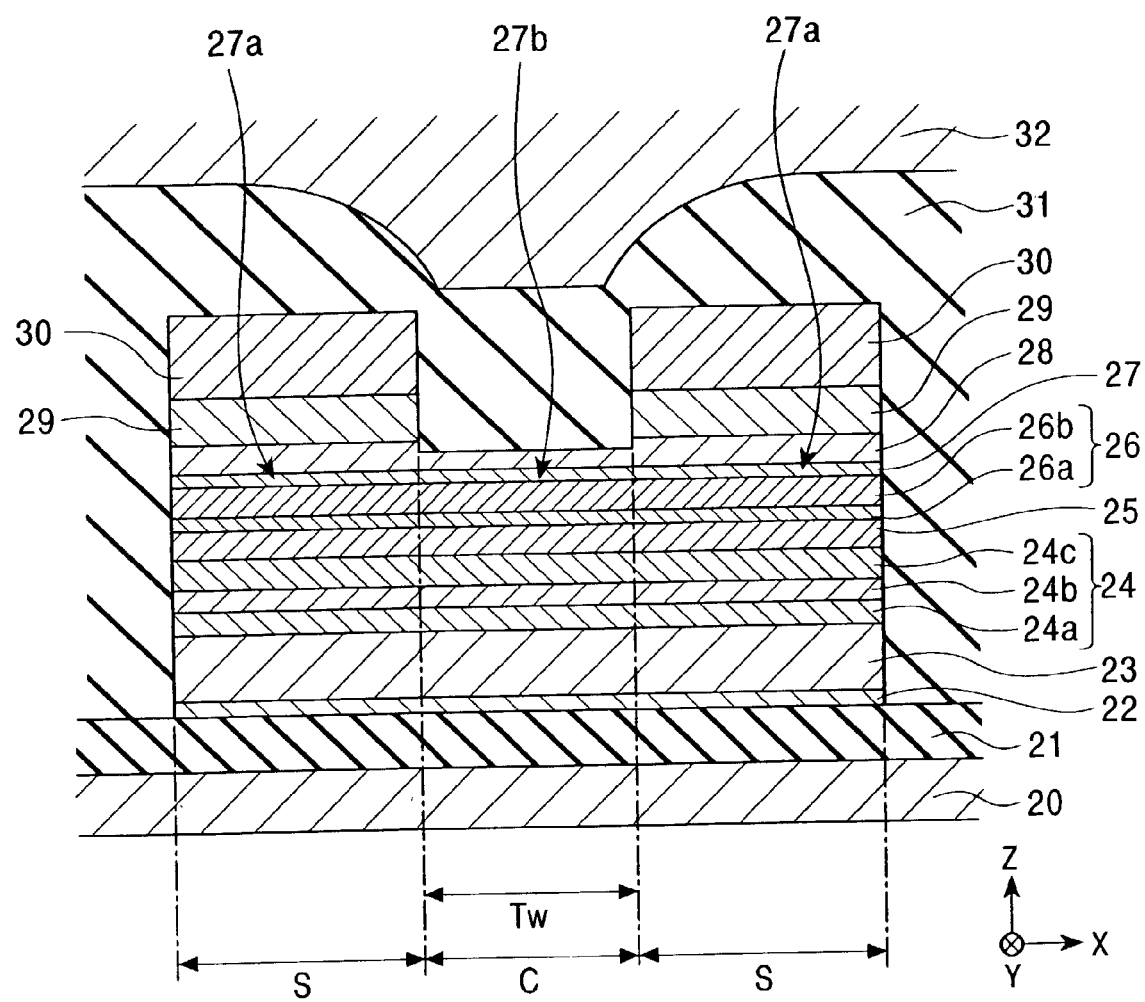
FIG. 5 is a partial cross section of a structure of the magnetic sensing element corresponding to a fifth embodiment of the present invention as viewed from aside opposite a recording medium.

FIG. 5 shows a partial cross section of the structure of the magnetic sensing element corresponding to the fifth embodiment of the present invention viewed from aside oppositea recording medium.

In contrast to the magnetic sensing element shown in FIG. 4, the magnetic sensing element shown in FIG. 5 also comprises a ferromagnetic layer 28 on the central area 27b of the nonmagnetic layer 27.

However, since no second antiferromagnetic layer 29 is formed on the ferromagnetic layer 28 formed on the central area 27b of the nonmagnetic layer 27, magnetization of the ferromagnetic layer 28 formed in the central area C is not fixed, and magnetization of the ferromagnetic layer 28 in the central area C is weakly put into a single magnetic domain state to an extent capable of magnetic inversion against an external magnetic field.

A ferromagnetic coupling is generated between each outer side S of the ferromagnetic layer 28 and each outer side S of the free magnetic layer 26 with interposition of each outer side 27a of the nonmagnetic layer 27 in this embodiment shown in FIG. 5, as in the embodiment shown in FIG. 4, and magnetization of each outer side S of the free magnetic layer 26 is tightly fixed in the direction of magnetization of each outer side S of the ferromagnetic layer 28.

Magnetization of the central area C of the free magnetic layer 26 is weakly put into a single magnetic domain state to an extent capable of magnetic inversion against an external magnetic field in the same direction as magnetization of the central area C of the ferromagnetic layer 28. Recorded signals are regenerated by concomitant magnetic inversion of the free magnetic layer 26 and the central area C of the ferromagnetic layer 28 due to the external magnetic field from the Y-direction.

The thickness of the ferromagnetic layer 28 formed in the central area C may be the same as, or smaller than, the thickness of the ferromagnetic layer 28 formed in each outer side S.

FIG. 4 is to be referred to with respect to the material and thickness of the nonmagnetic layer 27 in FIG. 5 since they are the same as those in FIG. 4.

Figure 6:
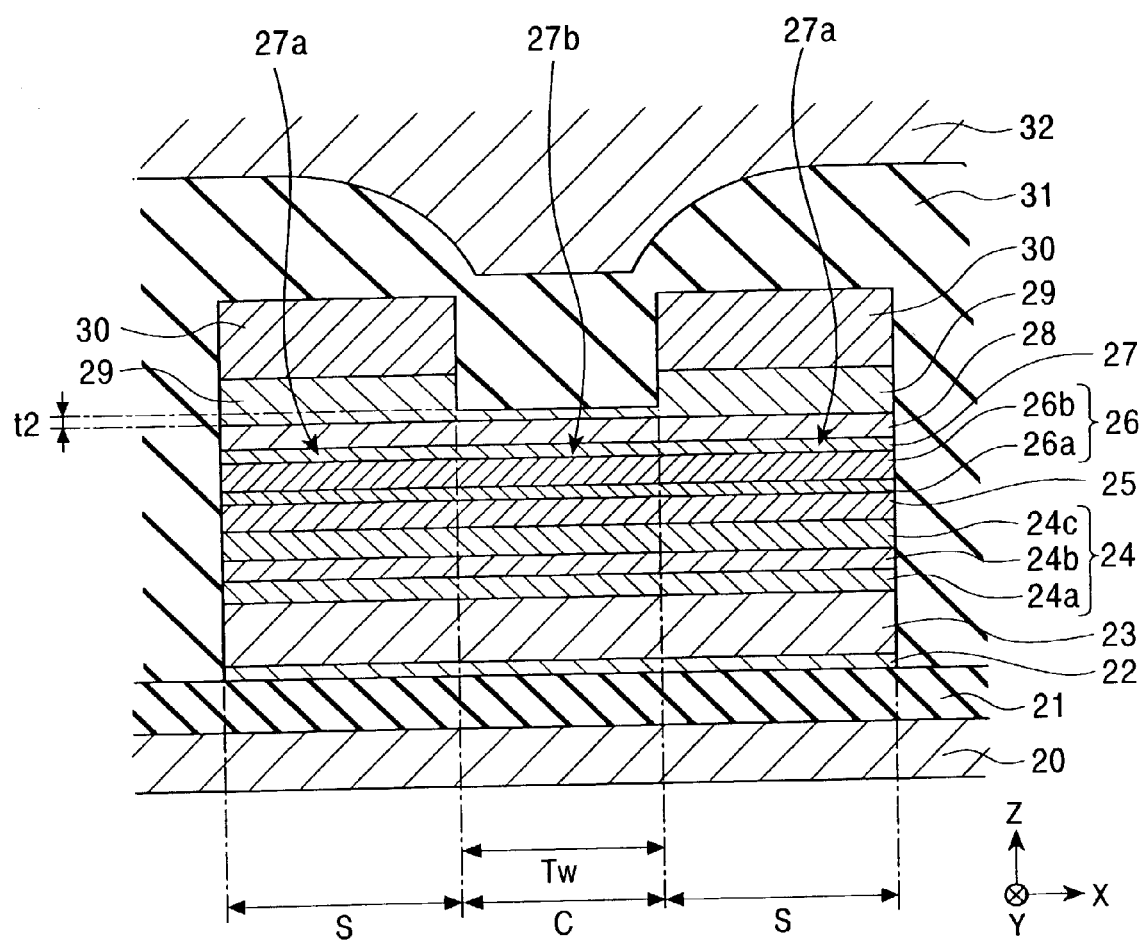
FIG. 6 is a partial cross section of a structure of the magnetic sensing element corresponding to a sixth embodiment of the present invention asviewed from aside opposite a recording medium.

FIG. 6 is a partial cross section of the structure of the structure of the magnetic sensing element in a sixth embodiment of the present invention as viewed from aside opposite a recording medium.

As shown in FIG. 6, the ferromagnetic layer 28 is formed with a uniform thickness on the entire surface of the nonmagnetic layer 27. A thin second antiferromagnetic layer 29 is formed on the central area 27b of the nonmagnetic layer 27 with interposition of the ferromagnetic layer 28.

The thickness t2 of the second antiferromagnetic layer 29 formed in the central area C may be smaller than the thickness of the second antiferromagnetic layer 29 formed in each outer side S of the track width direction.

By forming the second antiferromagnetic layer 29 with a small thickness t2, no exchange coupling magnetic field is generated, or only a small magnitude of the exchange coupling magnetic field is generated, if any, between the central area C of the second antiferromagnetic layer 29 and the central area C of the ferromagnetic layer 28. Consequently, the magnetization in the central area C of the ferromagnetic layer 28 is not tightly fixed in the track width direction (X-direction).

The thickness t2 in the central area C of the remaining second antiferromagnetic layer 29 is about 50 Å or less, preferably about 30 Å or less. A thickness larger than that in the range above will generate a large exchange coupling magnetic field between the central area C of the second antiferromagnetic layer 29 and central area C of the ferromagnetic layer 28. Therefore, the magnetization of the central area C of the ferromagnetic layer 28 is tightly fixed in the track width direction (X-direction). Consequently, magnetization of the central area C of the free magnetic layer 26 is likely to be tightly fixed in the track width direction (X-direction) by a ferromagnetic coupling between the central area C of the ferromagnetic layer 28 and central area C of the free magnetic layer 26, and regenerative sensitivity of the magnetic sensing element may be decreased.

A ferromagnetic coupling is generated between each outer side S of the ferromagnetic layer 28 and each aide area S of the free magnetic layer 26 with interposition of the nonmagnetic layer 27 as in the embodiments shown in FIGS. 4 and 5. Therefore, magnetization in each outer side S of the free magnetic layer 26 is tightly fixed in the same direction as the direction of magnetization in each outer side S of the ferromagnetic layer 28.

FIG. 4 should be referred to with respect to the material and thickness of the nonmagnetic layer 27 in FIG. 6 since they are the same as those in FIG. 4.

The magnetic sensing elements shown in FIGS. 4 to 6 are formed by shaving the central area C of each magnetic sensing element by ion-milling or reactive ion-etching (RIE). The configurations in FIGS. 4 to 6 differ by the extent of shaving of the central area C of the magnetic sensing element.

Since the nonmagnetic layer 27 is formed on each outer side S of the free magnetic layer 26 with a ferromagnetic layer 28 formed thereon in each magnetic sensing element shown in FIGS. 4 to 6, ion milling does not damage each outer side S of the free magnetic layer 26. Since the nonmagnetic layer 27 formed from Ru and the like is very thin (preferably about 3 Å or more and about 20 Å or less, more preferably about 3 Å or more and about 10 Å or less), low energy ion-milling can be used when adjusting the thickness of the nonmagnetic layer 27 by ion-milling. Therefore, the milling process can be readily controlled to leave a part of the nonmagnetic layer 27 behind as shown in FIGS. 4 to 6 in which a part of the nonmagnetic layer 27 is readily and properly left behind on each outer side S of the free magnetic layer 26. As will be describe din the manufacturing process hereinafter, ion-milling may not be applied to the nonmagnetic layer 27 in some cases.

The magnetic sensing elements shown in FIGS. 1 to 3 are manufactured by the same process in the present invention. The magnetic sensing elements shown in FIGS. 4 to 6 have different structures from those shown in FIGS. 1 to 3. Although the manufacturing processes in FIGS. 1 to 3 are different from those in FIGS. 4 to 6, the common features of all the structures shown in FIGS. 1 to 6 are that the nonmagnetic layer 27 is interposed between each outer side S of the free magnetic layer 26 and ferromagnetic layer 28, and a ferromagnetic coupling is generated between each outer side S of the free magnetic layer and ferromagnetic layer 28.

The free magnetic layer 26 in all the magnetic sensing elements shown in FIGS. 1 to 6 has a bilayer structure, and the layer in contact with the nonmagnetic layer 25 serves as a diffusion preventive layer 26a made of a CoFe alloy or Co. The magnetic material layer 26b is formed from a magnetic material such as a NiFe alloy.

The free magnetic layer 26 may include a monolayer of a magnetic material. A NiFe alloy, a CoFeNi alloy, Co or a CoNi alloy may be selected as the magnetic material. The CoFeNi alloy is preferably used for forming the free magnetic layer 26.

FIG. 7 is a partially magnified cross section mainly illustrating the portion around the free magnetic layer 26.

The free magnetic layer 26 shown in FIG. 7 comprises a three layer structure. All the layers represented by the reference numerals 36, 37 and 38 constituting the free magnetic layer 26 are made of magnetic materials. The magnetic material layer 36 serves as a diffusion preventive layer for preventing the diffusion of elements between the magnetic material layer 36 and nonmagnetic layer 25. The magnetic material layer 36 is formed from a CoFe alloy or Co.

The magnetic material layer 38 is in contact with the nonmagnetic layer 27. The magnetic material layer 38 is preferably formed from a CoFe alloy, which enhances the ferromagnetic coupling generated between the ferromagnetic layer 28 and the magnetic material layer 38, which face each other with interposition of the nonmagnetic layer 27.

Examples of the combination of materials of the three layer structure shown in FIG. 7 include magnetic material layer 36 (CoFe alloy)/material layer 37 (NiFe alloy)/material layer 38 (CoFe alloy).

The free magnetic layer 26 comprising a pure magnetic material is preferably formed with a thickness of about 30 Å to about 40 Å. The composition of the CoFe alloy used for the free magnetic layer 26 includes, for example, about 90 at % of Co and about 10 at % of Fe.

FIG. 8 shows a partially magnified cross section of the free magnetic layer 26 in another embodiment. The free magnetic layer 26 shown in FIG. 8 represents a so-called laminated ferrimagnetic structure. This structure allows reduction of an effective magnetic thickness of the free magnetic layer 26 without reducing the physical thickness of the free magnetic layer 26 too much. This structure also improves the sensitivity against an external magnetic field to be improved.

The layers denoted by the reference numerals 39 and 41 represent magnetic layers, and the layer denoted by the reference numeral 40 represents a nonmagnetic intermediate layer. The magnetic layers 39 and 41 are formed from magnetic materials such as a NiFe alloy, a CoFeNi alloy, Co and a CoNi alloy. The magnetic layer 39 and/or magnetic layer 41 is preferably formed from the CoFeNi alloy among the magnetic materials. The preferable composition includes about 9 at % or more and about 17 at % or less of Fe and about 0.5 at % or more and about 10 at % or less of Ni, the balance being Co.

The composition and construction as described above permit an increase in antiparallel coupling magnetic field due to a RKKY interaction acting between the magnetic layers 39 and 41. For example, the spin-flop magnetic field (Hsf) may be increased to about 293 kA/m, thereby enabling the magnetization of the magnetic layer 39 and magnetization of the magnetic layer 41 to be effectively set antiparallel to each other. In addition, magnetostriction of the free magnetic layer 26 may fall within a range from about $-3\times10^{-6}$ to about $3\times10^{-6}$ while reducing the coercive force to about 790 A/m or less when the composition ratio is within the range as described above.

Furthermore, the soft magnetic characteristics of the free magnetic layer 26 can be improved. In addition, a decrease in the amount of change of resistance ($\Delta R$) and the rate of change of resistance ($\Delta R/R$) due to the diffusion of Ni between the nonmagnetic layer 25 and free magnetic layer 26 can also be prevented.

The nonmagnetic intermediate layer 40 is preferably formed from at least one of Ru, Rh, Ir, Cr, Re and Cu.

For example, the magnetic layer 39 is formed with a thickness of about 35 Å, the nonmagnetic intermediate layer 40 is formed with a thickness of about 9 Å, and the magnetic layer 41 is formed with a thickness of about 15 Å.

A diffusion protective layer formed from a CoFe alloy or Co may be provided between the magnetic layer 39 and nonmagnetic layer 25. In addition, a magnetic layer formed from a CoFe alloy may be interposed between the magnetic layer 41 and nonmagnetic layer 27.

The CoFeNi alloy preferably comprises about 7 at % or more and about 15% or less, about 5 at % or more and about 15 at % or less of Ni, the balance being Co when the magnetic layer 39 and/or magnetic layer 41 is formed from the CoFeNi alloy.

The composition above permits the exchange coupling magnetic field generated between the magnetic layers 39 and 41 by a RKKY interaction to be enhanced. In particular, the spin-flop magnetic field (Hsf) may be increased to about 293 kA/m, thereby enabling the magnetization of the magnetic layers 39 and 41 to be properly set antiparallel to each other.

The composition range above also allows magnetostriction of the free magnetic layer 26 to fall within a range of about $-3\times10^{-6}$ to about $3\times10^{-6}$, and the coercive force to be decreased to about 790 A/m or less while improving the soft magnetic properties of the free magnetic layer 26.

When each magnetic sensing element shown in FIGS. 4 to 6 is constructed using the free magnetic layer 26 having the construction shown in FIG. 8, the nonmagnetic intermediate layer 40 may be exposed in the central area C by drilling the central area C to a depth sufficient to remove the nonmagnetic layer 27, and then completely removing the magnetic layer 41 exposed in the central area 41. A portion of the nonmagnetic layer 40 may be removed. As a result, the central area C of the free magnetic layer 26 has no laminated ferrimagnetic structure, and functions as an ordinary free magnetic layer that includes only the magnetic layer 39. Each outer side S of the free magnetic layer 26 functions, on the other hand, as a laminated ferrimagnetic structure to enhance a unidirectional exchange bias magnetic field, thereby enabling magnetization in each outer side S of the free magnetic layer 26 to be fixed in the track width direction (X-direction) while suppressing side-reading.

Figure 9:
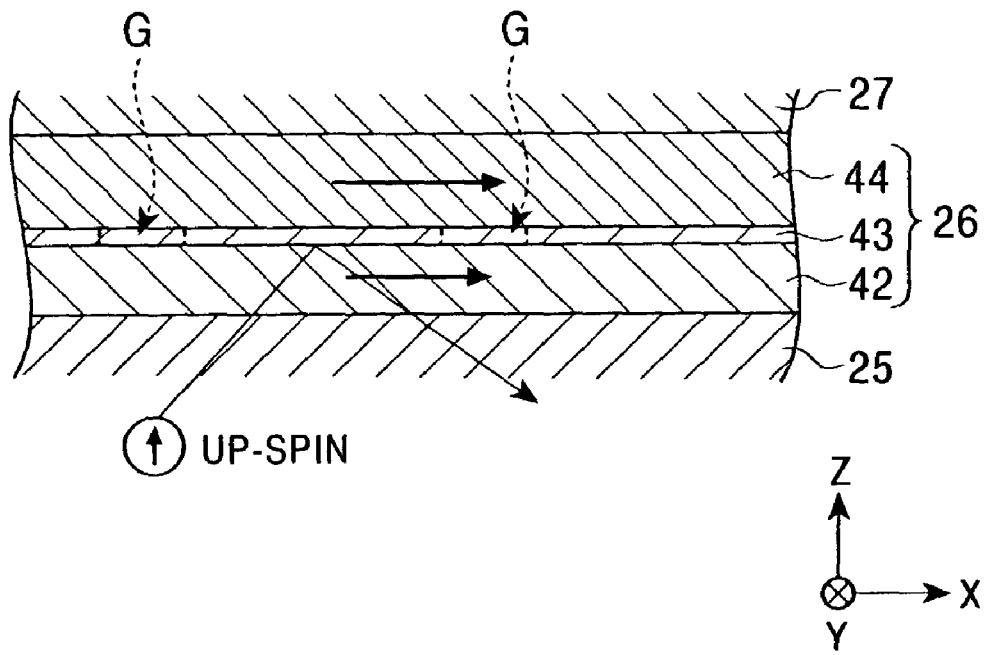
FIG. 9 is a partially magnified cross section of a structure of the free magnetic layer in a different embodiment of the present invention as viewed from aside opposite a recording medium.

FIG. 9 is a partially magnified cross section showing another aspect of the free magnetic layer 26 of the present invention. The free magnetic layer 26 shown in FIG. 9 comprises a specular layer 43 formed between magnetic material layers 42 and 44. Defects (pin-holes) G may be formed in the specular layer 43 as shown in FIG. 9. The magnetic material layers 42 and 44 with interposition of the specular layer 43 are magnetized in the same direction (the direction indicated by arrows) as in the embodiment shown in FIG. 9.

Magnetic materials such as a NiFe alloy, a CoFe alloy, a CoFeNi alloy, Co and CoNi alloy are used for the magnetic material layers 42 and 44.

Conduction electrons (for example up-spin electrons) arriving at the specular layer 43 undergo specular reflection while maintaining their spin state (energy and quantum state) by forming the specular layer 43 in the free magnetic layer 26. The up-spin conduction electrons after specular reflection change their travel direction, and pass through the free magnetic layer.

Consequently, it becomes possible to extend the mean free path $\lambda+$ of the up-spin conduction electrons in the present invention by providing the specular layer 43, or to increase the difference between the mean free path $\lambda+$ of the up-spin conduction electrons and mean free path $\lambda-$ of the down-spin conduction electrons, which allows the rate of change of resistance ($\Delta R/R$) to be improved while also improving the regenerative output.

For depositing the specular layer 43, layers up to the magnetic material layer 42 are deposited followed by oxidation of the surface of the magnetic material layer 42. The oxidized surface can serve as the specular layer 43. A magnetic material layer 44 is deposited on the specular layer 43.

Examples of the material of the specular layer include oxides such as Fe—O, Ni—O, Co—O, Co—Fe—O, Co—Fe—Ni—O, Al—O, Al-Q-O (where Q is at least one element selected from B, Si, N, Ti, V, Cr, Mn, Fe, Co and Ni) and R—O (where R is at least one of element selected from Cu, Ti, V, Cr, Zr, Nb, Mo, Hf, Ta and W); nitrides such as Al—N, Al-Q'-N (where Q' is at least one element selected from B, Si, O, Ti, V, Cr, Mn, Fe, Co and Ni) and R'—N (where R' is at least one of element selected from Ti, V, Cr, Zr, Nb, Mo, Hf, Ta and W); and a semimetallic whistler alloy.

Figure 10:
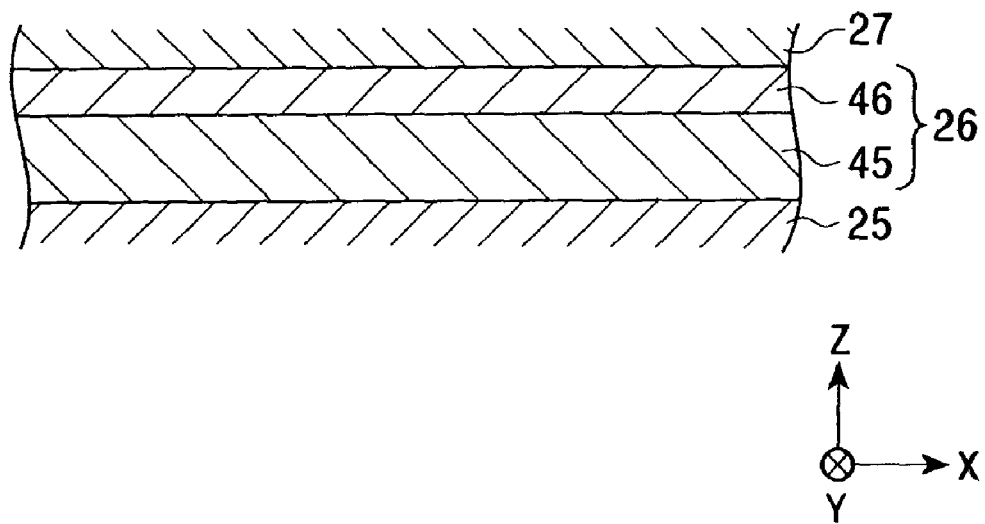
FIG. 10 is a partially magnified cross section of the free magnetic layer in another embodiment of the present invention as viewed from aside opposite a recording medium.

FIG. 10 is a partially magnified cross section of a different aspect of the free magnetic layer 26 in this embodiment.

A backed layer 46 is formed on a magnetic layer 45 in the free magnetic layer 26 shown in FIG. 10. For example, the backed layer 46 is formed from Cu and Ta. The magnetic layer 45 is formed from magnetic materials such as a NiFe alloy, a CoFeNi alloy, Co and a CoNi alloy.

The mean free path of up-spin conduction electrons that contribute to the magnetoresistive effect is extended by providing the backed layer, and a large rate of change of resistance is obtained by a so-called spin filter effect in the spin-valve type magnetic element, making the magnetic element suitable for high density recording.

Figure 11:
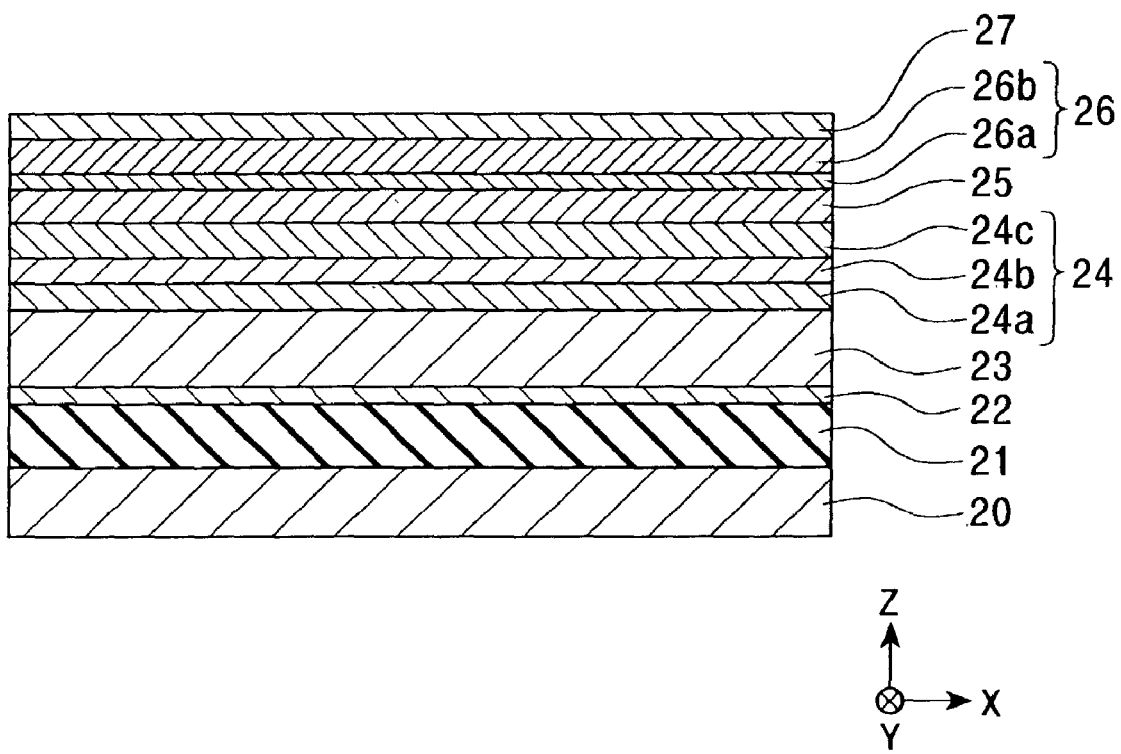
FIG. 11 shows a first step of the process for manufacturing the magnetic sensing element in the embodiment shown in FIG. 1.
Figure 12:
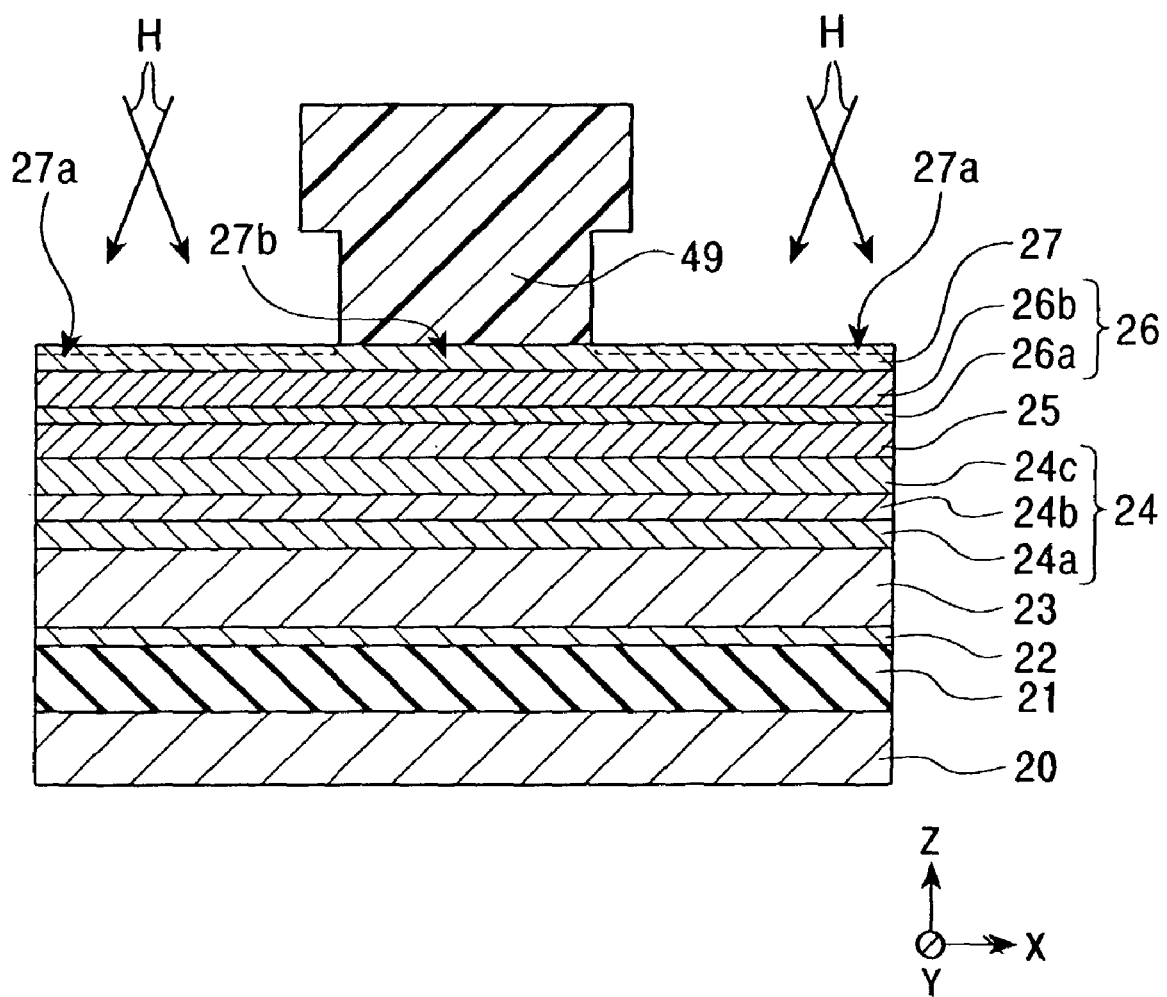
FIG. 12 shows a second step of the process for manufacturing the magnetic sensing element in the embodiment shown in FIG. 1.
Figure 13:
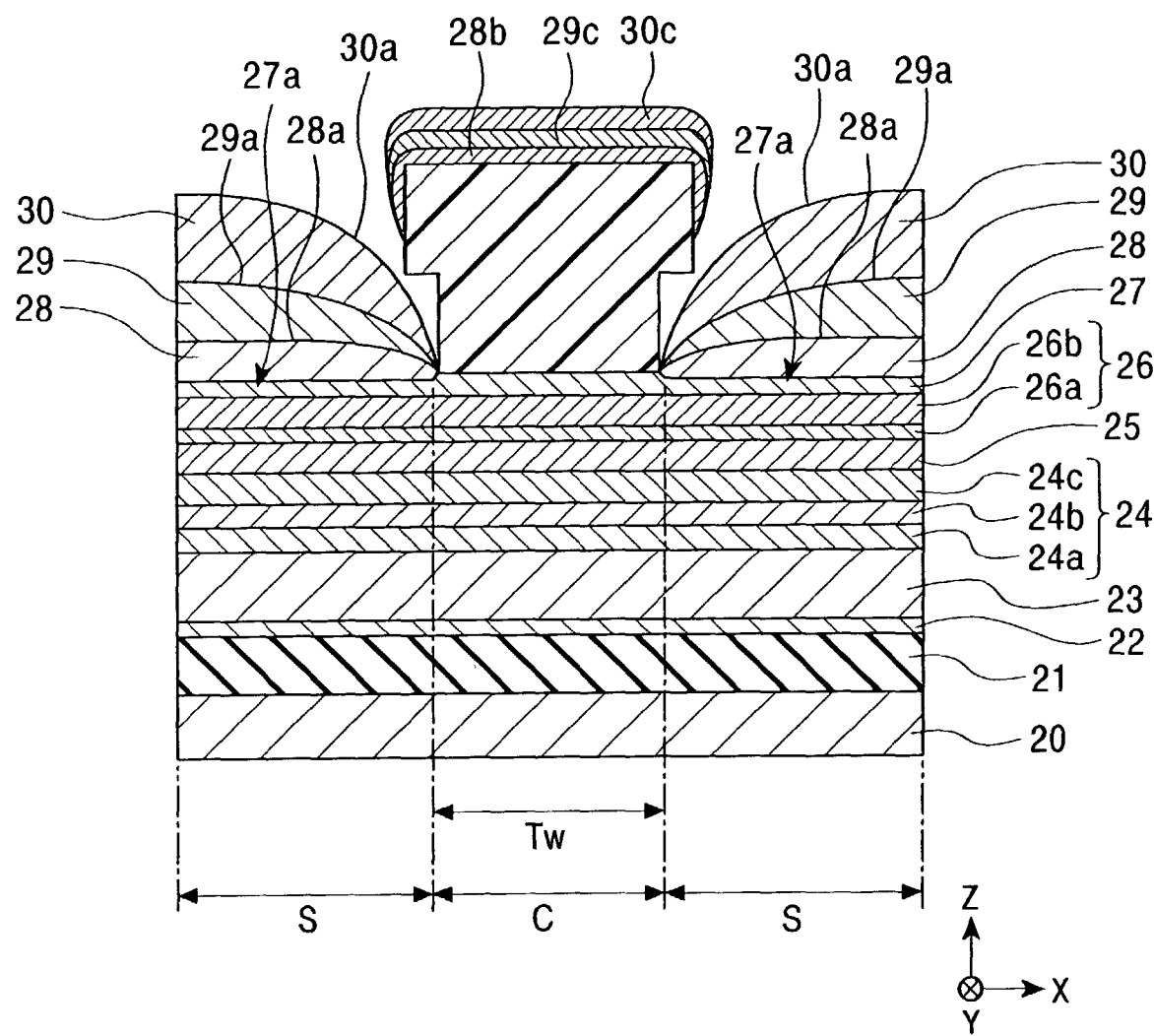
FIG. 13 shows a third step of the process for manufacturing the magnetic sensing element in the embodiment shown in FIG. 1.

FIGS. 11 to 13 shows the process for manufacturing the magnetic sensing element shown in FIG. 1. A partial cross section viewed from a side oppositea recording medium is shown in each step shown in FIGS. 11 to 13.

In the step shown in FIG. 11, a lower gap layer 21 comprising an insulation material such as $Al_2O_3$ is formed on a lower shield layer 20 comprising, for example, a magnetic material such as a NiFe based alloy, and an underlayer 22, a first antiferromagnetic layer 23. A pinned magnetic layer 24, a nonmagnetic material layer 25, a free magnetic layer 26 and a nonmagnetic layer 27 are continuously formed on the lower gap layer 21. These layers are deposited by techniques such as sputtering or vapor deposition. The pinned magnetic layer 24 shown in FIG. 11 takes a laminated ferrimagnetic structure comprising, for example, magnetic layers 24a and 24c formed from a CoFe alloy, and a nonmagnetic intermediate layer 24b made of Ru that is interposed between the magnetic layers 24a and 24c. The free magnetic layer 26 takes a laminated structure comprising a diffusion preventive layer 26a made of a CoFe alloy and a magnetic material layer 26b made of a NiFe alloy.

It is preferable in the present invention to form the first antiferromagnetic layer 23 with a PtMn alloy, X—Mn alloy (where X is at least one of Pd, Ir, Rh, Ru, Os, Ni and Fe), or a Pt—Mn—X' alloy (where X' is at least one of PD, Ir, Rh, Ru, Au, Ag, Os, Cr, Ni, Ar, Ne, Xe and Kr).

The PtMn alloy and the alloy represented by the formula X—Mn preferably comprises Pt or X in the range of about 37 to about 63 at %. The PtMn alloy and the alloy represented by the formula X—Mn preferably comprises Pt or X in the range of 47 to 57 at %.

Preferably, the alloy represented by the formula Pt—Mn—X', comprises X'+Pt in the range of from about 37 to about 63 at %. More preferably, the alloy represented by the formula Pt—Mn—X' comprises X'+Pt in the range of from about 47 to about 57 at %. Further preferably, the alloy represented by the formula Pt—Mn—X' comprises X' in the range of from about 0.2 to about 10 at %. However, X' is preferably in the range of about 0.2 to about 40 at % when X' is at least one element of Pd, Ir, Rh, Ru, Os, Ni and Fe.

It is preferable in the present invention to form the first antiferromagnetic layer 23 with a thickness of about 80 Å or more and about 300 Å or less. Forming the first antiferromagnetic layer 23 with a thickness in the range described above permits a large exchange coupling magnetic field, particularly about 48 kA/m or more, or more than about 64 kA/m, to be generated between the first antiferromagnetic layer 23 and pinned magnetic layer 24.

The free magnetic layer 26 can be effectively from being oxidized even when the laminated body shown in FIG. 11 is exposed to the atmosphere by forming the nonmagnetic layer 27 on the free magnetic layer 26 in the step used in FIG. 11.

The nonmagnetic layer 27 should form a dense layer that is hardly oxidized by exposure to the atmosphere. The material must also not degrade the characteristics of the ferromagnetic layer even when the elements constituting the nonmagnetic layer 27 diffuse into the free magnetic layer 26 by thermal diffusion or the like.

Preferably, the nonmagnetic layer is made offrom a precious metal comprising at least one of Ru, Re, Pd, Os, Ir, Rh, Cr, Cu, Pt and Au.

The nonmagnetic layer 27 comprising the precious metal such as Ru forms a dense layer that is hardly oxidized by exposing to the atmosphere. Accordingly, the nonmagnetic layer 27 having a small thickness is enough for effectively prevent the free magnetic layer 26 from being oxidized by exposure to the atmosphere.

Preferably, the nonmagnetic layer 27 is formed with a thickness of about 3 Å or more and about 20 Å or less, more preferably about 3 Å or more and about 10 Å or less. The thickness of the nonmagnetic layer 27 as described above is sufficient to prevent the free magnetic layer 26 from being oxidized by exposure to the atmosphere.

In the present invention, the nonmagnetic layer 27 is formed from a precious metal such as Ru with a thickness of as thin as about 3 Å to about 20 Å, more preferably about 3 Å to about 10 Å. Forming the nonmagnetic layer 27 with such a thickness as described above allows the use of low energy ion-milling in the step shown in FIG. 12, thus enhancing milling control. The nonmagnetic elements constituting the nonmagnetic layer 27 never degrade the magnetic characteristics of the free magnetic layer 26 and ferromagnetic layer 28, even by thermal diffusion of these elements into the free magnetic layer 26 and ferromagnetic layer 28. The reason above will be described in detail in the step used in FIG. 12.

A laminate of each layer up to the nonmagnetic layer 27 from the lower shield layer 20 as shown in FIG. 11 is annealed in a first magnetic field. The laminate is heat-treated in the first magnetic field while applying the first magnetic field in a direction (Y-direction) perpendicular to the track width Tw direction (X-direction). An exchange coupling magnetic field is generated between the first antiferromagnetic layer 23 and magnetic layer 24a constituting the pinned magnetic layer 24 to fix the magnetization of the magnetic layer 24a in the Y-direction. Another magnetic layer 24c is magnetized in a reversed direction to the Y-direction by an exchange coupling due to an RKKY interaction acting between the magnetic layers 24a and 24c. The temperature of the first heat-treatment is adjusted to about 270° C., and the magnitude of the magnetic field is adjusted to about 800 kA/m.

Precious metal elements constituting the nonmagnetic layer 27 such as Ru are presumed to diffuse into the free magnetic layer 26 by annealing in the first magnetic field. Accordingly, the free magnetic layer 26 after the heat-treatment includes the elements constituting the free magnetic layer 26 and precious metal elements. A larger proportion of the precious metal elements that diffused into the free magnetic layer 26 are accumulated at the upper portion of the free magnetic layer 26 than at the lower portion of the free magnetic layer 26. The composition ratio of the diffused precious metal elements gradually decreases from the surface of the free magnetic layer 26 toward the lower portion thereof. Such gradation of the composition may be confirmed using an apparatus such as a SIMS analyzer.

A resist layer is formed on the surface of the nonmagnetic layer 27 in the step shown in FIG. 12, and a resist layer 49 with a configuration as shown in FIG. 12 is left behind after exposure and development of the resist layer. The resist layer 49 serves as, for example, as a lift-off resist layer.

Then, a portion of each outer side 27a of the nonmagnetic layer 27 not covered with the resist layer 49 is shaved by ion-milling from the direction indicated by arrows H in FIG. 12 (the nonmagnetic layer 27 in the portion within the dotted lines in FIG. 2 is removed).

A portion of each outer side 27a of the nonmagnetic layer 27 is shaved off to remove impurities such as organic substances adsorbed on the surface of the nonmagnetic layer 27, and to tightly fix magnetization in each outer side S of the free magnetic layer 26 in the same direction as the direction of magnetization of the ferromagnetic layer 28, by generating a ferromagnetic coupling between the ferromagnetic layer 28, which is formed on each outer side 27a in the next step, and free magnetic layer 26 by forming each outer side 27a as thin as possible.

It is preferable in the present invention to set the thickness of each outer side 27a of the nonmagnetic layer 27 in the ion-milling step as follows.

Preferably, each outer side 27a of the nonmagnetic layer 27 is formed with a thickness of more than about 0 Å and about 6 Å or less in the present invention when the nonmagnetic layer 27 comprises Ru, and a NiFe based alloy layer is formed at the interfaces where the free magnetic layer 26 and ferromagnetic layer 28 formed in the next step contact the nonmagnetic layer 27.

Preferably, each outer side 27a of the nonmagnetic layer 27 is formed with a thickness of more than about 0 Å and about 8 Å or less in the present invention when the nonmagnetic layer 27 comprises Cr, and NiFe based alloy layers are formed at the interfaces where the free magnetic layer 26 and ferromagnetic layer 28 formed in the next step contact the nonmagnetic layer 27.

Preferably, each outer side 27a of the nonmagnetic layer 27 is formed with a thickness of more than about 0 Å and about 2.5 Å or less in the present invention when the nonmagnetic layer 27 comprises Ir, and NiFe based alloy layers are formed at the interfaces where the free magnetic layer 26 and ferromagnetic layer 28 formed in the next step contact the nonmagnetic layer 27.

Preferably, each outer side 27a of the nonmagnetic layer 27 is formed with a thickness of more than about 0 Å and about 3 Å or less in the present invention when the nonmagnetic layer 27 comprises Rh, and NiFe based alloy layers are formed at the interfaces where the free magnetic layer 26 and ferromagnetic layer 28 formed in the next step contact the nonmagnetic layer 27.

Preferably, each outer side 27a of the nonmagnetic layer 27 is formed with a thickness of more than about 0 Å and about 5 Å or less, or about 10 Å or more and about 13 Å or less, when the nonmagnetic layer 27 comprises Ru, and layers mainly comprising Co are formed at the interfaces where the free magnetic layer 26 and ferromagnetic layer 28 formed in the next step contact the nonmagnetic layer 27.

Preferably, each outer side 27a of the nonmagnetic layer 27 is formed with a thickness of more than about 0 Å and about 4 Å or less, or about 10 Å or more and about 14 Å or less, when the nonmagnetic layer 27 comprises Rh, and layers mainly comprising Co are formed at the interfaces where the free magnetic layer 26 and ferromagnetic layer 28 formed in the next step contact the nonmagnetic layer 27.

Preferably, each outer side 27a of the nonmagnetic layer 27 is formed with a thickness of more than about 0 Å and about 4 Å or less, or about 11 Å or more and about 15 Å or less, when the nonmagnetic layer 27 comprises Cu, and layers mainly comprising Co are formed at the interfaces where the free magnetic layer 26 and ferromagnetic layer 28 formed in the next step contact the nonmagnetic layer 27.

A ferromagnetic layer can be generated between each outer side S of the free magnetic layer 26 and ferromagnetic layer 28 by forming each outer side 27a of the nonmagnetic layer 27 with a thickness within the range recited above. The term "ferromagnetic coupling" as used herein means that each outer side S of the free magnetic layer 26 is magnetized in the same direction as the direction of magnetization of the ferromagnetic layer 28 by the RKKY ferromagnetic coupling between each outer side S of the free magnetic layer 26 and ferromagnetic layer 28 with interposition of the nonmagnetic layer 27, or by a direct interaction between each outer side S of the free magnetic layer 26 and ferromagnetic layer 28 through defects such as pin-holes formed on the nonmagnetic layer 27.

Low energy ion-milling may be used in the ion-milling step shown in FIG. 12, since the nonmagnetic layer 27 is deposited to be as thin as about 3 Å to about 20 Å, more preferably about 3 Å to about 10 Å.

Figure 26:
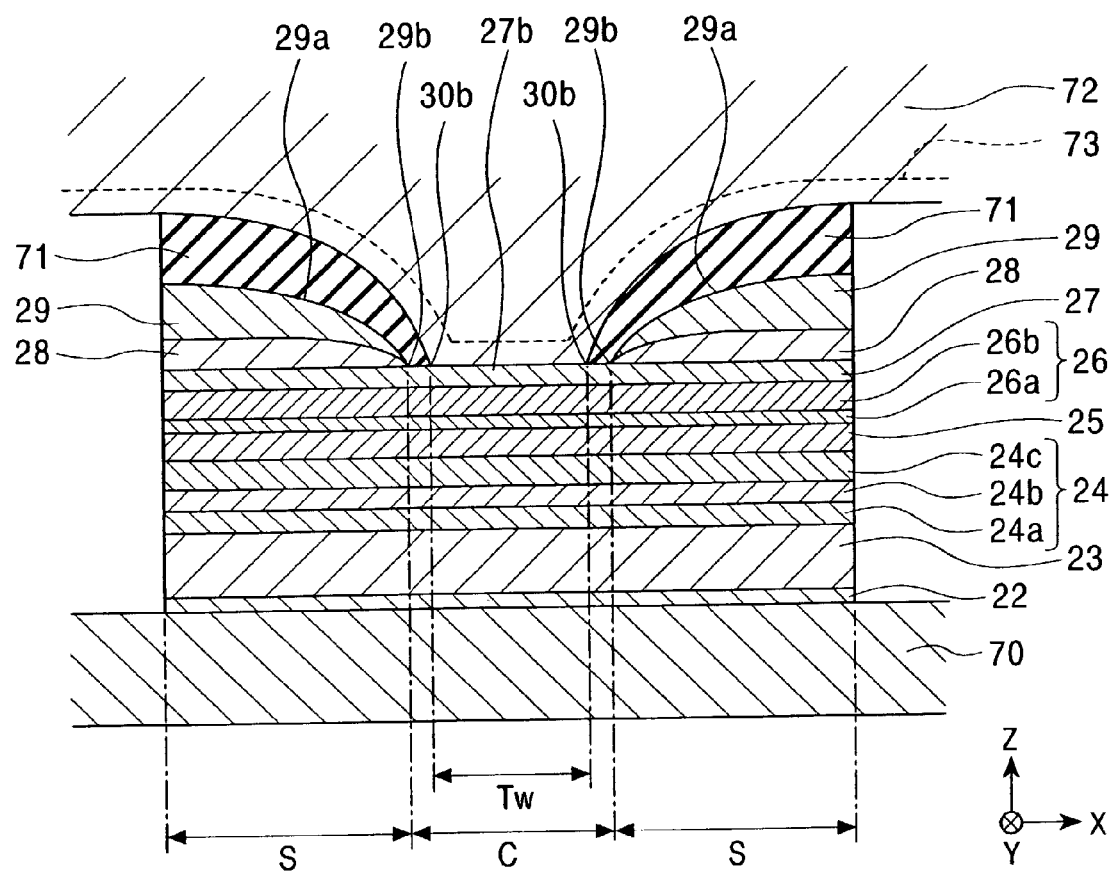
FIG. 26 is a partial cross section of the structure of a magnetic sensing element viewed from aside opposite a recording medium as a eighth embodiment of the present invention.

In contrast, a thickness of as large as about 30 Å to about 50 Å is necessary when a Ta layer 9 is used as in the conventional example shown in FIG. 26 because the Ta layer 9 itself is oxidized by exposure to the atmosphere and the layer under the Ta layer cannot be protected from oxidation unless the Ta layer is formed with a thickness as described above. Moreover, the volume of the Ta layer 9 is increased by oxidation so much that the Ta layer 9 increases to a thickness of about 50 Å or more.

The thick Ta layer 9 described above has to be removed by high energy ion-milling. However, it is difficult to control high energy ion-milling to remove only the Ta layer 9, and a portion of the surface of the free magnetic layer 5 formed under the Ta layer is also shaved off, thereby damaging the surface of the free magnetic layer 5 by ion-milling.

The nonmagnetic layer 27 formed from Ru with a thickness of as small as about 3 Å to about 20 Å, more preferably about 3 Å to about 10 Å, is sufficient to protect the free magnetic layer 26 from being oxidized in the present invention while allowing the use of low-energy ion milling to more easily control ion-milling to stop at a depth halfway of the nonmagnetic layer 27.

Since low energy ion-milling is used in the present invention, control of milling can be further improved compared with the prior art.

The milling time is about 20 seconds to about 60 seconds. Milling is applied from a direction inclined at an angle of about 30° to about 70°, preferably about 40° to about 60°, relative to the direction perpendicular to the surface of the lower shield layer 20. These milling time and milling angle permit the thickness of each outer side 27a of the nonmagnetic layer 27 to fall within the rage as hitherto described.

The resist layer 49 is formed on the central area 27b of the nonmagnetic layer 27. The central area 27b maintainsits thickness after deposition since it is not subjected to ion-milling.

Then, the step shown in FIG. 13 is applied. A ferromagnetic layer 28, a second antiferromagnetic layer 29 and an electrode layer 30 are continuously deposited on each outer side 27a of the nonmagnetic layer 27 in the step shown in FIG. 13 by techniques such as sputtering or vacuum deposition. The inner side 28a of the ferromagnetic layer 28, the inner side 29a of the second antiferromagnetic layer 29, and the inner side 30a of the electrode layer 30 are deposited with an inclined surface or curved surface so that the distance between both sideinner sides of each layer increases in the direction (X-direction) from the lower face to the upper face thereof.

The track width Tw is defined by the distance between the inner ends of the antiferromagnetic layer 28 in both sides in this embodiment.

Preferably, the same material as used in the first antiferromagnetic layer 23 is also used for the second antiferromagnetic layer 29.

The second antiferromagnetic layer 29 is preferably formed with a thickness as large as about 80 Å or more and about 500 Å or less to generate a proper exchange magnetic field between the second antiferromagnetic layer 29 and ferromagnetic layer 28.

The resist layer 49, on which a ferromagnetic material layer 28b comprising the elements constituting the ferromagnetic layer 28, an antiferromagnetic material layer 29c comprising the elements constituting the second antiferromagnetic layer 29, and an electrode material layer 30c comprising the elements constituting the electrode layer 30 are adhered, is removed by lift-off after depositing the layers up to the electrode layer 30 as shown in FIG. 13.

Then, the laminate is annealed in a second magnetic field in the direction of the track width (X-direction). The magnitude of the second magnetic field applied in the second annealing step is adjusted to be smaller than the exchange anisotropic magnetic field of the first antiferromagnetic layer 23, while the heat treatment temperature is adjusted to be lower than the blocking temperature of the first antiferromagnetic layer 23. This annealing condition permits the exchange anisotropic magnetic field of the second antiferromagnetic layer 29 to be directed in the track width direction (X-direction) while directing the exchange coupling magnetic field of the first antiferromagnetic layer 23 in the height direction (Y-direction). The second heat-treatment temperature is, for example, about 250° C. with a magnitude of the magnetic field of about 24 kA/m.

An exchange coupling magnetic field is generated between the ferromagnetic layer 28 and second antiferromagnetic layer 29 by annealing in the second magnetic field to fix the magnetization of the ferromagnetic layer 28 in the track width direction (X-direction) and by forming the second antiferromagnetic layer 29 on the ferromagnetic layer 28 as shown in FIG. 13. Consequently, magnetization in each outer side S of the free magnetic layer 26 is tightly fixed in the same direction as the direction of magnetization of the ferromagnetic layer 28 by a ferromagnetic coupling between the free magnetic layer 26 and ferromagnetic layer 28.

Since the ferromagnetic layer 28 and second antiferromagnetic layer 29 are provided on sideeach side S of the free magnetic layer 26, but not on the central area C of the free magnetic layer 26, magnetization in the central area C of the free magnetic layer 26 is not tightly fixed. Instead, magnetization in the central area C of the free magnetic layer 26 is weakly set into a single magnetic domain state in the track width direction (X-direction) to an extent capable of magnetic inversion against an external magnetic field.

It is preferable in the step used in FIG. 13 to form the ferromagnetic layer 28 with a thickness of about 2 Å or more and about 50 Å or less.

Each outer side S of the free magnetic layer 26 maintains good magnetic characteristics in the present invention since it is not damaged by ion milling in the step used in FIG. 12. Accordingly, the ferromagnetic coupling generated between the free magnetic layer and ferromagnetic layer 28 remains strong even when the thickness of the ferromagnetic layer 28 is reduced to an extent as described above. Therefore, a sufficiently large exchange coupling magnetic field can be generated between the ferromagnetic layer 28 and antiferromagnetic layer 29 while preventing an excessive static magnetic field from the inner side 28a of the ferromagnetic layer 28 from affecting the central area C of the free magnetic layer 26. As a result, a magnetic sensing element highly suitable for high density recording can be manufactured.

Precious metal elements such as Ru constituting the nonmagnetic layer 27 is believed to diffuse into the free magnetic layer 26 and ferromagnetic layer 28 by annealing in the second magnetic field. Accordingly, the elements constituting the free magnetic layer 26 and ferromagnetic layer 28 after the heat-treatment comprise the elements constituting the free magnetic layer 26, ferromagnetic layer 28, and precious metal elements. A larger proportion of the precious metal elements that diffused into the free magnetic layer 26 and ferromagnetic layer 28 are accumulated in the upper portion of the free magnetic layer 26 than in the lower portion of the free magnetic layer 26, and in the lower portion than the upper portion of the ferromagnetic layer 28. The composition ratio of the diffused precious metal elements is believed to gradually decrease from the surface to the lower portion of the free magnetic layer 26, and from the lower portion to the surface of the ferromagnetic layer 28. Such gradation of composition can be confirmed by an apparatus such as a SIMS analyzer.

According to the manufacturing process as hitherto described, the magnetization of the free magnetic layer 26 can be more effectively controlled in the present invention than in the prior art, thereby enabling a magnetic sensing element with excellent regenerative sensitivity to be manufactured even when a narrow track width is used.

The magnetic sensing element shown in FIG. 1 can be manufactured by the manufacturing process as hitherto described. The resist layer 49 shown in the step in FIG. 12 is manufactured after the step used in FIG. 11, followed by the step used in FIG. 13 in the process for manufacturing the magnetic sensing element shown in FIG. 2. Ion-milling is not applied in the step used in FIG. 12.

No ion-milling for adjusting the thickness by shaving each outer side 27a of the nonmagnetic layer 27 is not required in the step used FIG. 12, so long as the nonmagnetic layer 27 is formed with a thickness sufficient for protecting the surface of the free magnetic layer 26 from being oxidized in the step in FIG. 11, and with a thickness sufficient for generating a ferromagnetic coupling between the free magnetic layer 26 and ferromagnetic layer 28.

It is preferable in the present invention to form the nonmagnetic layer 27 with a thickness of about 3 Å or more, in order to properly prevent the surface of the free magnetic layer 26 from being oxidized. In addition, the nonmagnetic layer 27 is deposited with a controlled thickness in the step used in FIG. 11, so that each outer side 27a of the nonmagnetic layer 27 described in the step shown in FIG. 12 has a layer thickness that lies within the preferred thickness rangeouter side.

Consequently, the free magnetic layer 26 may be protected from being oxidized without shaving the nonmagnetic layer 27 by ion-milling in the step used in FIG. 12 while permitting a ferromagnetic coupling to be effectively generated between each outer side S of the free magnetic layer 26 and ferromagnetic layer 28, making magnetization of the free magnetic layer 26 to be effectively and easily controlled.

Otherwise, the magnetic sensing element may be manufactured by the following process. At first, the layers up to the nonmagnetic layer 27 are laminated as shown in FIG. 11. The nonmagnetic layer 27 is preferably formed with a thickness of from about 3 Å to about 20 Å, or about 3 Å to about 10 Å. Then, the surface of the nonmagnetic layer 27 is uniformly shaved by ion-milling until the thickness of each outer side 27a of the nonmagnetic layer 27 on sideeach side S of the free magnetic layer 26 falls within the preferred thickness range. The resist layer 49 is formed thereafter in the step shown in FIG. 12, and the ferromagnetic layer 28, second antiferromagnetic layer 29, and electrode layer 30 are formed in the step used in FIG. 13.

After the free magnetic layer 26 has been formed with the laminated ferrimagnetic structure shown in FIG. 8, the nonmagnetic layer 27 exposed out of the resist (electrode layer 30), or the layers up to the magnetic layer 41 constituting the free magnetic layer 26, may be shaved off by ion-milling by covering the electrode layer 30 with a resist, or by using the electrode layer 30 itself as a mask layer. As a result, the nonmagnetic intermediate layer 40 is exposed in the central area C, and the remaining magnetic layer 39 functions as a monolayer of the free magnetic layer 26 in the central area C. The free magnetic layer 26 maintains a laminated ferrimagnetic structure in each outer side S, and the unidirectional exchange bias magnetic field is enhanced to enable each outer side S of the free magnetic layer 26 to be fixed in the track width direction, thereby making it possible to manufacture a magnetic sensing element in which side-reading is suppressed.

When the free magnetic layer 26 is formed with the backed layer 46 shown in FIG. 10, the nonmagnetic layer 27 exposed out of the resist (or electrode layer 30) may be shaved by ion-milling by covering the electrode layer 30 with a resist, or by using the electrode layer 30 as a mask layer after the step used in FIG. 13 to expose the backed layer 46 in the central area C.

Figure 14:
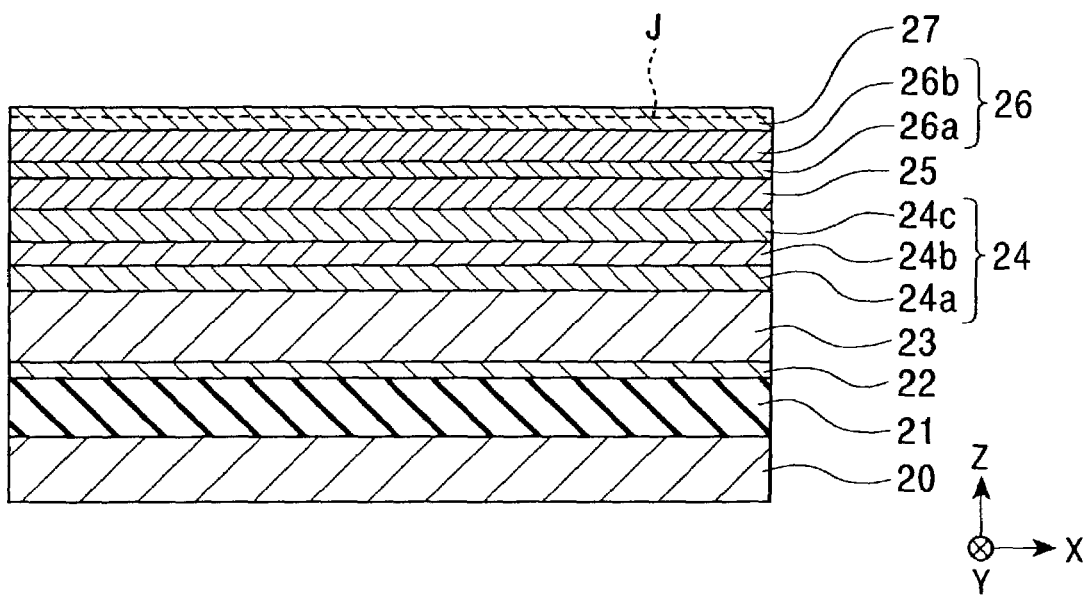
FIG. 14 shows a fourth step of the process for manufacturing the magnetic sensing element in the embodiment shown in FIG. 1.
Figure 15:
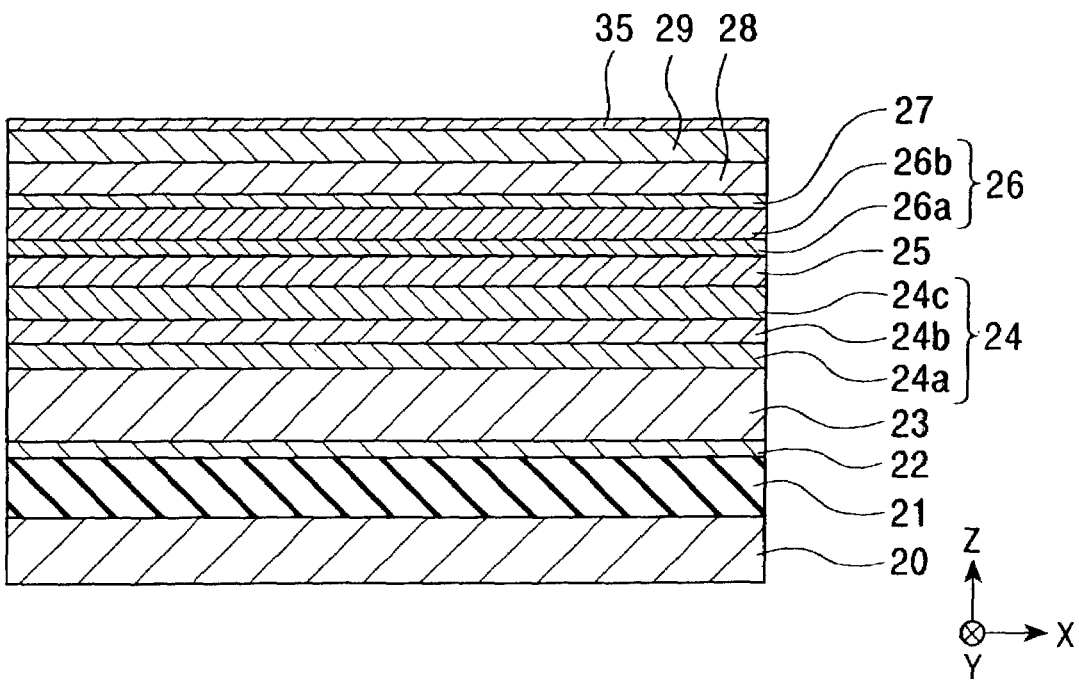
FIG. 15 shows a fifth step of the process for manufacturing the magnetic sensing element in the embodiment shown in FIG. 1.
Figure 16:
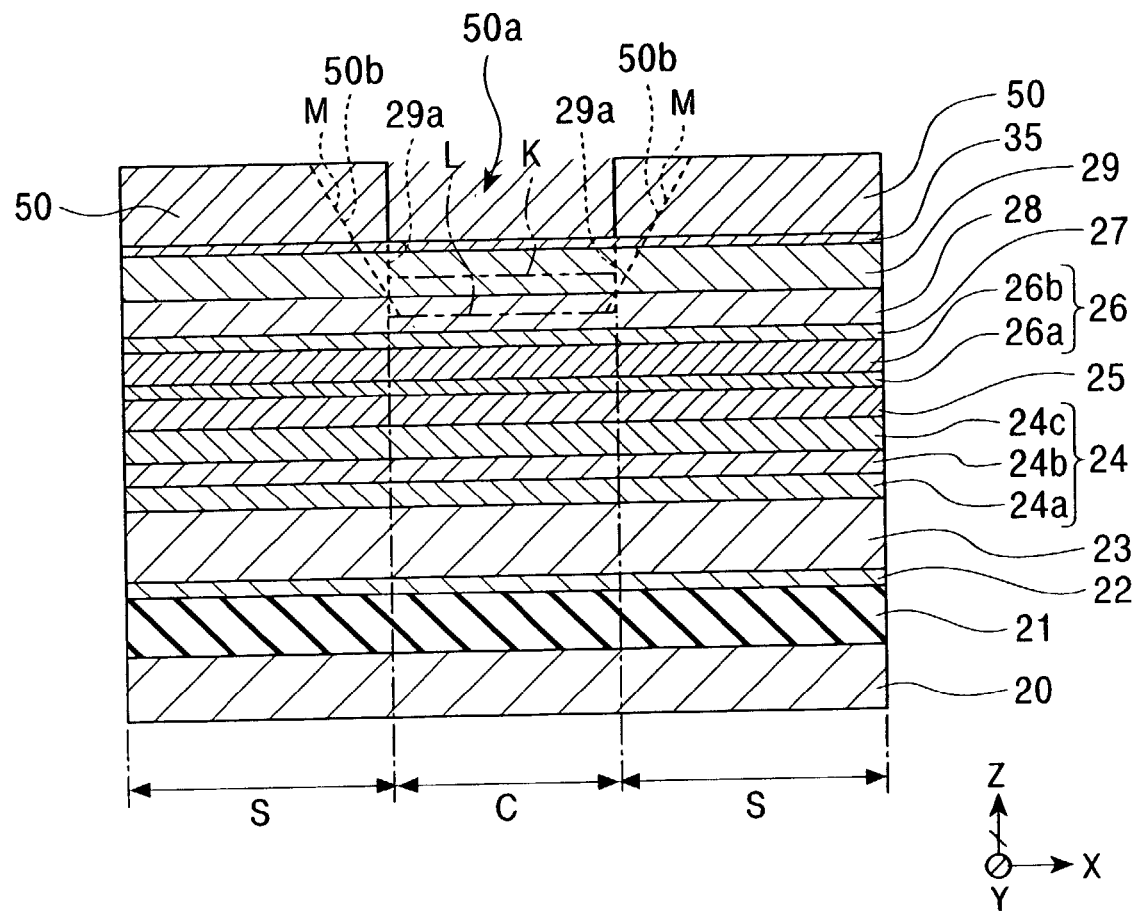
FIG. 16 shows a sixth step of the process for manufacturing the magnetic sensing element in the embodiment shown FIG. 1.

FIGS. 14 to 16 show manufacturing steps of the magnetic sensing element shown in FIGS. 4 to 6. Each drawing shows a partial cross section of the recording medium viewed from aside opposite a recording medium.

A lower gap layer 21 comprising an insulation material such as $Al_2O_3$ is formed on a lower shield layer 20 made of a magnetic material such as NiFe based alloy in the step used in FIG. 14. Then, an underlayer 22, a first antiferromagnetic layer 23, a pinned magnetic layer 24, a nonmagnetic material layer 25, free magnetic layer 26 and a nonmagnetic layer 27 are continuously deposited on the lower gap layer 21. The layers are deposited by techniques such as sputtering or vacuum deposition. The pinned magnetic layer 24 shown in FIG. 14 takes a laminated ferrimagnetic structure comprising, for example, magnetic layers 24a and 24c made of CoFe alloy, and a nonmagnetic interlayer 24b made of Ru and the like interposed between the magnetic layers 24a and 24c. The free magnetic layer 26 takes a laminated structure of a diffusion preventive layer 26a made of a CoFe alloy and a magnetic material layer 26b made of a NiFe alloy.

The first antiferromagnetic layer 23 is preferably formed from a Pt—Mn alloy, a X—Mn alloy (where X is at least one of Pd, Ir, Rh, Ru, Os, Ni and Fe), or a Pt—Mn—X' alloy (where X' is at least one of PD, Ir, Rh, Ru, Au, Ag, Os, Cr, Ni, Ar, Ne, Xe and Kr) in the present invention.

The preferred range of Pt or X is from about 37 to about 63 at % in the alloy represented by the formula PtMn or X—Mn. The more preferable range of Pt or X is from about 47 to about 57 at % in the alloy represented by the formula PtMn X—Mn.

The preferable range of X'+Pt is from about 37 to about 63 at % in the alloy represented by the formula Pt—Mn—X'. The more preferable range of X'+Pt is from about 47 to about 57 at % in the alloy represented by the formula Pt—Mn—X'. The preferable range of X' is from about 0.2 to about 10 at % in the alloy represented by the formula Pt—Mn—X'. However, X' is preferably in the range of from about 0.2 to about 40 at % when X' represents at least one element from among Pd, Ir, Rh, Ru, Os, Ni and Fe.

It is preferable in the present invention to form the first antiferromagnetic layer 23 with a thickness of about 80 Å or more and about 300 Å or less. A large exchange coupling magnetic field can be generated between the first antiferromagnetic layer 23 and pinned magnetic layer 24 by annealing in a magnetic field when the first antiferromagnetic layer 23 is formed with a thickness in the range as described above. An exchange coupling magnetic field of about 48 kA/m, for example, about 64 kA/m or more, may be generated.

The free magnetic layer 26 can beeffectively protected from being oxidized by forming the nonmagnetic layer 27 on the free magnetic layer 26 in the step shown in FIG. 14.

The nonmagnetic layer 27 is required to be a dense layer that is hardly oxidized by being exposed to the atmosphere. The material of the nonmagnetic layer 27 mustnot degrade the property of the ferromagnetic material layer even when the material diffuses into the free magnetic layer 26 by heat-diffusion.

It is preferable in the present invention to form the nonmagnetic layer 27 with a precious metal comprising at least one of Ru, Re, Pd, Os, Ir, Rh, Cr, Cu, Pt and Au.

The nonmagnetic layer 27 comprising a precious metal such as Ru is a dense layer that is hardly oxidized by exposure to the atmosphere. Accordingly, the free magnetic layer 26 is prevented from being oxidized by exposure to the atmosphere even when a thin nonmagnetic layer 27 is used.

The nonmagnetic layer 27 is preferably formed with a thickness of about 3 Å or more and about 20 Å or less, more preferably about 3 Å or more and about 10 Å or less, in the present invention in the deposition step shown in FIG. 14. It is possible to effectively prevent the free magnetic layer 26 from being oxidized by exposure to the atmosphere by forming the nonmagnetic layer 27 with a thickness as small as described above.

The present invention is characterized by forming the nonmagnetic layer 27 with a precious metal such as Ru, in addition to forming the nonmagnetic layer 27 with a thickness as small as about 3 Å to about 20 Å, preferably about 3 Å to about 10 Å. Thus, ion-milling can be effectively and easily controlled in the next step by forming the nonmagnetic layer 27 with a thickness as small as described above.

As shown in FIG. 14, layers up to the nonmagnetic layer 27 are laminated on the lower shield layer 20 followed by annealing in the first magnetic field. Magnetization of the magnetic layer 24a is fixed in the Y-direction by heat-treating at a first heat-treatment temperature to generate an exchange coupling magnetic field between the first antiferromagnetic layer 23 and magnetic layer 24a constituting the pinned magnetic layer 24, while applying the first magnetic field (Y-direction) that is directed in a perpendicular direction to the track width Tw direction (X-direction). Magnetization of another magnetic layer 24c is fixed in the reversed direction to the Y-direction by an exchange coupling by a RKKY interaction acting between the magnetic layers 24a and 24c. The first heat-treatment temperature is adjusted to about 270° C. while the magnitude of the magnetic field is adjusted to about 800 kA/m.

Precious metal elements such as Ru constituting the nonmagnetic layer 27 are believed to diffuse into the free magnetic layer 26 by annealing in the first magnetic field. Accordingly, the elements in the free magnetic layer 26 after the heat treatment comprise the elements constituting the ferromagnetic layer and precious metal elements. The precious metal elements that diffused into the free magnetic layer 26 accumulate more at the surface of the free magnetic layer 26 than at the lower portion of the free magnetic layer 26. The composition ratio of the diffused precious metal elements is believed to gradually decrease from the surface 26 to the lower portion of the free magnetic layer. Such gradation of the composition may be confirmed by an apparatus such as a SIMS analyzer.

In the next step shown in FIG. 14, the entire surface of the nonmagnetic layer 27 is subjected to ion-milling to shave the nonmagnetic layer 27 to a position denoted by a dotted line J.

A portion of the nonmagnetic layer 27 is shaved to remove impurities such as organic substances adsorbed on the surface of the nonmagnetic layer 27. No ferromagnetic coupling is generated between the ferromagnetic layer 28, which is formed on each outer side 27a of the nonmagnetic layer 27 and each outer side S of the free magnetic layer 26 unless the thickness of the nonmagnetic layer 27 is reduced as small as possible to within a prescribed range of thickness, thereby making it impossible to effectively control magnetization of the free magnetic layer 26.

Preferably, the surface of the nonmagnetic layer 27 is subjected to ion-milling so that the nonmagnetic layer 27 has a thickness larger than about 0 Å and about 6 Å or less when the nonmagnetic layer 27 is formed from Ru, and when a NiFe based alloy layers are formed at the interfaces where the free magnetic layer 26 and the ferromagnetic layer 28 to be formed in the next step contact the nonmagnetic layer 27 in the step shown in FIG. 14.

Preferably, the surface of the nonmagnetic layer 27 is subjected to ion-milling so that the nonmagnetic layer 27 has a thickness larger than about 0 Å and about 8 Å or less when the nonmagnetic layer 27 is formed from Cr, and when NiFe based alloy layers are formed at the interfaces where the free magnetic layer 26 and the ferromagnetic layer 28 to be formed in the next step contact the nonmagnetic layer 27 in the present invention.

Preferably, the surface of the nonmagnetic layer 27 is subjected to ion-milling so that the nonmagnetic layer 27 has a thickness larger than about 0 Å and about 2.5 Å or less when the nonmagnetic layer 27 is formed from Ir, and when NiFe based alloy layers are formed at the interfaces where the free magnetic layer 26 and the ferromagnetic layer 28 to be formed in the next step contact the nonmagnetic layer 27 in the present invention.

Preferably, the surface of the nonmagnetic layer 27 is subjected to ion-milling so that the nonmagnetic layer 27 has a thickness larger than about 0 Å and about 3 Å or less when the nonmagnetic layer 27 is formed from Rh, and when NiFe based alloy layers are formed at the interfaces where the free magnetic layer 26 and the ferromagnetic layer 28 to be formed in the next step contact the nonmagnetic layer 27 in the present invention.

Preferably, the surface of the nonmagnetic layer 27 is subjected to ion-milling so that the nonmagnetic layer 27 has a thickness larger than about 0 Å and about 5 Å or less, or about 10 Å or more and about 13 Å or less, when the nonmagnetic layer 27 is formed from Rh, and when layers mainly comprising Co are formed at the interfaces where the free magnetic layer 26 and the ferromagnetic layer 28 to be formed in the next step contact the nonmagnetic layer 27 in the present invention.

Preferably, the surface of the nonmagnetic layer 27 is subjected to ion-milling so that the nonmagnetic layer 27 has a thickness larger than about 0 Å and about 4 Å or less, or about 10 Å or more and about 14 Å or less, when the nonmagnetic layer 27 is formed from Rh, and when layers mainly comprising Co are formed at the interfaces where the free magnetic layer 26 and the ferromagnetic layer 28 to be formed in the next step contact the nonmagnetic layer 27 in the present invention.

Preferably, the surface of the nonmagnetic layer 27 is subjected to ion-milling so that the nonmagnetic layer 27 has a thickness larger than about 0 Å and about 4 Å or less, or about 11 Å or more and about 15 Å or less, when the nonmagnetic layer 27 is made of Cu, and when layers mainly comprising Co are formed at the interfaces where the free magnetic layer 26 and the ferromagnetic layer 28 to be formed in the next step contact the nonmagnetic layer 27 in the present invention.

A ferromagnetic coupling is generated between the ferromagnetic layer 28 and each outer side S of the free magnetic layer 26, which are facing on and under each outer side 27a of the nonmagnetic layer 27 with each other, by adjusting the thickness of the nonmagnetic layer 27 as described above in the present invention, thereby enabling the magnetization of each outer side S of the free magnetic layer 26 to be tightly fixed in the same direction as the direction of magnetization of the ferromagnetic layer 28.

Low energy ion-milling may be used in the ion-milling step shown in FIG. 14 since the nonmagnetic layer 27 is deposited with a thickness preferably as small as about 3 Å to about 20 Å, more preferably with a thickness of as small as about 3 Å to about 10 Å. Consequently, low energy ion-milling may be readily stopped at a depth halfway of the thickness of the nonmagnetic layer 27 to allow improved milling control compared with prior art.

The ion-milling step used in FIG. 14 is not required in some cases. When the nonmagnetic layer 27 is deposited with a thickness of about 3 Å or more that satisfies the range of thickness after the ion-milling step used in FIG. 14, the free magnetic layer 26 may be protected from being oxidized without applying ion-milling in the step shown in FIG. 14, while enabling a ferromagnetic coupling to be effectively generated between the ferromagnetic layer 28 and free magnetic layer 26 with interposition of each outer side 27a of the nonmagnetic layer 27.

A ferromagnetic layer 28 and second antiferromagnetic layer 29 are deposited on the nonmagnetic layer 27 in the step used in FIG. 15, followed by a continuous deposition of a protective layer 35 made of Ta and the like on the second antiferromagnetic layer 29. The protective layer 35 is provided to protect the second antiferromagnetic layer 29 from being oxidized by exposure to the atmosphere.

The second antiferromagnetic layer 29 is preferably formed with a thickness of about 80 Å or more and about 500 Å or less, in order to generate a sufficient magnitude of exchange coupling magnetic field between the second antiferromagnetic layer 29 and ferromagnetic layer 28.

In the step shown in FIG. 16, mask layers 50 formed from, for example, an inorganic material are formed on the protective layer 35 with a prescribed space 50a apart in the track width direction (X-direction). The inorganic material may be selected from Ta, Ti, Si, Zr, Nb, Mo, Hf, W, Al—O, Al—Si—O and Si—O. The mask layers 50 may be left behind after the manufacturing step of the mask layers to allow the layers to serve as electrode layers 30 when the mask layers are formed from a metallic material.

In the step for forming the mask layers 50, a resist layer (not shown) is formed on the central area of the protective layer 35, and both outer sides of the resist layer are filled with the mask layers 50, followed by mask layer removal to form a space 50a with a prescribed distance between the mask layers 50. Alternatively, a resist layer (not shown) is overlaid on the mask layer 50 after forming the mask layer 50 over the entire surface of the protective layer 35. An opening is formed in the central area of the resist layer by light exposure followed by shaving the mask layer 50 exposed through the opening by techniques such as reactive ion-etching (RIE), thereby forming the mask layers 50 with a prescribed space 50a therebetween. Alternatively, the mask layer 50 may be formed with a resist.

In the step used in FIG. 16, the protective layer 35 exposed in the space 50a between the mask layers 50 is shaved by techniques such as RIE or ion-milling, followed by drilling of the second antiferromagnetic layer 29 under the protective layer 35 to a level represented by the double-dot broken line K. The second antiferromagnetic layer 29 is preferably drilled until the thickness of the second antiferromagnetic layer 29 under the double-dot broken line K is reduced to about 50 Å or less, more preferably about 40 Å or less. Since the central area C of the second antiferromagnetic layer 29 remains antiferromagnetic unless the thickness is reduced as described above, an exchange coupling magnetic field is generated between the central area C of the second antiferromagnetic layer 29 and ferromagnetic layer 28 resulting in tight fixing of magnetization of the central area C of the free magnetic layer 26.

The magnetic sensing element shown in FIG. 6 may be manufactured by shaving the second antiferromagnetic layer 29 to a depth represented by the double-dot broken line K in FIG. 16 and by leaving the ferromagnetic layer 28 and a part of the second antiferromagnetic layer 29 on the central area of the free magnetic layer 26.

The ferromagnetic layer 28 may be exposed in the space 50a by removing all the second antiferromagnetic layer 29 exposed in the space 50a between the mask layers 50. The ferromagnetic layer 28 may be shaved to a level denoted by the dotted broken line L at a depth halfway of the thickness of the ferromagnetic layer. Alternatively, all the ferromagnetic layer 28 may be left behind without shaving it. The magnetic sensing element shown in FIG. 5 is completed by stopping the milling when the ferromagnetic layer 28 is exposed within the space 50a.

The magnetic sensing element shown in FIG. 4 is completed by shaving all the ferromagnetic layer 28 by stopping the milling when the nonmagnetic layer 27 formed under the ferromagnetic layer is exposed. A small portion of the nonmagnetic layer 27 may be also shaved.

Since the second antiferromagnetic layer 29 is shaved in adirection vertical to the surface of the lower shield layer 20, the inner side 29a of the second antiferromagnetic layer 29 is formed in the direction approximately perpendicular (in the Z-direction) to the surface of the lower shield layer 20. Naturally, the inner side of each shaved layer is formed in a direction approximately perpendicular to the surface of the lower shield layer 20 when the layer formed under the second antiferromagnetic layer 29 is shaved.

When the inner side 50b of each mask layer 50 is formed as an inclined or curved surface in which the space 50a gradually increases from the lower face to the upper face as indicated by the dotted line in FIG. 16, each inner side 29a of the second antiferromagnetic layer 29 and other layers is also formed as an inclined or curved surface.

The width of the shaved space 50a in the track width direction (X-direction) becomes smaller toward the lower face when the inner side 50b of each mask layer 50 is formed as an inclined or curved surface. Accordingly, the track width Tw may be made smaller than the space 50a between the mask layers 50 to enable the manufacture of a magnetic sensing element capable of defining a narrow track width.

While the mask layer may be shaved to an arbitrary depth, it is crucial to leave the second antiferromagnetic layer 29 with a depth sufficient for at least manifesting an antiferromagnetic property on the central area C of the free magnetic layer 26 and to prevent the free magnetic layer 26 from being shaved by techniques such as RIE or ion-milling step. Shaving the free magnetic layer 26 by ion-milling and the like is not preferable since the magnetic characteristics of the free magnetic layer 26 is likelye to deteriorate as a result of damage from ion-milling as occurs in the prior art.

All the magnetic layer of the exposed free magnetic layer 26 may be removed after removing all the nonmagnetic layer 27 in the central area C when the free magnetic layer 26 is formed with a laminated ferrimagnetic structure as shown in FIG. 8, whereby the nonmagnetic intermediate layer 40 constituting the free magnetic layer 26 is exposed within the space 50a between the resist layers 50 shown in FIG. 16.

The surface of the backed layer 46 may be exposed by removing all the nonmagnetic layer 27 on the central area C when the free magnetic layer 26 is formed having the backed layer 46 as shown in FIG. 10.

The laminate is annealed in a second magnetic field after completing the RIE or ion-milling step by applying the magnetic field in the track width direction (X-direction). The magnitude of the second magnetic field for annealing is adjusted to be smaller than the magnitude of the exchange anisotropic magnetic field of the first antiferromagnetic layer 23 while adjusting the heat-treatment temperature to be lower than the blocking temperature of the first antiferromagnetic layer. Consequently, the exchange anisotropic magnetic field at each inner side S of the second antiferromagnetic layer 29 may be directed in the track width direction (X-direction) while maintaining the direction of the exchange anisotropic magnetic field of the first antiferromagnetic layer 23 in the height direction (Y-direction). The second heat-treatment temperature is about 250° C. while the magnitude of the magnetic field is about 24 kA/m.

Since the ferromagnetic layer 28 and second antiferromagnetic layer 29 are continuously deposited in the step shown in FIG. 15, an exchange coupling magnetic field can be generated between each outer side S of the ferromagnetic layer 28 and antiferromagnetic layer 29 by annealing in a second magnetic field, thereby enabling the magnetization at each outer side of the ferromagnetic layer 28 to be tightly fixed in the track width direction (X-direction).

Magnetization at each outer side S of the free magnetic layer 26 facing the ferromagnetic layer 28 with interposition of the nonmagnetic layer 27 may be also tightly fixed in the same direction as the direction of magnetization of the ferromagnetic layer 28.

If no second antiferromagnetic layer 29 is provided on the central area C of the free magnetic layer 26, or if the second antiferromagnetic layer 29 is formed, if any, with a thickness small enough to prevent the second antiferromagnetic layer from manifesting an antiferromagnetic layer property, magnetization in the central area C of the free magnetic layer 26 cannot tightly fixed in the track width direction (X-direction) by annealing in the second magnetic field. Consequently, magnetization of the central area C of the free magnetic layer 26 is weakly set into a single magnetic domain state to an extent capable of magnetic inversion against an external magnetic field.

Magnetization of the free magnetic layer 26 can be more effectively controlled in the present invention compared with prior art, making it possible to manufacture a magnetic sensing element having excellent regenerative sensitivity even when the track width is narrowed.

Precious metal elements such as Ru constituting the nonmagnetic layer 27 are considered to diffuse into the free magnetic layer 26 and ferromagnetic layer 28 by annealing in the second magnetic field. Thus, the free magnetic layer 26 and ferromagnetic layer 28 after the heat-treatment include elements constituting the ferromagnetic layer and precious metal elements. A larger proportion of the precious metal element that diffused into the free magnetic layer 26 and ferromagnetic layer 28 accumulates more at the surface than at the lower portion of the free magnetic layer 26, and at the lower portion than the surface of the ferromagnetic layer 28. The composition ratio of the diffused precious metal elements gradually decreases from the surface to the lower portion of the free magnetic layer 26, and from the lower portion to the surface of the ferromagnetic layer 28. Such gradation of the composition may be confirmed using an apparatus such as a SIMS analyzer.

The laminate may be annealed in the second magnetic field after the step shown in FIG. 15 or after depositing the ferromagnetic layer 28, second antiferromagnetic layer 29 and protective layer 35 on the nonmagnetic layer 27. The entire second antiferromagnetic layer 29 undergoes an ordering change and generates a large exchange coupling magnetic field between the second antiferromagnetic layer 29 and ferromagnetic layer 28. The magnetization of the entire free magnetic layer 26 for generating a ferromagnetic coupling between the ferromagnetic layer 28 and free magnetic layer 26 tends to be momentarily fixed in the track width direction (X-direction). However, the exchange coupling magnetic field between the central area C of the ferromagnetic layer 28 formed on the central area C of the free magnetic layer 26 and the central area of the second antiferromagnetic layer 29 may be weakened or extinguished by shaving the central area C of the second antiferromagnetic layer 29 the central area C of the ferromagnetic layer 28 in the step shown in FIG. 16. Consequently, magnetization in the central area C of the free magnetic layer 26 may be weakened to an extent sufficient for magnetic inversion.

Figure 17:
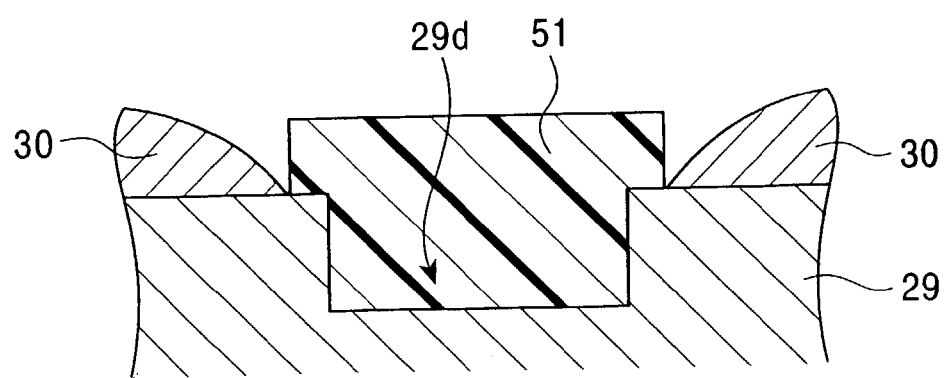
FIG. 17 shows a step for forming the electrode layer.

FIG. 17 shows a step for forming the electrode layer 30. FIG. 17 is a partially magnified cross section viewed from aside opposite a recording medium.

The electrode layer 30 should be formed on the second antiferromagnetic layer 29 after removing the mask layers 50 when the mask layers shown in FIG. 16 are made of a material such as a resist that cannot serve as electrode layers when left behind.

As shown in the step shown in FIG. 17, a resist layer 51 is formed from the surface of space 29d between the second antiferromagnetic layers 29 through the surface of a portion of the surfaces of the second antiferromagnetic layers 29. The resist layer 51 may be provided only within the space 29d. The electrode layers 30 are deposited on the second antiferromagnetic layer 29 not covered with the resist layer 51, followed by removal, of the resist layer 51 to form the electrode layers 30 on the second antiferromagnetic layer 29.

While the processes for manufacturing the magnetic sensing elements shown in FIGS. 1 to 6 have been described based on the process diagrams shown in FIGS. 11 to 17, the nonmagnetic layer 27 is at first deposited on the free magnetic layer 26 in the present invention. The nonmagnetic layer 27 is made of a material such as Ru that is hardly oxidized by exposure to the atmosphere. The nonmagnetic layer 27 is formed with a thickness of as small as about 3 Å to about 20 Å, preferably about 3 Å to about 10 Å. Consequently, low energy ion-milling may be used in the step for shaving the nonmagnetic layer 27 by ion-milling to be able to readily stop ion-milling at a depth halfway of the nonmagnetic layer 27 and to avoid damage by ion-milling to the free magnetic layer 26.

A ferromagnetic coupling is generated between each outer sides of the free magnetic layer 26 and ferromagnetic layer 28 formed with interposition of the nonmagnetic layer 27 thereon by thinning the nonmagnetic layer 27 by ion-milling, thereby enabling the magnetization of the ferromagnetic layer 28 and the magnetization on sideeach sideS of the free magnetic layer 26 to be tightly fixed in the track width direction (X-direction).

If no ferromagnetic layer 28 and second antiferromagnetic layer 29 are formed on the central area C of the free magnetic layer 26, or if a strong exchange coupling magnetic field is not applied from the second antiferromagnetic layer 29 to the ferromagnetic layer 28 by forming, if any, these layers, the magnetization in the central area of the free magnetic layer 26 is weakly set into a single magnetic domain state to an extent that allows of magnetic inversion against an external magnetic field.

According to the process for manufacturing the magnetic sensing element in the present invention, low energy ion-milling is applicable by forming a thin nonmagnetic layer 27 made of materials such as Ru. Furthermore, a ferromagnetic coupling is generated between the ferromagnetic layer 28 and each outer sideS of the free magnetic layer 26 with interposition of each outer side 27a of the nonmagnetic layer 27 therebetween. Consequently, a magnetic sensing element that can properly define a narrow track width can be manufactured.

The magnetic sensing element shown in FIGS. 1 to 6 comprises a so-called CIP (current-in-plane) type structure in which an electric current flowing from the electrodes 30 and 30 into the multilayer comprising the pinned magnetic layer 24, nonmagnetic material layer 25, and free magnetic layer 26 flows in a direction parallel to the surface of each layer in the multilayer.

Figure 25:
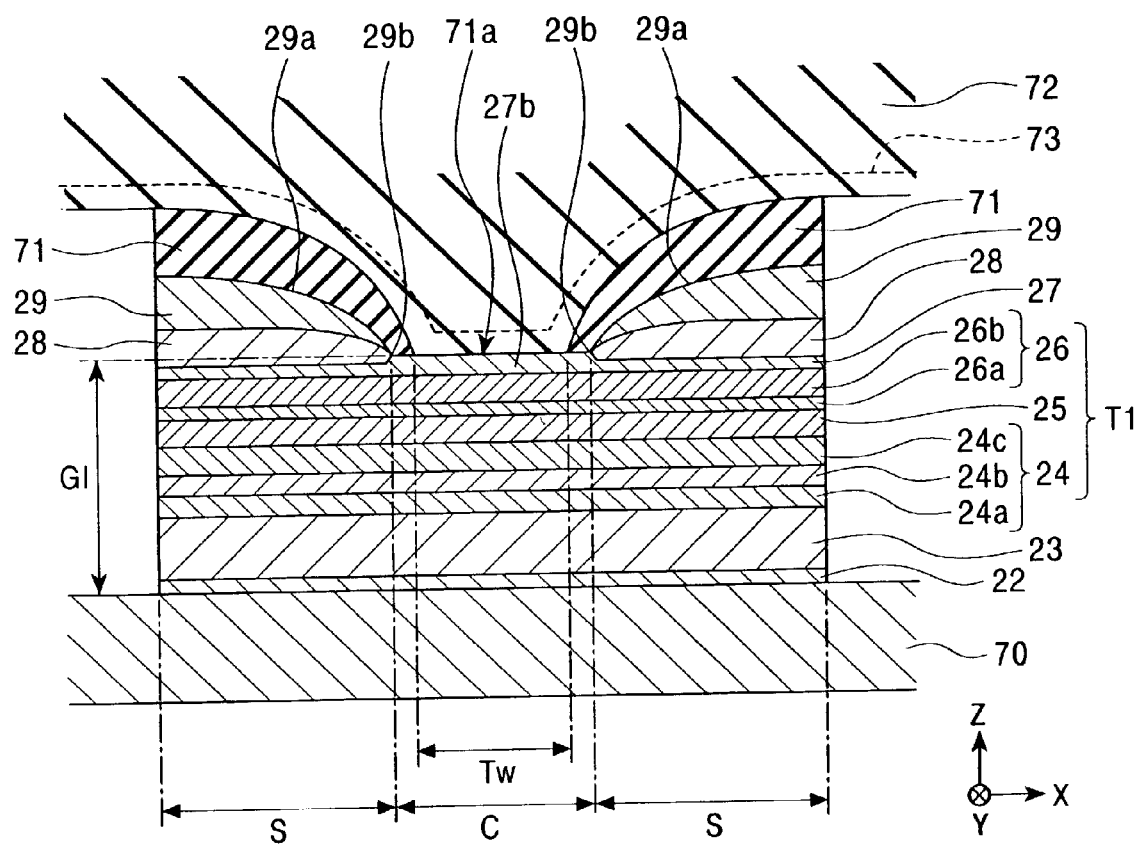
FIG. 25 is a partial cross section of the structure of a magnetic sensing element viewed from aside opposite a recording medium as a seventh embodiment of the present invention.

However, the present invention may be employed in a so-called CPP (current perpendicular to the plane) type magnetic sensing element shown in FIG. 25 and thereafter. The CCP type magnetic sensing element comprises, for example, a multilayer T1 having a pinned magnetic layer 24, nonmagnetic layer 25, and free magnetic layer 26 with an upper electrode layer 72 and a lower electrode layers 70 on and under the multilayer, respectively, as shown in FIG. 25. An electric current from upper electrode to the lower electrode, or vise versa, flows in the multilayer T1 in a direction perpendicular to the layer surface.

The same effect in the CIP type magnetic sensing element in FIGS. 1 to 6 may be also expected in the CPP type magnetic sensing element.

The nonmagnetic layer 27 is formed on each outer sideS of the free magnetic layer 26. The ferromagnetic layer 28 is formed on the nonmagnetic layer 27 in the CIP type magnetic sensing element. Consequently, sideeach sides of the free magnetic layer 26 is effectively protected from ion-milling by forming the nonmagnetic layer 27 to make sideeach sideS of the free magnetic layer 26 free from damage due to ion-milling, thereby maintaining good magnetic characteristics at sideeach sideof the free magnetic layer 26.

Consequently, the magnetization at sideeach sideS of the free magnetic layer 26 can be effectively fixed by a ferromagnetic coupling generated between the ferromagnetic layer 28 and free magnetic layer 26 with interposition of the nonmagnetic layer 27 while weakly inducing the magnetization in the central area of the free magnetic layer 26 into a single magnetic domain state to an extent that allows magnetic inversion. Therefore, a magnetic sensing element capable of effective control of the magnetization of the free magnetic layer 26 can be manufactured even when a narrow track width is defined.

Since the nonmagnetic layer 27 is deposited with a proper thickness to allow each outer sideS of the nonmagnetic layer 27 to be completely removed by low energy ion-etching, the nonmagnetic layer 27 is left behind on sideeach sideS of the free magnetic layer 26.

Each outer sideS of the nonmagnetic layer 27 does not have to be shaved by ion-milling when the nonmagnetic layer 27 is deposited with a sufficient thickness to allow the ferromagnetic coupling to be generated between the ferromagnetic layer 28 and free magnetic layer 26.

The structure of the multilayer from the underlayer 22 through the nonmagnetic layer 27 shown in FIG. 25 is the same as that of the magnetic sensing element shown in FIG. 1.

The difference between the magnetic sensing element in FIG. 25 and the magnetic sensing element in FIG. 1 is as follows:the lower electrode layer 70 that serves as a lower shield layer is provided under the multilayer shown in FIG. 25; and the lower electrode layer 70 is formed by plating a magnetic material such as permalloy (NiFe alloy).

An insulation layer 71 is provided on the second antiferromagnetic layer 29 and nonmagnetic layer 27 as shown in FIG. 25. The insulation layer 71 is made of an insulation material such as $Al_2O_3$, $SiO_2$, AlN, Al—Si—O, Al—Si—O—N and $Si_3N_4$. An opening 71a on the central area of the nonmagnetic layer 27 is provided in this insulation layer 71. The multilayer is electrically connected to the upper electrode layer 72 through this opening. The length of the opening 71a in the track width direction (X-direction) corresponds to an optical track width Tw. The insulation layer 71 is formed with a thickness sufficientto prevent shunt loss.

An upper electrode layer 72 that also serves as an upper shield layer is formed from the surface of the insulation layer 71 trough the surface of the nonmagnetic layer 27. The upper electrode layer is made of a magnetic material such as a NiFe alloy.

Since the upper electrode layer 72 and lower electrode layer 70 are formed on and under the multilayer, respectively, in the magnetic sensing element shown in FIG. 25, an electric current between the upper and lower electrode layers 72 and 70 flows in the direction perpendicular to the surface of the multilayer.

Since the surface of the second antiferromagnetic layer 29 is covered with the insulation layer 71 in the magnetic sensing element shown in FIG. 25, the electric current flowing from the upper electrode layer 72 into the multilayer is not shunted into the second antiferromagnetic layer 29, and the electric current properly flows within the track width Tw defined by the width of the opening 71a of the insulation layer 71. Accordingly, a CCP type magnetic sensing element that is able to suppress the current flow from spilling out of the track width Tw with high regenerative output can be manufactured with the structure shown in FIG. 25.

A nonmagnetic layer 73 denoted by a dotted line from the surface of the insulation layer 71 through the nonmagnetic layer 27 may be provided as shown in FIG. 25. The nonmagnetic layer 73 is preferably made of a nonmagnetic conductive material such as Ta, Ru, Rh, Ir, Cr, Re and Cu. Although the nonmagnetic layer 73 serves as an upper gap layer, it is not preferable to cover the nonmagnetic layer 27, through which the electric current goes in and out, with a nonmagnetic layer 73 comprising an insulation material because the electric current will have difficulty flowing thorough the multilayer. Accordingly, the nonmagnetic layer 73 is preferably formed from a nonmagnetic conductive material in the present invention.

The nonmagnetic material layer 25 constituting the multilayer may be formed from a nonmagnetic conductive material such as Cu, or the nonmagnetic material layer 25 may be formed from an insulation material such as $Al_2O_3$ and $SiO_2$ in the magnetic sensing element shown in FIG. 25. The former magnetic sensing element is a spin-valve type magnetoresistive element while the latter magnetic sensing element is a tunnel effect type magnetoresistive element.

The tunnel effect type magnetoresistive element takes advantage of a tunnel effect for generating a resistance change. A tunnel electric current flows with maximum resistance through the nonmagnetic material layer 25 when the magnetization of the magnetic layer 24c is antiparallel to the magnetization of the free magnetic layer 26 with a maximum resistance. When the magnetization of the magnetic layer 24c is parallel to the magnetization of the free magnetic layer 26, the tunnel electric current flows most easily, that is, with minimum resistance, through the nonmagnetic material layer.

On this basis, a change in the electrical resistance, which is caused by a variation in the magnetization of the free magnetic layer 26 under the influence of an external magnetic field, is reflected as a voltage change or current change that allows a leak magnetic field from a recording medium to be sensed.

FIG. 26 shows an embodiment in which the magnetic sensing element shown in FIG. 2 is manufactured as the same CPP type magnetic sensing element as shown in FIG. 25.

Figure 27:
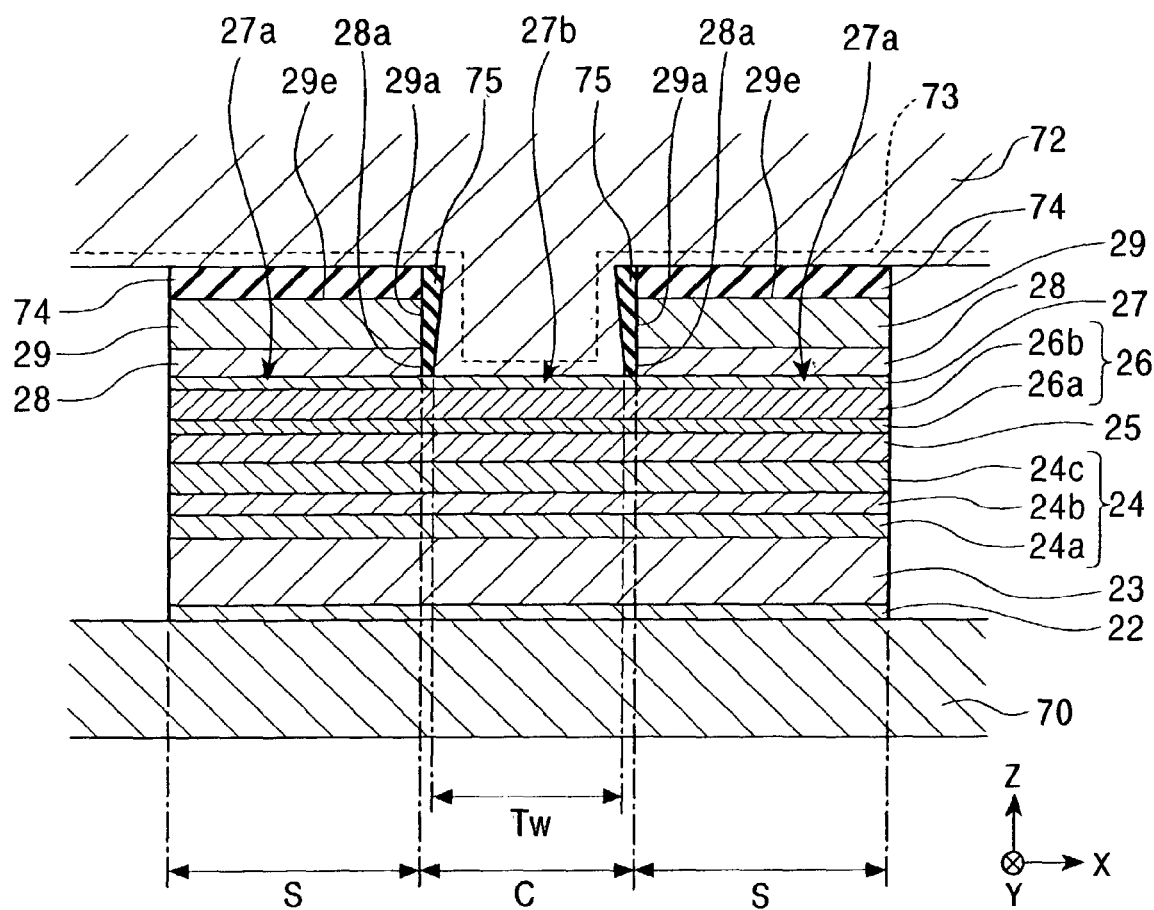
FIG. 27 is a partial cross section of the structure of a magnetic sensing element viewed from a side opposite a recording medium as a ninth embodiment of the present invention.

FIG. 27 shows an embodiment in which the magnetic sensing element shown in FIG. 4 is manufactured as the same CPP type magnetic sensing element as shown in FIG. 25.

The difference between structure of the magnetic sensing element in FIG. 27 and the structure of the magnetic sensing element in FIG. 4 is as follows: a lower electrode layer 70 that also serves as a lower shield layer is provided from the underlayer 22 through the bottom portion of the nonmagnetic layer 27 as shown in FIG. 27; and the lower electrode layer 70 is formed by plating a magnetic material such as a permalloy (NiFe alloy).

Insulation layers 74 are formed on the surfaces 29e of the second antiferromagnetic layers 29 as shown in FIG. 27. Each insulation layer 74 is formed from an insulation material such as $Al_2O_3$, $SiO_2$, AlN, Al—Si—O, Al—Si—O—N and $Si_3N_4$.

Insulation layers 75 are formed on the inner sides 29a of the second antiferromagnetic layers 29 facing each other in the track width direction toward the center. The insulation layer 75 is formed from an insulation material such as $Al_2O_3$, $SiO_2$, AlN, Al—Si—O, Al—Si—O—N and $Si_3N_4$.

Each insulation layer 74 is independently formed on the surface 29e of the second antiferromagnetic layer 29 from the insulation layer 75 formed on each inner side29a according to a manufacturing process to be described below. The insulation layer 74 may be independently formed from the insulation layer 75, and each of the insulation layers 74 and 75 has a thickness sufficient for preventing shunt loss.

An upper electrode layer 72 is provided from the surface of the insulation layer 74 through the surface of the nonmagnetic layer 27 as shown in FIG. 27.

A lower electrode 70 and an upper electrode 72 that serve as upper and lower shield layers, respectively, are provided in the magnetic sensing element shown in FIG. 27. An electric current between the lower electrode 70 and upper electrode 72 flows in a direction perpendicular to the surface of the multilayer.

Since the surface 29e, inner side 29a of the second antiferromagnetic layer 29, and the inner side 28a of the ferromagnetic layer 28 are covered with insulation layers 74 and 75, respectively, the electric current that flows from the upper electrode layer 72 into the multilayer is not shunted into the second antiferromagnetic layer 29 and the like. Instead, the electric current properly flows within the track width Tw defined by the distance between the insulation layers 27 facing each other. Accordingly, the magnetic sensing element with a structure shown in FIG. 27 can be formed as a CPP type magnetic sensing element with a large regenerative output by preventing the electric current from spilling out of the track width Tw.

As shown in FIG. 27, a nonmagnetic layer 73 denoted by a dotted line may be provided from the surface of each insulation layer 74 through the surface of each insulation layer 75 and on the nonmagnetic layer 27. The nonmagnetic layer 73 is preferably made of a nonmagnetic conductive material such as Ta, Ru, Rh, Ir, Cr, Re and Cu. Although the nonmagnetic layer 73 also serves as an upper gap layer, it is preferably made offrom a nonmagnetic conductive material since the nonmagnetic layer 73 is formed in contact with the nonmagnetic layer 27.

Figure 28:
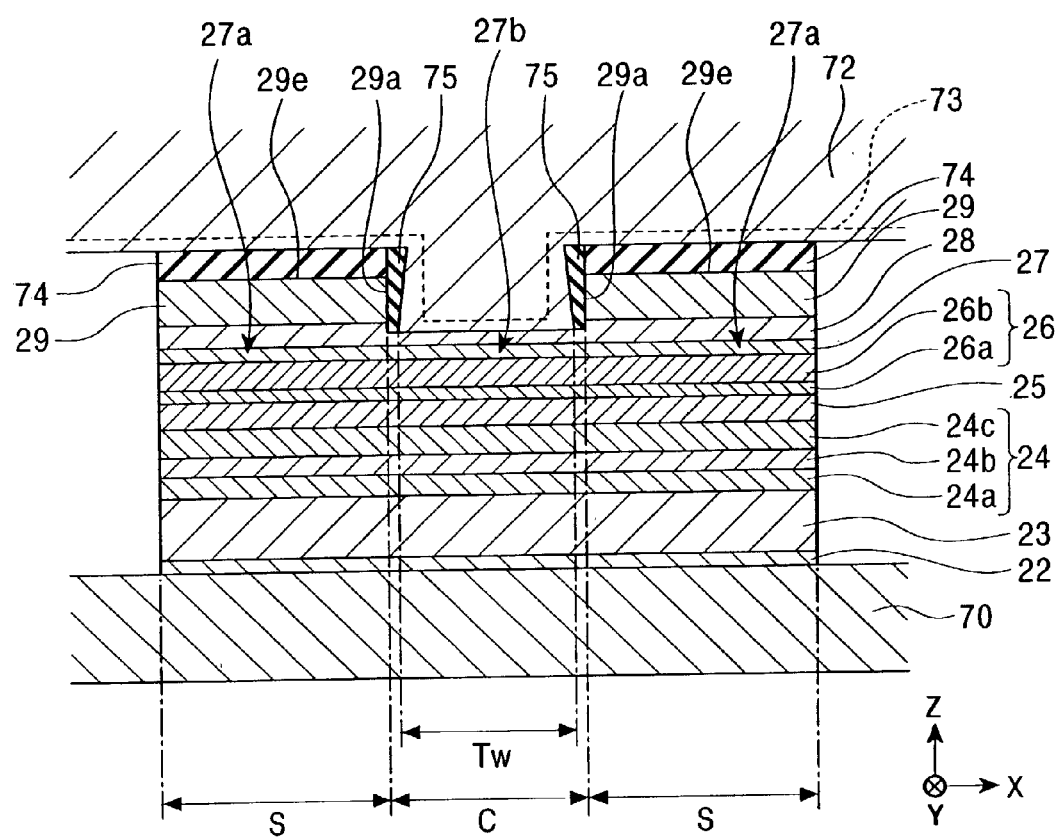
FIG. 28 is a partial cross section of the structure of a magnetic sensing element viewed from aoppposite a recording medium as a tenth embodiment of the present invention.
Figure 29:
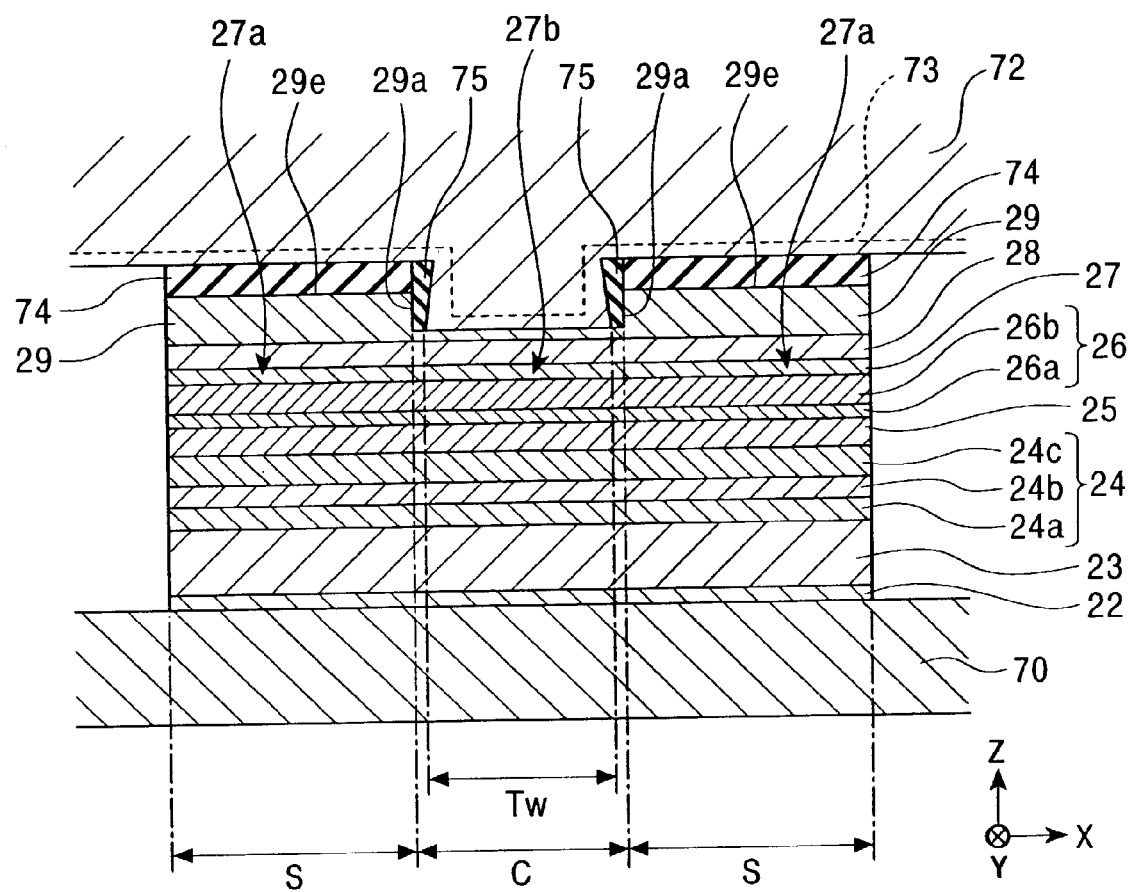
FIG. 29 is a partial cross section of the structure of a magnetic sensing element viewed from aside opposite a recording medium as a eleventh embodiment of the present invention.

FIG. 28 is an embodiment in which the magnetic sensing element in FIG. 5 is manufactured as a CPP type magnetic sensing element in FIG. 25. FIG. 29 is an embodiment in which the magnetic sensing element in FIG. 6 is manufactured as a CPP type magnetic sensing element in FIG. 25.

A lower electrode layer 70 that also serves as a lower shield layer is provided under the first antiferromagnetic layer 23, insulation layers 74 and 75 are provided on each second antiferromagnetic layer 29, and an upper electrode layer 72 that also serves as an upper shield layer is provided in each magnetic sensing element shown in FIGS. 28 and 29.

Figure 30:
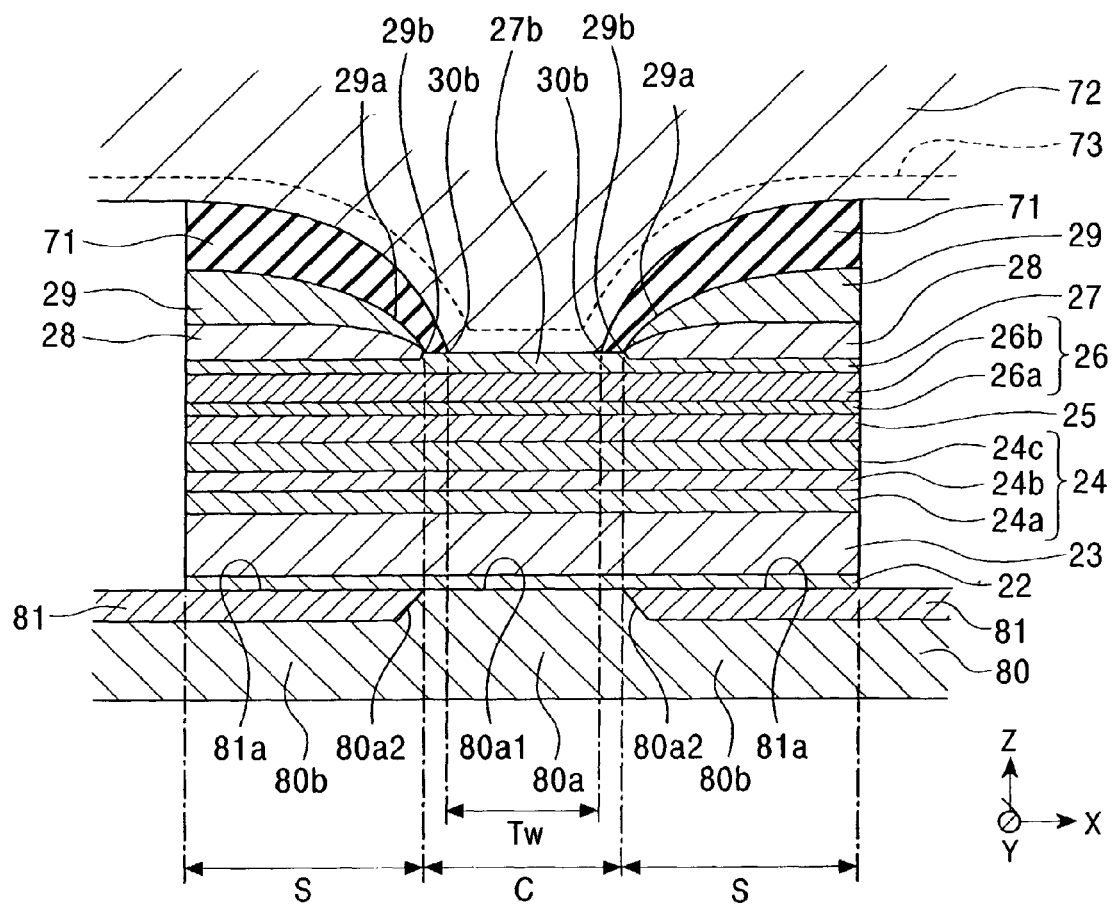
FIG. 30 is a partial cross section of the structure of a magnetic sensing element viewed from aside opposite a recording medium as a twelfth embodiment of the present invention.
Figure 31:
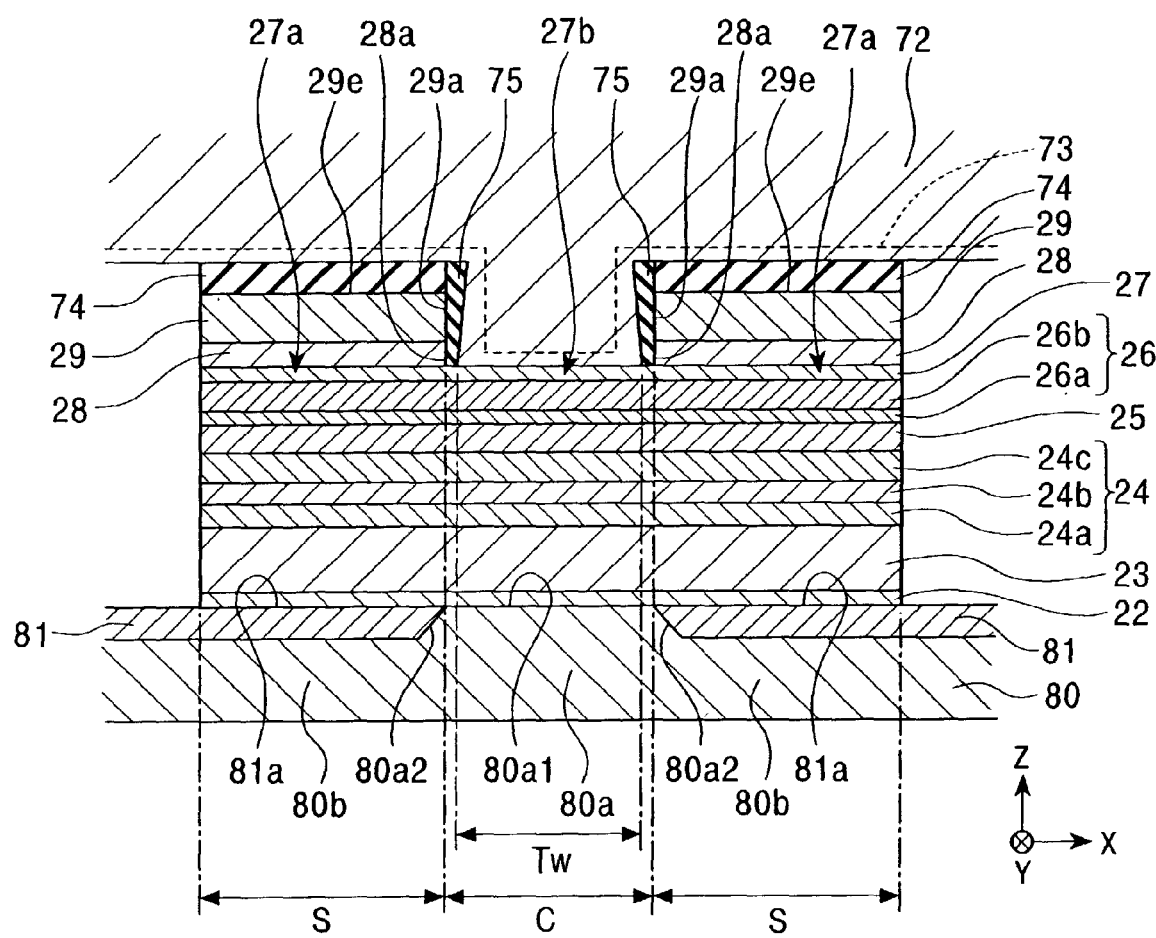
FIG. 31 is a partial cross section of the structure of a magnetic sensing element viewed from aside opposite a recording medium as a thirteenth embodiment of the present invention.

While FIGS. 30 and 31 show CCP type magnetic sensing elements as shown in FIGS. 25 to 29, they differ in the shape of the lower electrode layer 80 from those of FIGS. 25 to 29.

The magnetic sensing elements in FIGS. 30 and 31 differ from those in FIGS. 25 and 27 in that a projection 80a projecting out in the multilayer direction (Z-direction) from the underlayer 22 trough the nonmagnetic layer 27 is provided in the central area in the track width direction (X-direction) of a lower electrode layer 80 that also serves as the lower shield layer. The surface 80a1 of this projection 80a is in contact with the lower face of the multilayer and an electric current flows from the projection 80a into the multilayer (or from the multilayer to the projection 80a).

Insulation layers 81 are provided between both outer sides 80b in the track width direction (X-direction) of the lower electrode layer 80 and multilayer. The insulation layer 81 is made of an insulation material such as Al$_2$O$_3$, SiO$_2$, AlN, Al—Si—O, Al—Si—O—N and Si$_3$N$_4$.

The electric current passageway is restricted in the embodiment shown in FIGS. 30 and 31 by forming the projection 80a on the lower electrode layer 80. The electric current is prevented from shunting into the multilayer from both outer side 80b by providing an insulation layer 81 between each outer side 80b of the lower electrode layer 80 and multilayer, thereby allowing a more effective means of manufacturing a magnetic sensing element having a large regenerative output.

While the width of the surface 80a1 of the projection 80a of the lower electrode layer 80 in the track width direction (X-direction) is the same as the width of the central area C in the track width direction (X-direction), the width of the surface 80a1 may be longer than the width of the central area C More preferably, the width of the surface 801a is the same as the track width Tw, in order to more effectively allow the flow an electric current only in the area track width the track width Tw which in turn makes it possible to manufacture a magnetic sensing element with a large regenerative output.

In the embodiments shown in FIGS. 30 and 31, both inner sides 80a2 in the track width direction (X-direction) of the projection 80a formed on the lower electrode layer 80 are formed as inclined or curved faces so that the width of the projection 80a in the track width direction gradually increases in the direction remote from the multilayer (reversed direction to the Z-direction). However, both sideinner sides 80a2 may be perpendicular to the track width direction (X-direction).

The magnetic sensing element may comprise the projection 80a on the lower electrode 80 without providing any insulation layers 71, or insulation layers 74 and 75. Since the upper electrode layer 72 is not insulated from the second antiferromagnetic layers 29, the regenerative output tends to be lowpoor since the electric current tends to spill out of the track width Tw. However, the electric current passageway may be restricted by forming the projection 80a on the lower electrode 80 under the multilayer to restrict expansion of the electric current passageway and prevent a decrease in the regenerative output.

It is preferable in the magnetic sensing element shown in FIGS. 30 and 31 for the surface 80a1 of the projection 80a formed on the lower electrode 80 to be flush with the surface 81a of the insulation layer 81 formed on each side of the projection 80a. Consequently, the surfaces of the layers in the multilayer formed on the surface from the projection 80a through each insulation layer 81 may be made parallel with each other to allow the manufacture of a magnetic sensing element having excellent output characteristics.

While the lower electrode layer 70 or 80 and the upper electrode layer 72 are formed in contact with the upper face and lower face of the multilayer, respectively (thus allowing these electrode layers to serve as shield layers in the CPP type magnetic sensing elements shown in FIGS. 25 to 31), this particular electrode layer structure eliminates the need for forming the electrode layers and shield layers independently of each other, thereby allowing the manufacture of a CPP type magnetic sensing element.

The gap length G1 defined by the distance between the shield layers may become very short when the electrode layer is allowed to have both the electrode function and shield function (see FIG. 25; the gap length G1 is defined by including the thickness of the nonmagnetic layer 73 when the nonmagnetic layer 73 is provided), thereby forming a magnetic sensing element highly suitable for high density recording.

However, the present invention is not necessarily restricted to the embodiments set forth in FIGS. 25 to 31. An electrode layer comprising Au, W, Cr and Ta and the like may be provided on the upper and/or lower face of the multilayer, and a shield layer made of a magnetic material may be provided on the surface of the electrode layer opposed to the multilayer.

For manufacturing the magnetic sensing element shown in FIG. 25, the lower electrode layer 70 is formed first by plating or sputtering Then the layers from the underlayer 22 through the nonmagnetic layer 27 are deposited on the lower electrode layer 70, and a lift-off resist covering the area of the track width Tw is formed on the nonmagnetic layer 27 after annealing in a first magnetic field. Then, each outer side S of the nonmagnetic layer 27 not covered with the resist layer is partially shaved off by low energy ion-milling, followed by continuous deposition of the ferromagnetic layers 28 and second antiferromagnetic layers 29 by sputtering. Subsequently, each insulation layer 71 is deposited from a direction having a larger incident sputtering angle than the incident sputtering angle (an angle from a direction perpendicular to the surface of the multilayer) of the ferromagnetic layers 28 and second antiferromagnetic layers 29. Finally, the magnetic sensing element is annealed in a second magnetic field, and the upper electrode 72 is formed by sputtering or plating.

The conditions for annealing in the first magnetic field and ion-milling of each outer side S of the nonmagnetic layer 27 and the amount of shaving are the same as in the process for manufacturing the magnetic sensing element in FIG. 1.

The method for manufacturing the CCP type magnetic sensing element shown in FIG. 27 will be described below.

The underlayer 22, the first antiferromagnetic layer 23, pinned magnetic layer 24, nonmagnetic material layer 25, free magnetic layer 26, magnetic layer 27 and ferromagnetic layer 28 are continuously deposited on the lower electrode layer 70 made of a plated magnetic material, and the laminate is annealed in the first magnetic field. Then, the second antiferromagnetic layers 29 and insulation layers 74 are continuously deposited by sputtering after shaving the surface of the nonmagnetic layer 27 by low energy ion-milling followed by annealing in the second magnetic field. The heat treatment condition and other conditions are as described previously.

Subsequently, a resist layer or a metal mask layer comprising a metallic material having an opening in the central area in the track width direction (X-direction) is formed on the insulation layer by exposure and development. Each inner side of the resist layer or metal mask layer is perpendicular to the surface of the insulation layer 74. Alternatively, each of the sideinner sides of the resist layer or metal mask layer is formed as an inclined or curved face in which the distance between the sides gradually increases from the lower face to the upper face in the track width direction of the opening.

Then, the central area in the track width direction not covered with the resist layer or metal mask layer is shaved by ion-milling or reactive ion-etching (RIE) from a direction perpendicular to the surface of the insulation layer 74. In the manufacture of the magnetic sensing element shown in FIG. 28, the insulation layers 74, second antiferromagnetic layers 29 and ferromagnetic layers 28 are completely shaved off.

The inner sides 29a of the second antiferromagnetic layers 29 facing each other in the track width direction in the central area, and the inner sides faces 28a of the ferromagnetic layers 28 facing each other in the central area, are perpendicular to each surface 74a of the insulation layer 74 when the inner sides of the resist layer lie vertically. The inner sides 29a and inner sides 28a are inclined or curved faces when the inner sides of the resist layer are inclined or curved, or when the incident angle of ion-milling is aslant. Then the-resist layer is removed. When the metal mask layer is used in place of the resist layer, removal of the metal mask layer is not necessary.

An insulation layer having an opening inin the central area may be formed, and the second antiferromagnetic layers 29 and ferromagnetic layers 28 may be shaved off by forming a lift-off resist layer covering the track with Tw area of the second antiferromagnetic layer 29 and by depositing the insulation layer on the area of the second antiferromagnetic layer 29 not covered with the resist layer, in place of depositing a uniform insulation layer 74 after deposition of the second antiferromagnetic layer 29. However, the step for forming the resist layer or metal mask layer may be omitted when an insulation layer having an opening inin the central area in the track width direction is used as a mask.

Figure 32:
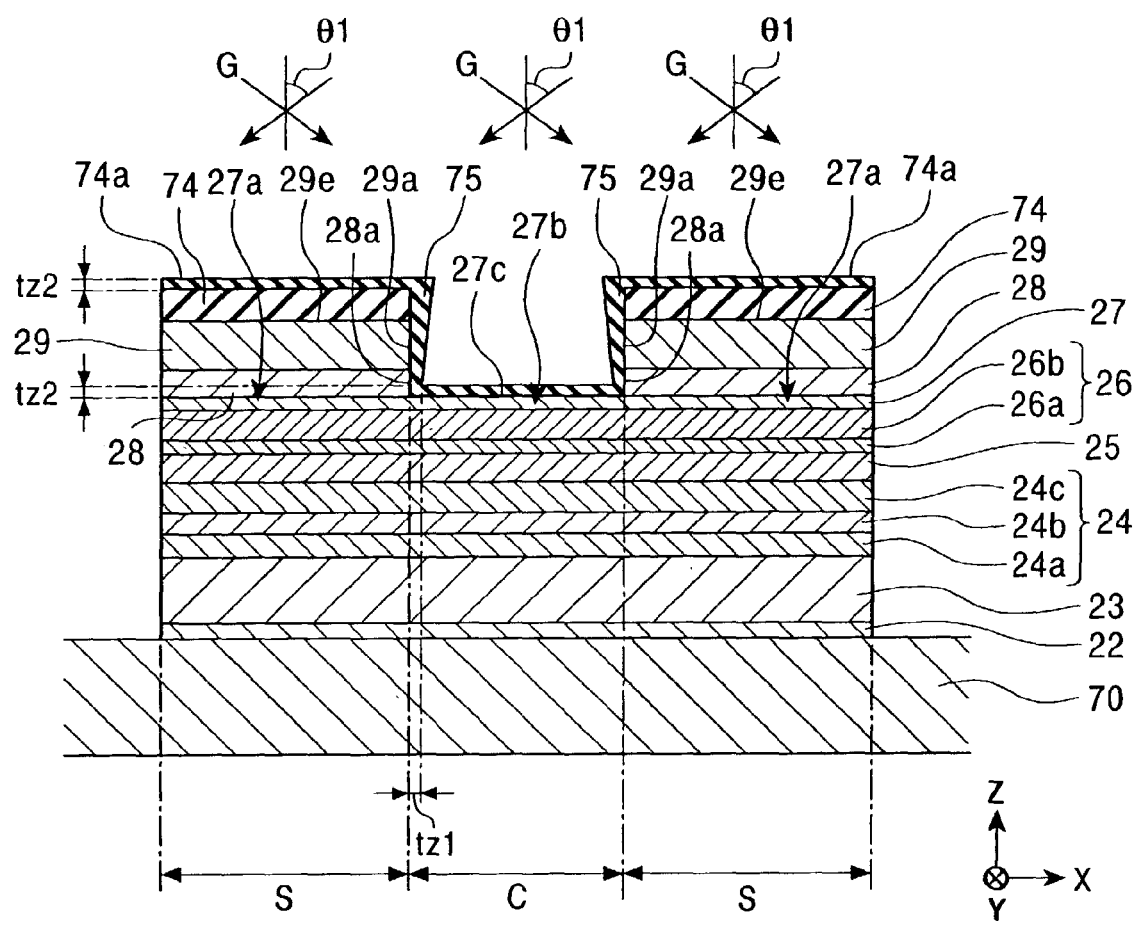
FIG. 32 is a first step for forming the magnetic sensing element in the embodiment shown in FIG. 27.

In the step shown in FIG. 32, an insulation layer 75 comprising an insulation material, such as $Al_2O_3$, $SiO_2$, AlN, Al—Si—O, Al—Si—O—N and $Si_3N_4$, is deposited by sputtering from each surface 29e through each inner side 29a of the second antiferromagnetic layer 29, and from each inner side 28a of the ferromagnetic layer 28 through the surface of the nonmagnetic layer 27. The sputtering method that may be used includes ion-beam sputtering, long-throw sputtering, and collimation sputtering.

The sputtering angle θ1 for forming the insulation layer 75 should be noted herein. While the sputtering direction G has a sputtering angle θ1 relative to the direction perpendicular to the surface of each layer of the multilayer as shown in FIG. 32, it is preferable in the present invention to select as large a sputtering angle θ1 as possible (or to be more inclined) in order to facilitate deposition of the insulation layer 75 on the sideinner sides 29a of the second antiferromagnetic layer 29 facing each other in the central area in the track width direction, and on the inner sides 28a of the ferromagnetic layer 28 facing each other inin the central area in the track width direction. The sputtering angle θ1 can be, for example, from about 50° to about 70°.

The insulation layer 75, which is formed on each inner sides 29a of the second antiferromagnetic layer 29 and inner side 28a of the ferromagnetic layer 28, can be formed with a thickness tz1 in the track width direction (Z-direction) larger than the thickness tz2 of the insulation layer 75 formed on the surface 74a of each insulation layer 74 and on the nonmagnetic layer 27. This can be done by increasing the sputtering angle θ1. The insulation layer 75 on the inner sides 29a and 28a would be completely removed in the succeeding ion-milling step, or the insulation layer would be very thin if present, unless the thickness of the insulation layer is adjusted as described above, thereby failing in reducing shunt loss by the action of the insulation layer.

Figure 33:
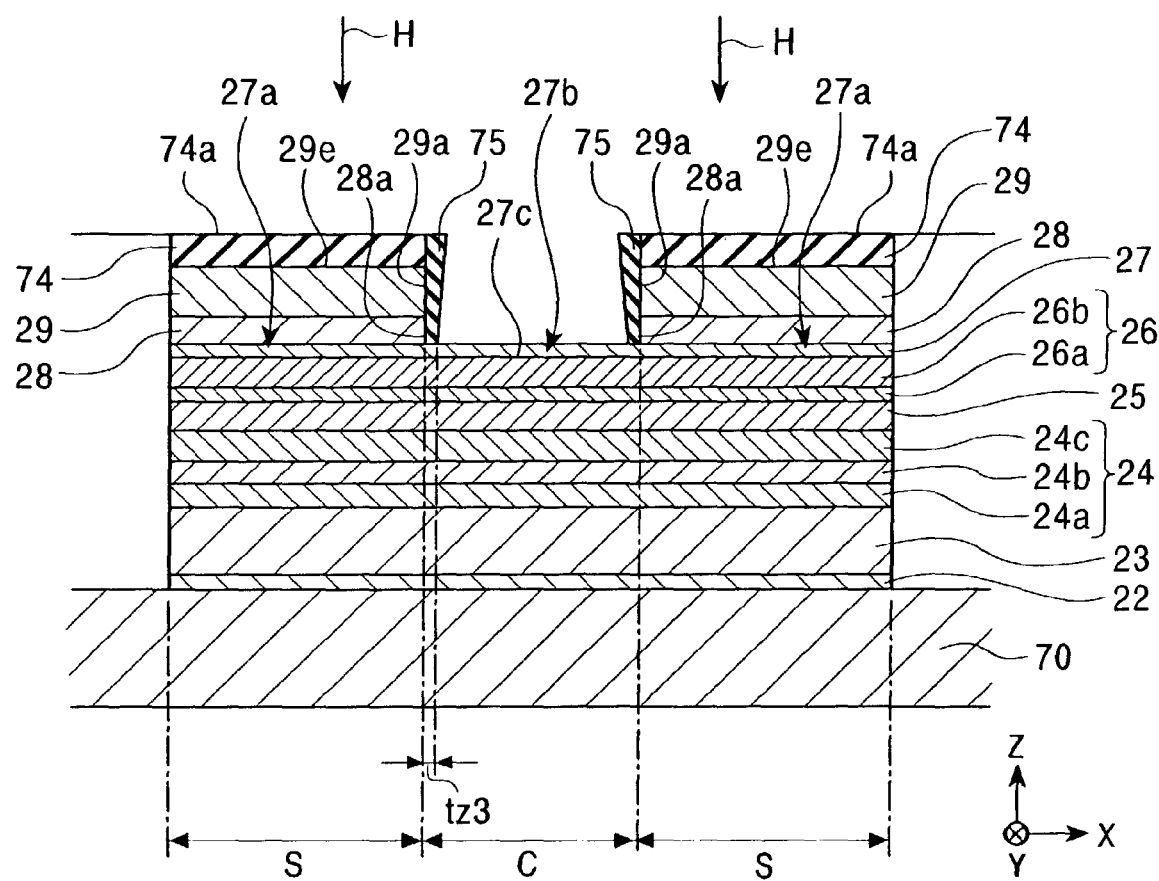
FIG. 33 is a second step for forming the magnetic sensing element in the embodiment shown in FIG. 27.
Figure 34:
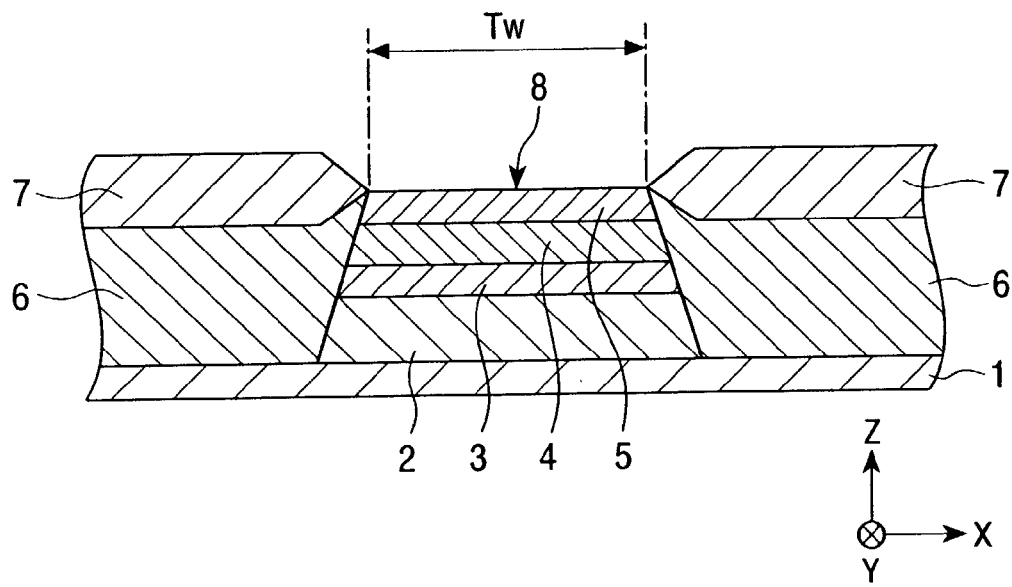
FIG. 34 is a partial cross section of the structure of the conventional magnetic sensing element viewed from aside opposite a recording medium.
Figure 35:
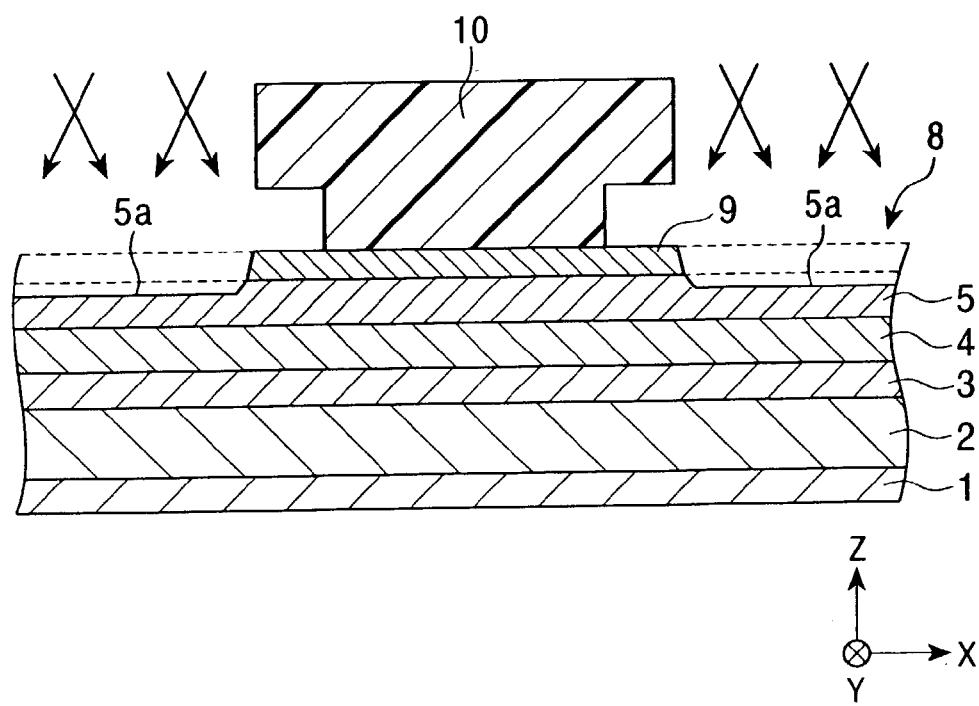
FIG. 35 is a first step for manufacturing another conventional magnetic sensing element.
Figure 36:
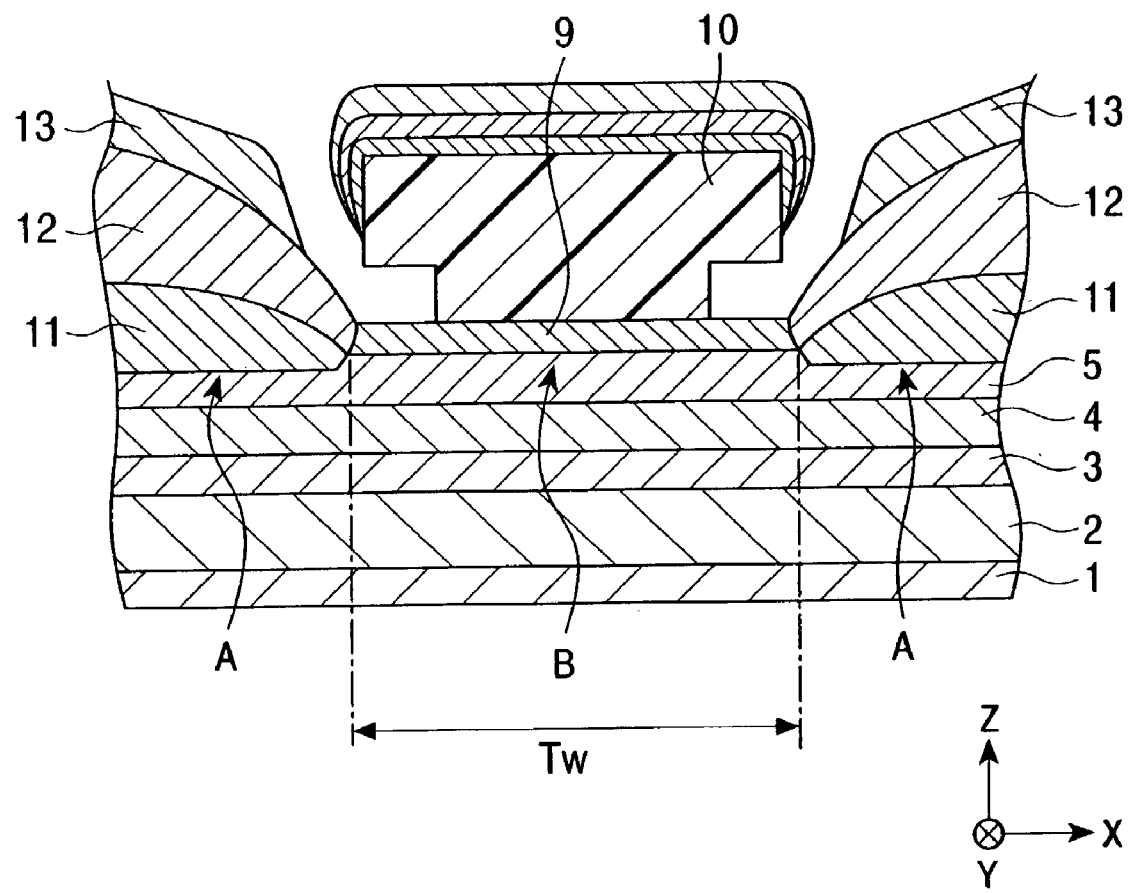
FIG. 36 is a second step for manufacturing another conventional magnetic sensing element.

In the next step shown in FIG. 33, ion-milling is applied from a direction perpendicular to the surface of each layer in the multilayer (a direction parallel to the Z-direction) or from a direction having an angle approximately perpendicular to the surface of each layer (an angle of 0° to 20° to the direction perpendicular to the surface of each layer in the multilayer). Ion-milling is applied deep enough to properly remove the insulation layer 75 formed on the surface 27c of the nonmagnetic layer 27. The insulation layer 75 formed on each upper face 74a of the insulation layer 74 is also removed by ion-milling as described above. A small amount of the insulation layer 75 formed on the inner sides 29a and 28a is also shaved. However, the insulation layer has a greater thickness tz1 than the thickness of the insulation layer 75 formed on the surface 27c of the nonmagnetic layer 27, and the milling direction H of ion-milling is aslant as viewed from the insulation layer 75 formed on the sideinner sides 29a and 28a. Therefore, the insulation layer 75 formed on the inner sided 29a and 28a is hardly shaved compared with the insulation layer 75 formed on the surface 27c of the nonmagnetic layer 27, leaving behind an insulation layer 75 with adequate thickness on the inner sides 29a and 28a.

The remaining insulation layer is shown in FIG. 33. The thickness tz3 of the remaining insulation layer 75 on each inner side 29a of the second antiferromagnetic layer 29 and on each inner side 28a of the ferromagnetic layer 28 in the track width direction is preferably about 5 nm to about 10 nm.

As shown in FIG. 33, the surface 29e of the second antiferromagnetic layer 29 is covered with the insulation layer 74, and the inner side 29a of the second antiferromagnetic layer 29 and the inner side 28a of the ferromagnetic layer 28 are covered with the insulation layer 75. Then, an upper electrode layer 72 that also serves as an upper shield layer is formed, if necessary, by sputtering or plating, after forming the nonmagnetic layer 73 shown in FIG. 27 from the surfaces of the insulation layers 74 and 75 through the surface 27c of the nonmagnetic layer 27.

The surface 29e of each second antiferromagnetic layer 29 is covered with the insulation layer 74, and the inner side 29a of each second antiferromagnetic layer 29 and the inner side 28a of each ferromagnetic layer 28 are covered with the insulation layer 75 in the magnetic sensing element manufactured as described above, thereby enabling a CPP type magnetic sensing element to be manufactured with properly controlled shunt current loss of the electric current from the electrode layer.

Descriptions of the upper area of the multilayer shown in FIGS. 28 and 29 will be omitted herein since they can be manufactured using the same steps already described.

The projection 80a is formed on the lower electrode 80, and the insulation layer 81 is formed between each outer side 80b of the lower electrode 80 and multilayer in the magnetic sensing element shown in FIGS. 30 and 31. After plating the lower electrode layer 80, a resist layer is formed on the central area of the lower electrode layer 80 in the track width direction (X-direction). Each outer side 80b of the lower electrode layer 80 not covered with the resist layer is shaved to a depth halfway of the thickness of the electrode layer by ion-milling in order to form the projection 80a on the central portion of the lower electrode layer 80 in the track width direction.

The insulation layer 81 is deposited by sputtering on each outer side 80b of the lower electrode 80 not covered with the resist layer. Deposition by sputtering is completed when the upper face of the insulation layer 81 becomes approximately flush with the upper face 80a1 of the projection 80a of the lower electrode layer 80, followed by removing the resist layer. The upper face 80a1 of the projection 80a can be made to be flush with the upper face 81a of the insulation layer 81 with high precision by grinding the upper face 80a1 of the projection 80a of the upper electrode layer 80 and the upper face of the insulation layer 81 by CMP after removing the resist layer.

In the manufacture of a magnetic head using the CIP type magnetic sensing element as hitherto described, an upper gap layer 31 comprising an insulation layer and upper shield layer 32 made of a magnetic alloy laminated on the upper shield layer 31 are formed on the magnetic sensing element. The upper electrode layer that also serves as the upper shield layer has been already formed in the CPP type magnetic sensing element. An inductive element for writing may be laminated on the upper shield layer 32 or upper electrode layer 72.

The magnetic sensing element according to the present invention may be also used for a magnetic sensor or for a magnetic head integrated into a hard disk.

The magnetic sensing element as hiterto described in detail includes the nonmagnetic layer formed on the free magnetic layer, the ferromagnetic layer, and second antiferromagnetic layer formed on each outer side of the nonmagnetic layer.

According to the magnetic sensing element of the present invention as hitherto described, ferromagnetic coupling is generated between the ferromagnetic layers formed on and under each outer side of the nonmagnetic layer and free magnetic layer. Accordingly, magnetization in each outer side of the free magnetic layer is tightly fixed in the same direction as the direction as magnetization of the ferromagnetic layer by ferromagnetic coupling between the free magnetic layer and ferromagnetic layer tightly magnetized in the track width direction by an exchange coupling magnetic field generated between the free magnetic layer and second antiferromagnetic layer. On the other hand, magnetization in the central area of the free magnetic layer is weakly set into a single magnetic domain state to an extent that allows magnetic inversion against an external magnetic field.

Magnetization of the free magnetic layer is controlled using the following method in the present invention.

While the nonmagnetic layer is deposited on the free magnetic layer, a thin nonmagnetic layer is formed with a small thickness using a material such as Ru that is hardly oxidized by exposure to the atmosphere. Therefore, each outer side of the nonmagnetic layer can be shaved by low energy ion-milling to adjust its thickness with less damage to the layers under the nonmagnetic layer.

The ferromagnetic coupling may be effectively generated between each outer side of the free magnetic layer and ferromagnetic layer by reducing the thickness of each outer side of the nonmagnetic layer by ion-milling, thereby allowing the magnetization in each outer side of the free magnetic layer to be properly fixed.

The magnetic sensing element according to the present invention has a structure in which the magnetization of the free magnetic layer can be more effectively controlled, in contrast to a conventional magnetic sensing element. Thus, the present invention allows the manufacture of a magnetic sensing element that is capable of properly defining a narrow track width.

The present invention can be adapted for both the CIP type magnetic sensing element and CPP type magnetic sensing element.

What is claimed is:

1. A magnetic sensing element comprising a multilayer comprising a first antiferromagnetic layer, a pinned magnetic layer, nonmagnetic material layer, free magnetic layer and nonmagnetic layer laminated from the bottom in this order;
    wherein a ferromagnetic layer and a second antiferromagnetic layer is provided from the bottom in this order on at least each outer side of the nonmagnetic layer in a track width direction, and a ferromagnetic coupling is generated between the second antiferromagnetic layer on each outer side of the free magnetic layer and each outer side of the free magnetic layer with interposition of the non magnetic layer between the second antiferromagnetic layer and the free magnetic layer, and a thickness of each outer side of the nonmagnetic layer is smaller than a thickness of a central area thereof.

2. The magnetic sensing element according to claim 1, wherein the central area of the nonmagnetic layer is formed with a thickness ranging from about 3 Å to about 20 Å.

3. The magnetic sensing element according to claim 2, wherein the central area of the nonmagnetic layer is formed with a thickness ranging from about 3 Å to about 10 Å.

4. The magnetic sensing element according to claim 1, wherein the nonmagnetic layer is formed with a uniform thickness in the central area.

5. The magnetic sensing element according to claim 1, wherein an electrode layer is provided on each outer side of the multilayer in the track width direction, and wherein an electric current flows in a direction parallel to the surface of each layer in the multilayer.

6. The magnetic sensing element according to claim 1 in which an upper electrode layer and lower electrode layer are provided on and under the multilayer, respectively, and an electric current flows in a direction perpendicular to the surface of each layer in the multilayer,
wherein an insulation layer is provided on each second antiferromagnetic layer, and the upper electrode layer is formed from the surface of the insulation layer through the surface of the central area of the multilayer in the track width direction.

7. The magnetic sensing element according to claim 6, wherein the upper electrode layer formed on the multilayer is an upper shield layer comprising a magnetic material.

8. The magnetic sensing element according to claim 6, wherein the lower electrode layer formed under the multilayer is a lower shield layer comprising a magnetic material.

9. The magnetic sensing element according to claim 6, wherein a projection projecting out in the direction of the multilayer is provided at the central area of the lower electrode layer in the track width direction, the upper face of the projection making contact with the lower face of the multilayer, and an insulation layer being provided between each outer side of the lower electrode layer in the track width direction and the multilayer.

10. The magnetic sensing element according to claim 9, wherein the upper face of the projection is flush with the upper face of the insulation layer formed on each outer side of the lower electrode layer.

11. The magnetic sensing element according to claim 6 comprising the nonmagnetic material layer formed from an insulation material.

12. The magnetic sensing element according to claim 6, wherein the nonmagnetic layer is formed with a uniform thickness in the central area.

13. The magnetic sensing element according to claim 1, wherein the nonmagnetic material layer comprises a nonmagnetie conductive material.

14. The magnetic sensing element according to claim 1, wherein the nonmagnetic layer is made of at least one element selected from a group consisting of Ru, Rh, Pd, Ir, Os, Re, Cr, Cu, Pt and Au.

15. The magnetic sensing element according to claim 14, wherein each outer side of the nonmagnetic layer is formed with a thickness ranging from about 0 Å to about 6 Å, when the nonmagnetic layer comprises Ru, and NiFe based alloy layers are formed at interfaces where the free magnetic layer and ferromagnetic layer contact the nonmagnetic layer.

16. The magnetic sensing element according to claim 14, wherein each outer side of the nonmagnetic layer is formed with a thickness ranging from about 0 Å to about 8 Å when the nonmagnetic layer comprises Cr and NiFe based alloy layers are formed at interfaces where the free magnetic layer and ferromagnetic layer contact the nonmagnetic layer.

17. The magnetic sensing element according to claim 14, wherein each outer side of the nonmagnetic layer is formed with a thickness ranging from about 0 Å to about 2.5 Å when the nonmagnetic layer comprises Ir and NiFe based alloy layers are formed at interfaces where the free magnetic layer and ferromagnetic layer contact the nonmagnetic layer.

18. The magnetic sensing element according to claim 14, wherein each outer side of the nonmagnetic layer is formed with a thickness ranging from about 0 Å to about 3 Å when the nonmagnetic layer comprises Rh and NiFe based alloy layers are formed at interfaces where the free magnetic layer and ferromagnetic layer contact the nonmagnetic layer.

19. The magnetic sensing element according to claim 14, wherein each outer side of the nonmagnetic layer is formed with a thickness ranging from about 0 Å to about 13 Å when the nonmagnetic layer comprises Ru and layers mainly comprising Co are formed at interfaces where the free magnetic layer and ferromagnetic layer contact the nonmagnetic layer.

20. The magnetic sensing element according to claim 14, wherein each outer side of the nonmagnetic layer is formed with a thickness ranging from about 0 Å to about 14 Å when the nonmagnetic layer comprises Rh and layers mainly comprising Co are formed at interfaces where the free magnetic layer and ferromagnetic layer contact the nonmagnetic layer.

21. The magnetic sensing element according to claim 14, wherein each outer side of the nonmagnetic layer is formed with a thickness ranging from about 0 Å to about 15 Å when the nonmagnetic layer comprises Cu and layers mainly comprising Co are formed at interfaces where the free magnetic layer and ferromagnetic layer contact the nonmagnetic layer.

22. The magnetic sensing element according to claim 1, wherein the ferromagnetic layer on each outer side of the nonmagnetic layer is formed with a thickness ranging from about 2 Å to about 50 Å.

23. The magnetic sensing element according to claim 1, wherein the free magnetic layer comprises a three layer structure.

24. The magnetic sensing element according to claim 23, wherein the free magnetic layer comprises a CoFe/NiFe/CoFe three layer structure.

* * * * *